United States Patent
Naito et al.

(10) Patent No.: US 9,559,171 B2
(45) Date of Patent: Jan. 31, 2017

(54) SEMICONDUCTOR DEVICE

(71) Applicant: FUJI ELECTRIC CO., LTD., Kanagawa (JP)

(72) Inventors: Tatsuya Naito, Matsumoto (JP); Masahito Otsuki, Matsumoto (JP)

(73) Assignee: FUJI ELECTRIC CO., LTD., Kanagawa (JP)

(*) Notice: Subject to any disclaimer, the term of this patent is extended or adjusted under 35 U.S.C. 154(b) by 0 days.

(21) Appl. No.: 14/877,933

(22) Filed: Oct. 8, 2015

(65) Prior Publication Data

US 2016/0111419 A1    Apr. 21, 2016

(30) Foreign Application Priority Data

Oct. 15, 2014 (JP) ................ 2014-210964
Jun. 17, 2015 (JP) ................ 2015-121749
Jul. 9, 2015 (JP) ................ 2015-137778

(51) Int. Cl.
| | |
|---|---|
| *H01L 29/10* | (2006.01) |
| *H01L 29/739* | (2006.01) |
| *H01L 29/06* | (2006.01) |
| *H01L 29/78* | (2006.01) |
| *H01L 29/32* | (2006.01) |
| *H01L 27/07* | (2006.01) |
| *H01L 29/36* | (2006.01) |
| *H01L 29/861* | (2006.01) |

(52) U.S. Cl.
CPC ....... *H01L 29/1095* (2013.01); *H01L 27/0716* (2013.01); *H01L 29/0615* (2013.01); *H01L 29/0634* (2013.01); *H01L 29/32* (2013.01); *H01L 29/7395* (2013.01); *H01L 29/7397* (2013.01); *H01L 29/7811* (2013.01); *H01L 29/7813* (2013.01); *H01L 27/0727* (2013.01); *H01L 29/36* (2013.01); *H01L 29/8613* (2013.01)

(58) Field of Classification Search
CPC ............ H01L 29/0696; H01L 29/0619; H01L 29/7811; H01L 29/0634; H01L 29/7397; H01L 29/66333–29/66348; H01L 29/7802–29/7806; H01L 29/623; H01L 29/7395–29/7398
USPC ................. 257/341, 401, 328, 334
See application file for complete search history.

(56) References Cited

U.S. PATENT DOCUMENTS

| | | | | |
|---|---|---|---|---|
| 8,450,800 | B2* | 5/2013 | Inomata | H01L 29/0634 257/329 |
| 8,786,015 | B2* | 7/2014 | Tamura | H01L 29/7815 257/339 |
| 9,166,036 | B2* | 10/2015 | Tamaki | H01L 29/7811 |
| 2012/0153348 | A1 | 6/2012 | Aono et al. | |
| 2013/0134478 | A1 | 5/2013 | Nakajima et al. | |
| 2014/0184303 | A1 | 7/2014 | Hasegawa et al. | |

* cited by examiner

*Primary Examiner* — Jose R Diaz

(57) ABSTRACT

In order to realize an SJ-MOSFET and an IGBT on a single chip and realize a new arrangement configuration for an SJ-MOSFET section and an IGBT section in a single semiconductor chip, provided is a semiconductor device including a semiconductor substrate; two or more super-junction transistor regions provided on the semiconductor substrate; and one or more IGBT regions that are provided in regions sandwiched by the two or more super-junction transistor regions, in a cross section obtained by cleaving along a pane perpendicular to the semiconductor substrate.

25 Claims, 47 Drawing Sheets

CROSS SECTION OF REGION B ALONG D1-D2

CROSS SECTION OF REGION B ALONG E1-E2

SEMICONDUCTOR DEVICE

The contents of the following Japanese patent applications are incorporated herein by reference:
NO. 2014-210964 filed on Oct. 15, 2014,
NO. 2015-121749 filed on Jun. 17, 2015, and
NO. 2015-137778 filed on Jul. 9, 2015.

BACKGROUND

1. Technical Field

The present invention relates to a semiconductor device.

2. Related Art

Conventionally, a semiconductor chip having a super-junction MOSFET and a semiconductor chip having an insulated-gate bipolar transistor are connected in parallel, as shown in Patent Document 1, for example. Super junction is abbreviated as "SJ" in the following description. Furthermore, an insulated-gate bipolar transistor is abbreviated as "IGBT" in the following description. A conventional SJ-MOSFET structure is known that includes a p+ collector layer, as shown in Patent Document 2, for example. In addition, conventionally, an IGBT and an SJ-MOSFET are connected in parallel, as shown in Patent Document 3, for example.

PRIOR ART DOCUMENTS

Patent Document 1: Japanese Patent Application Publication No. 2014-130909
Patent Document 2: Japanese Patent Application Publication No. 2013-102111
Patent Document 3: Japanese Patent Application Publication No. 2012-142537

However, in Patent Document 1, the semiconductor chip including the SJ-MOSFET and the semiconductor chip including the IGBT are connected by wiring to form a module. As a result, it is impossible for the module to be as small as a device formed when the SJ-MOSFET and the IGBT are formed on a single semiconductor chip. Furthermore, in Patent Document 2, the cells of the SJ-MOSFET including the p+ collector layer are arranged in a houndstooth pattern or striped pattern in a planar view. In other words, the cells of the SJ-MOSFET including the p+ collector layer in the semiconductor chip are arranged in the same pattern over the entire semiconductor chip. In the present Specification, a new structure including an SJ-MOSFET and an IGBT is provided, in which the SJ-MOSFET and the IGBT are included in a single semiconductor chip.

SUMMARY

According to a first aspect of the present invention, provided is a semiconductor device comprising a semiconductor substrate; two or more super-junction transistor regions provided on the semiconductor substrate; and one or more IGBT regions that are provided in regions sandwiched by the two or more super-junction transistor regions, in a cross section obtained by cleaving along a plane perpendicular to the semiconductor substrate.

The IGBT region may be provided in a region surrounded by the super-junction transistor regions. The semiconductor device may further comprise a withstanding voltage structure section provided outside the outermost super-junction transistor region among the super-junction transistor regions.

The super-junction transistor regions may include a first conduction type column and a second conduction type column, the withstanding voltage structure section may include a first withstanding voltage section that is provided on an inner circumferential portion thereof and a second withstanding voltage section that is provided on an outer circumferential portion thereof, and the second withstanding voltage section of the withstanding voltage structure section may include a first conduction type region and a second conduction type column. A depth of an end of the second conduction type column of the second withstanding voltage section of the withstanding voltage structure section may be less than a depth of an end of the second conduction type column of the super-junction transistor regions.

Withstanding voltage of the IGBT region may be greater than withstanding voltage of the super-junction transistor regions. An IGBT section including two or more of the IGBT regions may be provided in a region sandwiched by the super-junction transistor regions. An SJ-MOSFET section including two or more of the super-junction transistor regions may be provided on each side of the IGBT section.

A lifetime killer may be injected into a drift region in a boundary section between the IGBT region and the super-junction transistor regions. Instead, the IGBT region may include a drift region having a first conduction type, and a second conduction type column may be provided in a boundary section between the IGBT region and the super-junction transistor regions, from a front surface side of the drift region to a back surface side of the drift region. As another example, the semiconductor device may include a dummy gate electrode closer to a front surface side of the semiconductor substrate than a drift region in a boundary section between the IGBT region and the super-junction transistor regions.

A second conduction type well that expands in a direction parallel to the front surface of the semiconductor substrate may be provided in a boundary section between the IGBT region and the super-junction transistor regions. Instead, the super-junction transistor regions may include a first conduction type column and a second conduction type column, and the semiconductor device may include a second conduction type column having an end with a depth that is less than a depth of an end of the second conduction type column of the super-junction transistor regions, in a boundary section between the IGBT region and the super-junction transistor regions. As yet another example, a boundary section between the IGBT region and the super-junction transistor regions may include two gate electrodes; a first conduction type region provided between the two gate electrodes; and a second conduction type region with a depth that is half of a depth of a second conduction type column of the super-junction transistor regions on a back surface side of the first conduction type region and in contact with the first conduction type region.

In the semiconductor device, a boundary section between an IGBT section including two or more of the IGBT regions and an SJ-MOSFET section including two or more of the super-junction transistor regions may include a free wheel diode section. A lifetime killer may be injected into the SJ-MOSFET section.

The SJ-MOSFET section may include a first conduction type column and a second conduction type column, and the lifetime killer may be injected into at least one of front surface sides of the first conduction type column and the second conduction type column in the SJ-MOSFET section and a field stop layer in the SJ-MOSFET section.

The lifetime killer may be injected across the entire SJ-MOSFET section from the front surface sides of the first conduction type column and the second conduction type column of the SJ-MOSFET section to the field stop layer of the SJ-MOSFET section.

The lifetime killer may be injected into a boundary between the free wheel diode section and the SJ-MOSFET section. The lifetime killer may be injected into the free wheel diode section. The lifetime killer may be injected into at least one of the field stop layer and an anode side of a drift region of the free wheel diode section.

The semiconductor device may further comprise a repeating structure section in which the free wheel diode section and the SJ-MOSFET section are arranged periodically. The repeating structure section may be provided in a manner to sandwich the IGBT section.

The lifetime killer may be injected into at least one of a region between the IGBT section and the repeating structure section and the field stop layer of the IGBT section.

The IGBT section may be an SJ-IGBT section in which the IGBT region is configured as a super-junction transistor.

The SJ-IGBT section may include a first conduction type column and a second conduction type column that each have an impurity concentration that is greater than or equal to $1E15$ cm$^{-3}$ and less than or equal to $1E16$ cm$^{-3}$.

A pitch of a semiconductor layer having a second conduction type and provided on a back surface side of the SJ-IGBT section and a semiconductor layer having a first conduction type and provided on back surface sides of the free wheel diode section and the SJ-MOSFET section may be 5 times to 1,000 times pitch of the first conduction type column and the second conduction type column in the SJ-IGBT section.

The summary clause does not necessarily describe all necessary features of the embodiments of the present invention. The present invention may also be a sub-combination of the features described above.

BRIEF DESCRIPTION OF THE DRAWINGS

FIG. 43 shows the relationship between the distance (μm) from the front surface 102 and the electric field strength (V/cm) when the gate is ON.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

First Embodiment

Figure 1:
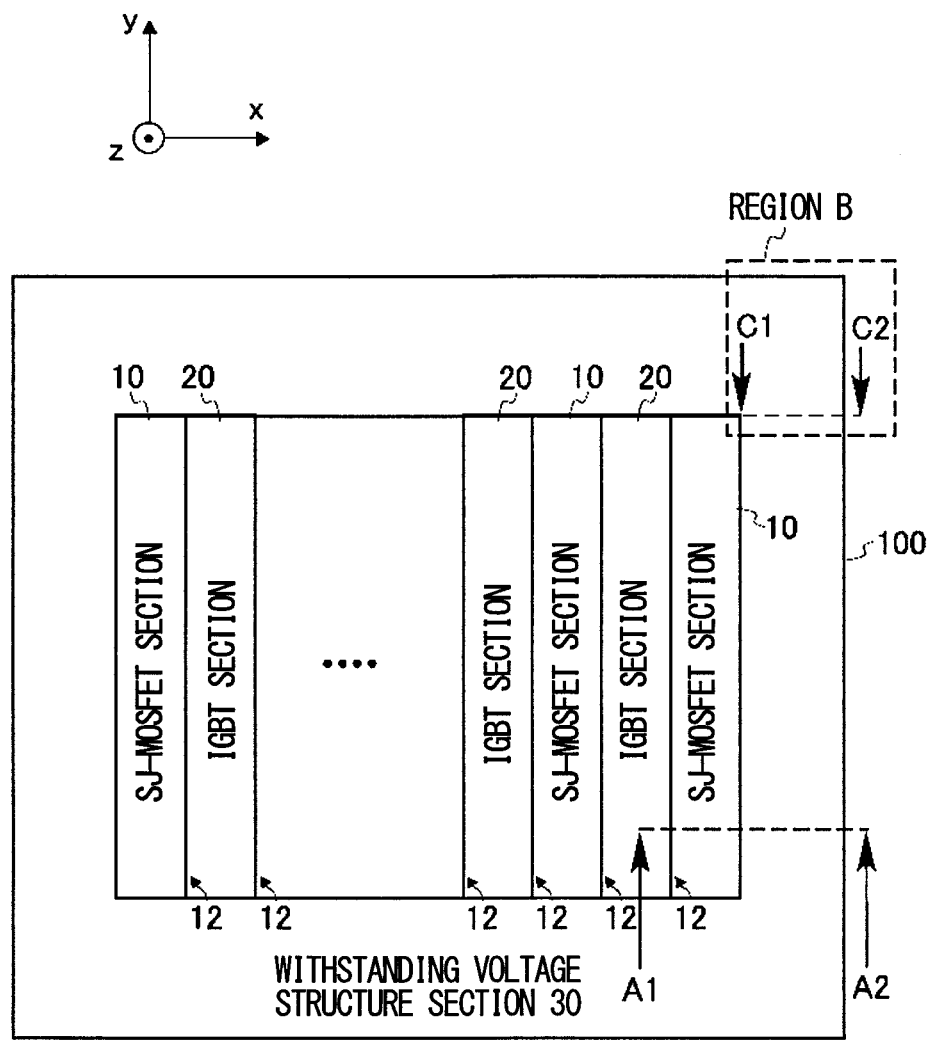
FIG. 1 is a planar view of a semiconductor device 200 as seen from the surface of a semiconductor substrate 100.

FIG. 1 is a planar view of a semiconductor device 200 as seen from the front surface of a semiconductor substrate 100. The semiconductor device 200 includes the semiconductor substrate 100. The semiconductor substrate 100 is provided with an SJ-MOSFET section 10 and an IGBT section 20. The semiconductor substrate 100 is provided with a withstanding voltage structure section 30, in a manner to surround the SJ-MOSFET section 10 and the IGBT section 20 in the x-y plane.

In the present Specification, the x direction is a direction perpendicular to the y direction. The z direction is a direction perpendicular to the plane defined by the x direction and the y direction. The z direction is not necessarily parallel to the direction of gravity. The lengths of the semiconductor substrate 100 in the x direction and the y direction are each sufficiently greater than the length of the semiconductor substrate 100 in the z direction. For ease of explanation in the present Specification, the surface of the semiconductor substrate 100 on the +z side is referred to as the front surface, and the surface on the opposite side is referred to as the back surface. The x-y plane is parallel to both the front surface and the back surface of the semiconductor substrate 100.

In this example, the semiconductor device 200 includes SJ-MOSFET sections 10 and IGBT sections 20 that are each longer in the y direction than in the x direction. In other words, the SJ-MOSFET sections 10 and the IGBT sections 20 are each shaped as a stripe running in the y direction. The semiconductor device 200 includes boundary sections 12 between the SJ-MOSFET sections 10 and the IGBT sections 20.

The semiconductor device 200 includes SJ-MOSFET sections 10 at the x-direction ends thereof. The semiconductor device 200 has a structure in which the SJ-MOSFET sections 10 and the IGBT sections 20 are arranged in a repeating manner in the x direction. Furthermore, the semiconductor device 200 includes SJ-MOSFET sections 10 at opposite ends thereof in the x direction. In other words, in the structure of the semiconductor device 200 where the SJ-MOSFET sections 10 and the IGBT sections 20 are repeatedly arranged in the x direction, SJ-MOSFET sections 10 are arranged at each end in the x direction.

Since the semiconductor device 200 includes the SJ-MOSFET sections 10 and the IGBT sections 20 arranged in a repeating manner in the x direction, in a cross section obtained by cleaving the semiconductor device 200 along the x-z plane perpendicular to the front surface of the semiconductor substrate 100, the IGBT sections 20 are in regions sandwiched by the SJ-MOSFET sections 10. A region sandwiched by SJ-MOSFET sections 10 refers to a region where an IGBT section 20 is provided that is sandwiched on its sides in the x direction by two SJ-MOSFET sections 10.

Each SJ-MOSFET section 10 includes one or more super-junction transistor regions. Each IGBT section 20 includes one or more IGBT regions. It should be noted that the SJ-MOSFET sections 10 include only the super-junction transistor regions, and do not include any IGBT regions. Furthermore, the IGBT sections 20 include only the IGBT regions, and do not include any super-junction transistor regions.

In the present Specification, a super-junction transistor region refers to a region that is the minimum unit for forming a super-junction transistor. Furthermore, an IGBT region refers to a region that is the minimum unit for forming an IGBT. The withstanding voltage of the IGBT regions is higher than the withstanding voltage of the super-junction transistor regions. For example, the withstanding voltage of each IGBT region is approximately 700 V, while the withstanding voltage of each super-junction transistor region is approximately 650 V. A detailed description of the configurations of the super-junction transistor regions and the IGBT regions is provided in the following drawings.

In the present Specification, a super-junction transistor region group containing two or more super-junction transistor regions is set as an SJ-MOSFET section 10. In the same manner, an IGBT region group containing two or more IGBT regions is set as an IGBT section 20.

The semiconductor device 200 in this example includes the SJ-MOSFET sections 10 and the IGBT sections 20 arranged in a repeating manner in the x direction, and therefore each super-junction transistor region and IGBT region is provided at a difference location on the semiconductor substrate 100. Specifically, the one or more IGBT regions are provided in regions sandwiched by the two or more super-junction transistor regions. Furthermore, super-junction transistor regions are arranged at the x-direction ends of the semiconductor substrate 100.

When the power supply of the semiconductor device 200 is turned ON and the drain-source voltage ($V_{DS}$) of the super-junction transistor regions and the collector-emitter voltage ($V_{CE}$) of the IGBT regions gradually increase, the current ($I_{CE}$) flowing through the IGBT regions becomes greater than the current ($I_{DS}$) flowing through the super-junction transistor region, with a prescribed voltage value as a threshold. The load in the super-junction transistor regions and the IGBT regions is determined by the product of the current ($I_{CE}$ or $I_{DS}$) and the voltage ($V_{DS}$ or $V_{CE}$). Therefore, when a voltage higher than the prescribed voltage value is applied, the load of the super-junction transistor regions becomes less than the load of the IGBT regions.

When the semiconductor device 200 is turned OFF, the super-junction transistor regions and IGBT regions enter a reverse bias state. When a reverse bias is applied, whichever load was smaller during the ON state has a higher breakdown resistance. In the ON state where a voltage higher than the prescribed voltage value is applied, the load of the super-junction transistor regions is less than the load of the IGBT regions. Therefore, when a reverse bias is applied, the breakdown resistance of the super-junction transistor regions is higher than the breakdown resistance of the IGBT regions.

In the semiconductor substrate 100, the super-junction transistor regions and the IGBT regions are electrically connected in parallel. The super-junction transistor regions function as diodes during reverse recovery. When there are too few super-junction transistor regions, the semiconductor device 200 exhibits a hard recovery characteristic during reverse recovery. Therefore, in order to realize some degree of a soft recovery characteristic, a prescribed number of super-junction transistor regions are necessary. Furthermore, if the number of super-junction transistor regions is too much greater than the number of IGBT regions, the IGBT characteristics in the semiconductor device 200 are lost. Therefore, a balance between the numbers of regions is desired.

The semiconductor device 200 includes IGBT sections 20 that have two or more IGBT regions in the regions sandwiched by the super-junction transistor regions. For example, in each SJ-MOSFET section 10 and each IGBT section 20, two super-junction transistor regions and two IGBT regions are provided respectively. The ratio between the number of IGBT regions in the IGBT sections 20 and the number of super-junction transistor regions in the SJ-MOSFET sections 10 differs depending on the intended use of the product, but is preferably from 1:1 to 3:1.

In this example, the super-junction transistor regions and the IGBT regions are not arranged to alternate one at a time, and are instead arranged such that the alternation occurs after every few super-junction transistor regions and IGBT regions. In this way, it is possible to decrease the ratio of the boundary sections 12 in comparison to the case where the super-junction transistor regions and IGBT regions alternate one at a time.

In the semiconductor device 200 that includes the super-junction transistor regions and the IGBT regions on the semiconductor substrate 100, it is preferable to obtain output characteristics of the super-junction transistor regions for low voltages and to obtain output characteristics of the IGBT regions for high voltages. However, in the structure where the super-junction transistor regions and the IGBT regions alternate one at a time, it is possible that irregular voltage-current characteristics, i.e. jumps in the characteristics, occur due to interference between the super-junction transistor regions and the IGBT regions. Therefore, it is not preferable that the super-junction transistor regions and the IGBT regions be arranged to alternate one at a time. In the present example, each SJ-MOSFET section 10 includes two or more super-junction transistor regions and each IGBT section 20 includes two or more IGBT regions, and therefore it is possible to restrict irregular voltage-current characteristics, i.e. jumps in the characteristics, when compared to the structure in which the super-junction transistor regions and the IGBT regions are arranged to alternate one at a time.

Figure 2:
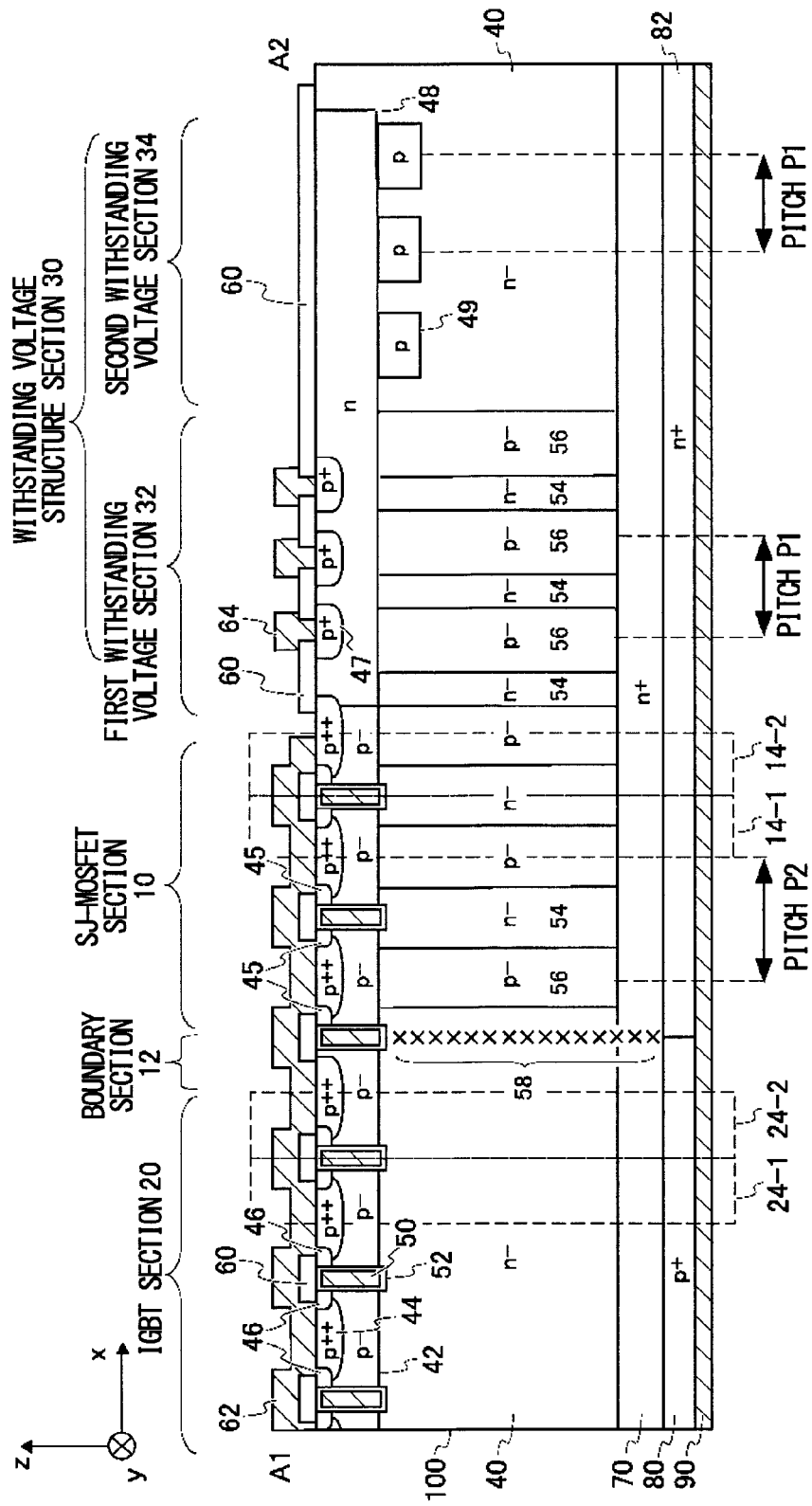
FIG. 2 is a cross-sectional view of the semiconductor device 200 taken along the line A1-A2 in FIG. 1 parallel to the x-z plane.

FIG. 2 is a cross-sectional view of the semiconductor device 200 taken along the line A1-A2 in FIG. 1 parallel to the x-z plane. The semiconductor device 200 in this cross-sectional view includes an SJ-MOSFET section 10, an IGBT section 20, a boundary section 12 between the SJ-MOSFET section 10 and the IGBT section 20, and a withstanding voltage structure section 30. In this example, a first conduction type is n-type and a second conduction type is p-type. However, in other example, the inverse may be used, such that the first conduction type is p-type and the second conduction type is n-type. As long as the elements and manufacturing method are not particularly specified, the n-type and p-type conduction of the semiconductor substrate 100 can be realized using widely known elements and widely known manufacturing methods.

The SJ-MOSFET section 10 includes two or more super-junction transistor regions 14. In this example, the SJ-MOSFET section 10 includes five super junction transistor regions 14. It should be noted that reference numerals are given to only the two super-junction transistor regions 14-1 and 14-2, for ease of explanation. The super-junction transistor regions 14 each include a p-type base layer 42, a contact region 44, a source region 45, a gate electrode 50, a gate insulating film 52, and an n-type column 54 and p-type column 56 that are adjacent to each other in the x direction.

In this example, the p-type base layer 42 includes p− impurities, the contact region 44 includes p+ impurities, and the source region 45 includes n+ impurities. Furthermore, the n-type column 54 includes n− impurities and the p-type column 56, which is adjacent thereto in the x direction, includes p− impurities.

The two adjacent super-junction transistor regions 14-1 and 14-2 share one n-type column 54 or one p-type column 56. In this example, the super-junction transistor regions 14-1 and 14-2 share one n-type column 54. Furthermore, the two adjacent super-junction transistor regions 14-1 and 14-2 share one gate electrode 50 and one gate insulating film 52.

The IGBT section 20 includes two or more IGBT regions 24. In the portion shown in FIG. 2, the IGBT section 20 includes six IGBT regions 24. It should be noted that reference numerals are given only to the two IGBT regions 24-1 and 24-2, for ease of explanation. Each IGBT region 24 includes a p-type base layer 42, a contact region 44, an emitter region 46, a gate electrode 50, a gate insulating film 52, and an n-type drift layer 40. The emitter region 46 includes n+ impurities.

The two adjacent IGBT regions 24-1 and 24-2 share one n-type drift layer 40. The two adjacent IGBT regions 24-1 and 24-2 share one gate electrode 50 and one gate insulating film 52.

When a reverse bias is applied, in order to cause the withstanding voltage of the super-junction transistor regions to be lower than the withstanding voltage of the IGBT regions, it is possible to adjust the distance between the gate electrodes 50 of adjacent IGBT region as needed to be greater than the distance between the gate electrodes 50 of adjacent super-junction transistor regions. Furthermore, it is possible to increase the withstanding voltage of the IGBT regions by lowering the impurity concentration of the n-type drift layers 40 of the IGBT regions.

(Boundary Section 12)

The n-type drift layer 40 of the boundary section 12 in this example is a region in which, when a forward voltage is applied to turn ON the semiconductor device 200, the carrier amount is greater than the carrier amount in the n-type column 54 of the SJ-MOSFET section 10 and less than the carrier amount in the n-type drift layer 40 of the IGBT section 20. The carriers of the IGBT regions 24 are holes and electrons, and the carriers of the super-junction transistor regions 14 are electrons only. Therefore, when the semiconductor device 200 operates according to a forward voltage, the carrier amount of the IGBT regions 24 is greater than the carrier amount of the super-junction transistor regions 14. For example, the carrier amount of the IGBT regions 24 is one order of magnitude greater than the carrier amount of the super-junction transistor regions 14.

When a reverse bias is applied, if it is assumed that the SJ-MOSFET section 10 and the IGBT section 20 are joined and continuous without a boundary section 12 therebetween, the n-type drift layer 40 at the boundary region between the SJ-MOSFET section 10 and the IGBT section 20 is a region where the carrier amount increases sharply. In this case, a strong electric field is applied to the n-type drift layer 40 at the boundary region, and therefore there is a chance that the semiconductor device 200 will break down and be damaged.

Therefore, a region having a carrier amount that is between the carrier amount of the n-type drift layer 40 and the carrier amount of the n-type column 54 when a forward bias is applied is provided in the n-type drift layer 40 at the boundary section 12. In this example, the n-type drift layer 40, which is the drift region at the boundary section 12 between the IGBT region 24 and the super-junction transistor region 14, includes a defect region 58 into which a lifetime killer is injected. The injection of the lifetime killer may refer to the formation of the defect region 58 having lattice defects in the n-type drift layer 40, by injecting electron rays, protons, or helium from the front surface side and/or back surface side of the semiconductor substrate 100 during manufacturing.

The boundary section 12 includes the defect region 58, and therefore it is possible to realize a gradual change in the carrier amount between the n-type column 54 and the n-type drift layer 40 when a reverse bias is applied to the semiconductor device 200. Accordingly, focusing of the electric field at the n-type drift layer 40 of the boundary section 12 when a reverse bias is applied can be prevented, and the semiconductor device 200 can be prevented from breaking down.

(Front Surface Structure)

The structure on the front surface side of the semiconductor substrate 100 is the same for both the SJ-MOSFET section 10 and the IGBT section 20. The gate electrode 50 in this example is a trench gate electrode. The gate electrode 50 is electrically insulated from the semiconductor substrate 100 by the gate insulating film 52. The p-type base layer 42 and the contact region 44 are provided between two gate electrodes 50.

In the super-junction transistor region 14, a source region 45 is provided between the contact region 44 and the gate electrode 50. In the IGBT region 24, an emitter region 46 is provided between the contact region 44 and the gate electrode 50.

The insulating layer 60 is provided closer to the front surface than the gate electrode 50. The front surface electrode 62 is provided closer to the front surface than the insulating layer 60. The front surface electrode 62 contacts at least the contact region 44, from among the contact region 44, the source region 45, and the emitter region 46.

The structure on the front surface side of the boundary section 12 is mostly the same for the SJ-MOSFET section 10 and the IGBT section 20. However, it should be noted that the emitter region 46 is not provided between the boundary section 12 and the IGBT section 20. As a result, the boundary section 12 is prevented from operating as an IGBT region 24.

(Back Surface Structure)

The FS layer 70 is a field stop layer. The FS layer 70 may be formed by thermal processing with a dose of protons ($H^+$) or selenium (Se). The FS layer 70 in this example is an n+ region. The FS layer 70 prevents the depletion layer from reaching the collector layer 80 when a reverse bias is applied to the semiconductor device 200. A portion of the defect region 58 is formed in the FS layer 70.

The collector layer 80 is provided closer to the back surface than the FS layer 70. In other words, the collector layer 80 is provided on the back surface side of the FS layer 70. The collector layer 80 functions as the collector layer of the IGBT section 20. The collector layer 80 in this example is a layer having p+ impurities.

The drain layer 82 is provided closer to the back surface than the FS layer 70. The drain layer 82 functions as the drain layer of the SJ-MOSFET section 10. The drain layer 82 in this example is an n+ layer.

(Operation of the SJ-MOSFET Section 10)

The following is a simple description of the operation of the SJ-MOSFET section 10. When a prescribed voltage is applied to the gate electrode 50 of the SJ-MOSFET section 10, an inversion layer is formed near the boundary between the gate insulating film 52 and the p-type base layer 42. When a forward voltage is applied to the semiconductor device 200, a prescribed voltage that is higher than the voltage of the drain layer 82 is applied to the source region 45. As a result, electrons flow from the front surface electrode 62 to the back surface electrode 90 through the contact region 44, the source region 45, the inversion layer formed in the p-type base layer 42, the n-type column 54, the FS layer 70, and the drain layer 82, in the stated order.

(Operation of the IGBT Section 20)

The following is a simple description of the operation of the IGBT section 20. When a prescribed voltage is applied to the gate electrode 50 of the IGBT section 20, an inversion layer is formed near the boundary between the gate insulating film 52 and the p-type base layer 42. Furthermore, when a forward bias is applied to the semiconductor device 200, a prescribed voltage that is higher than the voltage of the collector layer 80 is applied to the emitter region 46. As a result, electrons are supplied from the emitter region 46 to the n-type drift layer 40, and holes are supplied from the collector layer 80 to the n-type drift layer 40. Therefore, current flows from the back surface electrode 90 to the front surface electrode 62.

(Withstanding Voltage Structure Section 30)

The semiconductor device 200 includes a withstanding voltage structure section 30 provided on the outside of the outermost super-junction transistor region 14, among the plurality of super-junction transistor regions 14. The withstanding voltage structure section 30 includes a first withstanding voltage section 32 that is provided on an inner circumferential portion in the x-y plane and a second withstanding voltage section 34 that is provided on an outer circumferential portion in the x-y plane. The first withstanding voltage section 32 includes a guard ring 47. The guard ring 47 in this example includes p+ impurities. The guard ring 47 is provided on the front surface side of the n-type region 48. The first withstanding voltage section 32 includes a field plate 64 that is connected to the guard ring 47 through a slit or hole formed in the insulating layer 60. The field plate 64 and the guard ring 47 are shaped as rings that surround the SJ-MOSFET section 10 and the IGBT section 20 in the x-y plane.

The first withstanding voltage section 32 includes a structure in which the n-type columns 54 and the p-type columns 56 are arranged in a repeating manner, in the same manner as the SJ-MOSFET section 10. The n-type columns 54 and the p-type columns 56 are arranged from the end of the n-type region 48 on the back surface side to the end of the FS layer 70 on the front surface side. As a result of the structure in which the n-type columns 54 and the p-type columns 56 are arranged in a repeating manner, it is possible to prevent the widening of the depletion layer toward the x-y plane when a reverse bias is applied to the semiconductor device 200. Furthermore, since the field plate 64 collects the surface charge that gathers on the front surface of the semiconductor substrate 100, it is possible to prevent change in the withstanding voltage of the semiconductor device 200 caused by surface charge.

The second withstanding voltage section 34 includes n-type regions 48 as first conduction type regions. The second withstanding voltage section 34 includes p-type regions 49 as second conduction type columns. An n-type drift layer 40 is located from the n-type region 48 of the second withstanding voltage section 34 to the FS layer 70. The p-type regions 49 are provided at intervals in the n-type drift layer 40. The depth of the ends of the p-type regions 49 is less than the depth of the ends of the p-type columns 56 of the super-junction transistor region 14.

The depth of the ends of the p-type columns 56 refers to the z coordinates at the ends of the p-type columns 56 near the FS layer 70. The depths of the ends of the p-type regions 49 refer to the z coordinates of the ends of the p-type region 49 on the back surface side. An end having a lesser depth means that the end is positioned closer to the front surface of the semiconductor substrate 100, when compared the z coordinate of an end located in the FS layer 70 side.

The pitch width P1 of the p-type columns 56 in the first withstanding voltage section 32 and the pitch width P1 of the p-type regions 49 in the second withstanding voltage section 34 are the same pitch. This pitch width P1 is less than the pitch width P2 of the p-type columns 56 in the SJ-MOSFET section 10. As a result, it is possible to widen the depletion layer to the end of the semiconductor substrate 100 when a reverse bias is applied, in contrast to a case when the pitch P1 of the withstanding voltage structure section 30 is the same as the pitch P2 of the SJ-MOSFET section 10, and therefore it is possible to increase the withstanding voltage of the semiconductor device 200.

Furthermore, by setting the depth of the ends of the p-type regions 49 to be less than the depth of the ends of the p-type columns 56, the n-type regions are larger than the p-type regions in the second withstanding voltage section 34. As a result, in a case where the depletion layer created when a reverse bias is applied to the semiconductor device 200 widens from the first withstanding voltage section 32 to the second withstanding voltage section 34, carriers that are mostly electrons are supplied from the n-type drift layer 40 to this depletion layer. Therefore, the depletion layer can be prevented from reaching the ends of the semiconductor substrate 100 in the x direction.

Figure 3:
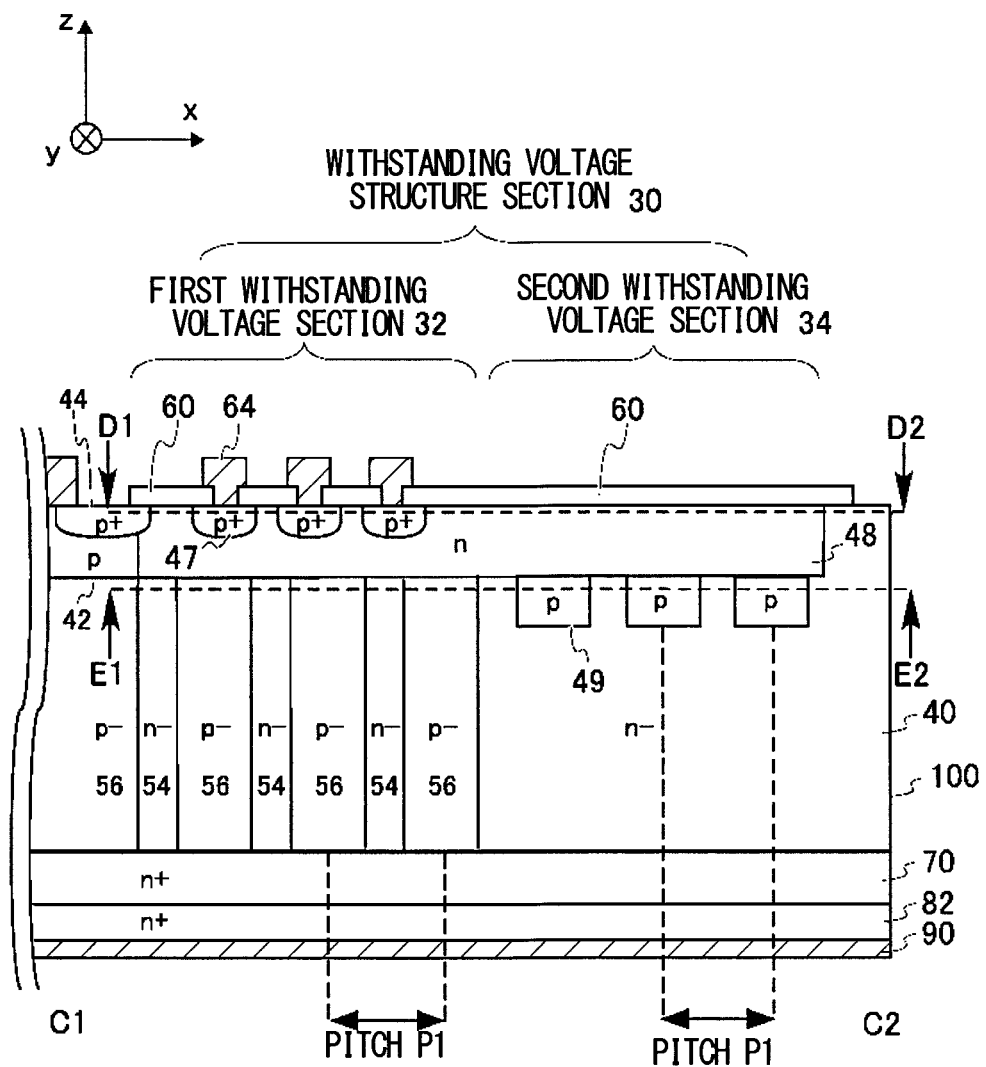
FIG. 3 is a planar view of an end of the semiconductor device 200 in the region B shown in FIG. 1 taken along the line C1-C2 parallel to the x-z plane.

FIG. 3 is a planar view of an end of the semiconductor device 200 in the region B shown in FIG. 1 taken along the line C1-C2 parallel to the x-z plane. FIG. 3 focuses on the withstanding voltage structure section 30. The region from the contact region 44 to the end of the semiconductor substrate 100 in the +x direction and obtained by cleaving parallel to the x-y plane is referred to as D1-D2. Furthermore, the region from the p-type column 56 to the end of the semiconductor substrate 100 in the +x direction passing through the p-type region 49 and obtained by cleaving in a plane parallel to the x-y plane is referred to as E1-E2.

Figure 4A:
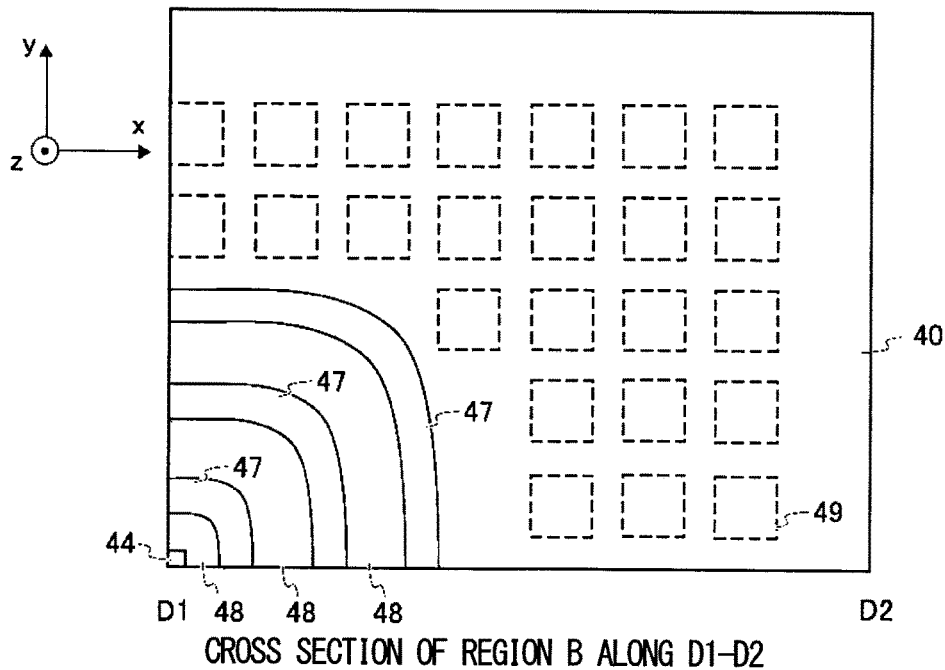
FIG. 4A is a planar view of the region B shown in FIG. 1 taken along the line D1-D2 shown in FIG. 3 parallel to the x-y plane.
Figure 4B:
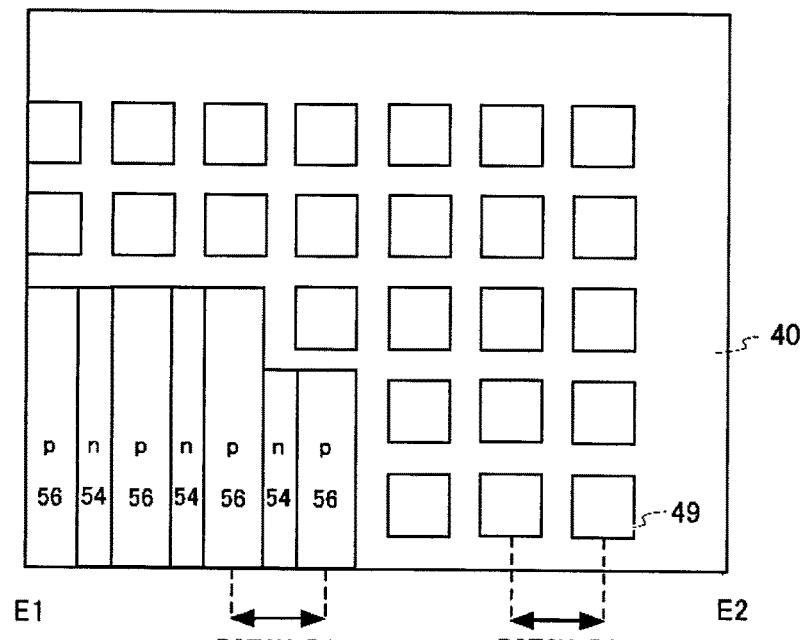
FIG. 4B is a planar view of the region B shown in FIG. 1 taken along the line E1-E2 parallel to the x-y plane.

FIG. 4A is a planar view of the region B shown in FIG. 1 taken along the line D1-D2 shown in FIG. 3 parallel to the x-y plane, and FIG. 4B is a planar view of the region B shown in FIG. 1 taken along the line E1-E2 shown in FIG. 3 parallel to the x-y plane. As shown in FIG. 4A, the guard rings 47 are formed as rings surrounding the SJ-MOSFET section 10 and the IGBT section 20 in the x-y plane. In FIG. 4A, the p-type regions 49 are shown with dotted lines in order to facilitate comparison with FIG. 4B, but the p-type regions 49 are not actually present in the D1-D2 cross section. As shown in FIG. 4B, the p-type regions 49 are provided in the n-type drift layer 40 in a grid arrangement with intervals therebetween.

Second Embodiment

Figure 5:
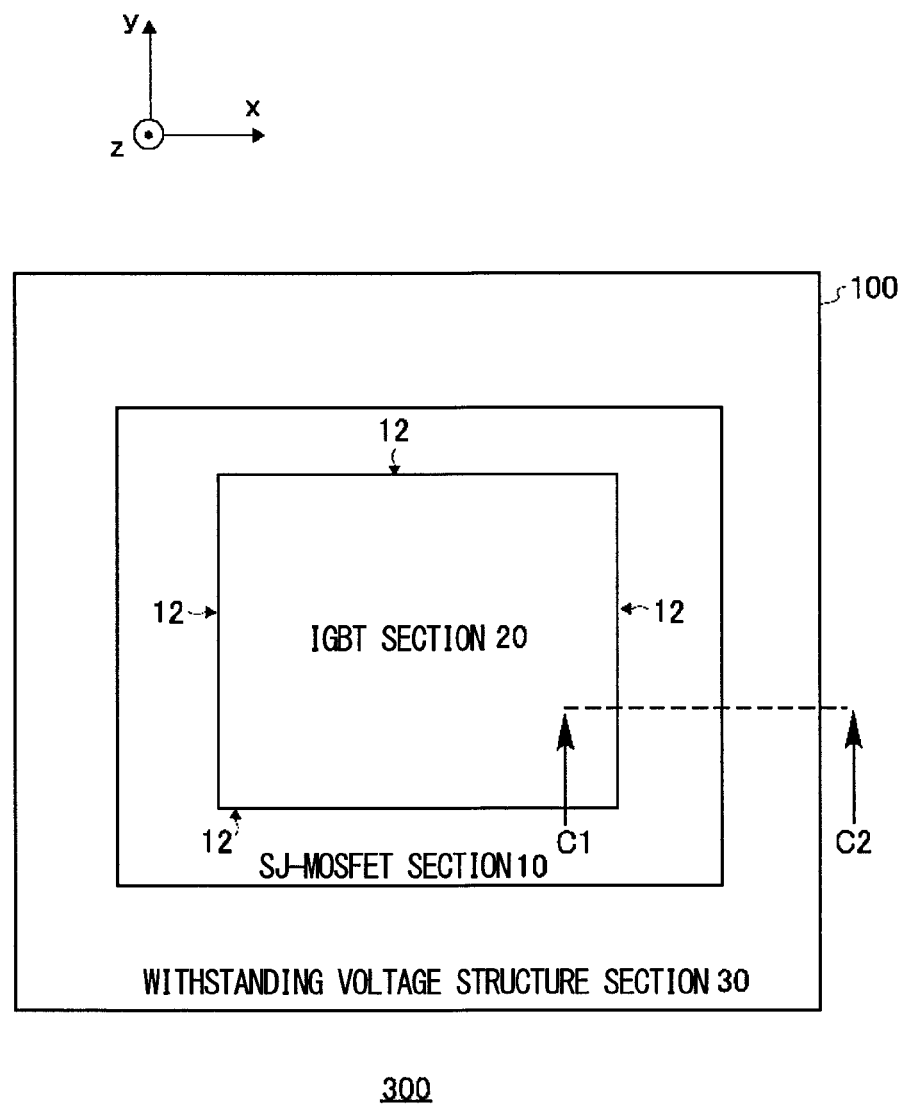
FIG. 5 is a planar view of a semiconductor device 300 as seen from the front surface of the semiconductor substrate 100.

FIG. 5 is a planar view of a semiconductor device 300 as seen from the front surface of the semiconductor substrate 100. The semiconductor device 300 differs from the first embodiment in that the SJ-MOSFET section 10 is provided in a manner to surround the IGBT section 20. In other words, the IGBT regions 24 are provided in a region surrounded by the super-junction transistor regions 14. In the present Specification, having the SJ-MOSFET section 10 surround the IGBT section 20 means that the SJ-MOSFET section 10 surrounds the entire perimeter or all four sides of the IGBT section 20 in the x-y plane. The remaining structure of the second embodiment is the same as in the first embodiment.

The semiconductor device 300 in this example includes an SJ-MOSFET section 10 and an IGBT section 20 that are rectangular in the x-y plane. Depending on the shape of the semiconductor substrate 100 in the x-y plane, the SJ-MOSFET section 10 and the IGBT section 20 may be formed as rectangles or as squares.

The semiconductor device 300 includes a boundary section 12 between the SJ-MOSFET section 10 and the IGBT section 20. The boundary section 12 may be a defect region 58 that is the same as is used in the first embodiment. In this way, when a reverse bias is applied, it is possible to realize a gradual change in the carrier amount between the n-type column 54 and the n-type drift layer 40. Accordingly, it is possible to prevent the electric field from being focused in the n-type drift layer 40 of the boundary section 12.

In the same manner as in the first embodiment, the semiconductor device 300 includes the withstanding voltage structure section 30 provided outside the outermost super-junction transistor region 14 among the super-junction transistor regions 14 provided in the SJ-MOSFET section 10. The withstanding voltage structure section 30 restricts the widening of the depletion layer to the end of the semiconductor substrate 100 when a reverse bias is applied, and therefore it is possible to increase the withstanding voltage of the semiconductor device 300.

Third Embodiment

Figure 6:
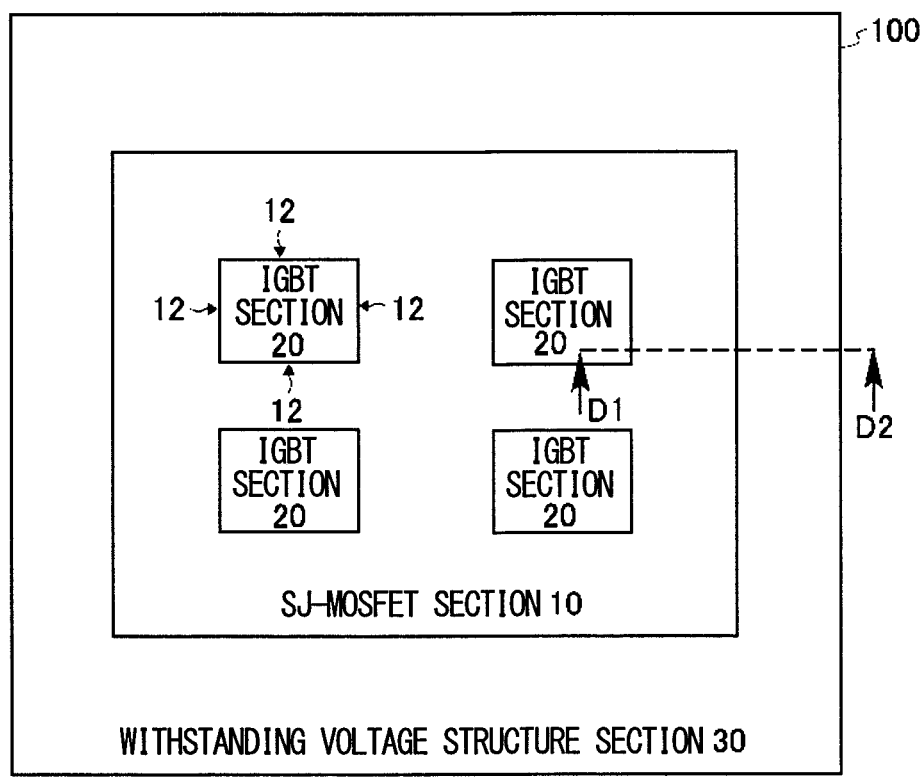
FIG. 6 is a planar view of a semiconductor device 400 as seen from the front surface of the semiconductor substrate 100.

FIG. 6 is a planar view of a semiconductor device 400 as seen from the front surface of the semiconductor substrate 100. The semiconductor device 400 differs from the first and second embodiments in that the SJ-MOSFET section 10 is provided to surround a plurality of IGBT sections 20. The remaining structure of the third embodiment may be the same as in the first and second embodiments.

The IGBT sections 20 provided in a grid formation in this example are surrounded by the SJ-MOSFET section 10. In other words, the SJ-MOSFET section 10 includes two or more super-junction transistor regions at the x-direction ends and y-direction ends of each IGBT section 20. FIG. 6 shows only four IGBT sections 20, but the number of IGBT sections 20 may be greater than four. In other words, two or more sets of the SJ-MOSFET section 10 and the IGBT sections 20 may be provided in an alternating manner in the x direction and the y direction.

The semiconductor device 400 in this example includes an SJ-MOSFET section 10 and IGBT sections 20 that are rectangular in the x-y plane. Depending on the shape of the semiconductor substrate 100 in the x-y plane, the SJ-MOSFET section 10 and the IGBT sections 20 may be formed as rectangles or as squares.

The semiconductor device 400 includes boundary sections 12 between the SJ-MOSFET section 10 and the IGBT sections 20. The boundary sections 12 may be defect regions 58 that are the same as those used in the first embodiment. In this way, when a reverse bias is applied, it is possible to realize a gradual change in the carrier amount between the n-type column 54 and the n-type drift layer 40. Accordingly, it is possible to prevent the electric field from being focused in the n-type drift layer 40 of the boundary sections 12.

In the same manner as in the first embodiment, the semiconductor device 400 includes the withstanding voltage structure section 30 provide outside the outermost super-junction transistor region 14 among the super-junction transistor regions 14 provided in the SJ-MOSFET section 10. The withstanding voltage structure section 30 restricts the widening of the depletion layer to the end of the semiconductor substrate 100 when a reverse bias is applied, and therefore it is possible to increase the withstanding voltage of the semiconductor device 400.

First Modification

Figure 7:
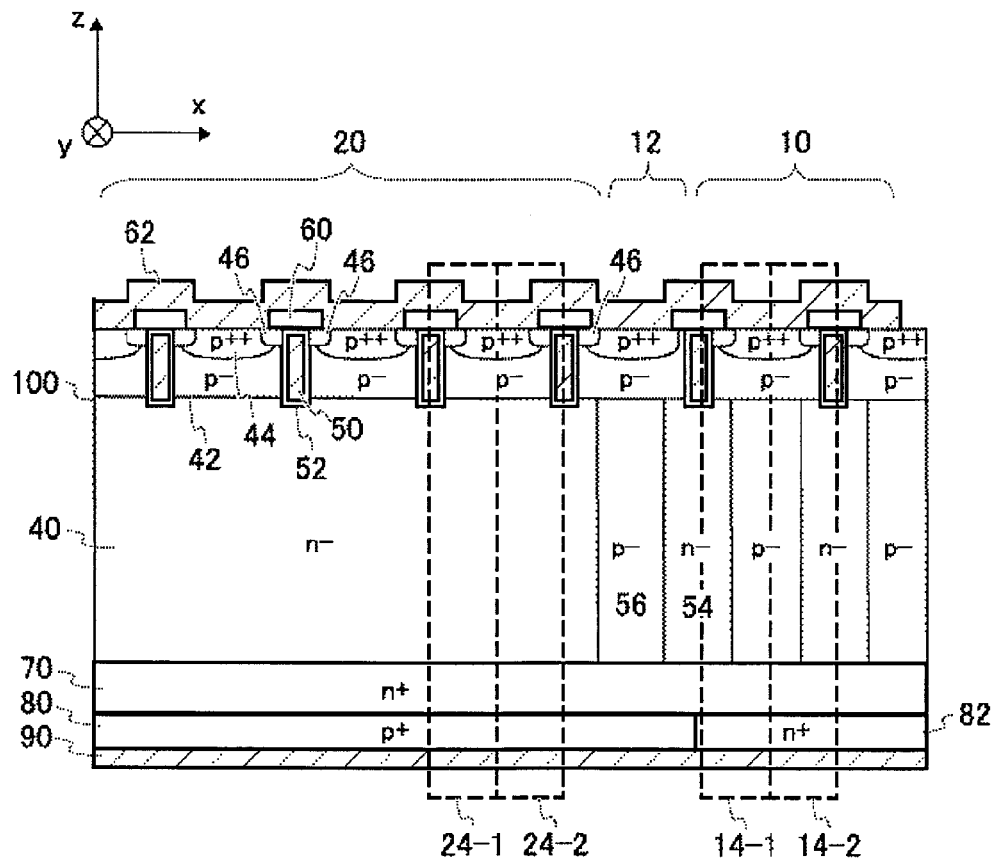
FIG. 7 shows a first modification of a boundary section 12 between an SJ-MOSFET section 10 and an IGBT section 20.

FIG. 7 shows a first modification of a boundary section 12 between an SJ-MOSFET section 10 and an IGBT section 20. The structure of the boundary section 12 in this example can be adopted in any of the first to third embodiments. In this example, the boundary section 12 between the IGBT region 24 and the super-junction transistor region 14 is provided with a second conduction type column, from the front surface of the n-type drift layer 40 serving as the drift region toward the back surface. The second conduction type column may be the same as the p-type column 56 of the SJ-MOSFET section 10. The collector layer 80 is also provided on the back surface side of the p-type column 56 of the boundary section 12.

In this example, when a forward voltage is applied, the p-type column 56 of the boundary section 12 functions neither as a super-junction transistor region 14 nor as an IGBT region 24. As a result, electrons do not enter into the p-type column 56. However, since the collector layer 80 is provided on the back surface side of the p-type column 56 of the boundary section 12, there is a possibility that holes will enter into the p-type column 56. As a result, the carrier amounts can become sequentially lower in the order of the carrier amount of the n-type drift layer 40 of the IGBT region 24, the carrier amount of the p-type column 56 of the boundary section 12, and the carrier amount of the n-type column 54 of the super-junction transistor region 14. Therefore, it is possible to realize a gradual change in the carrier amount between the n-type column 54 and the n-type drift layer 40. Accordingly, it is possible to prevent the electric field from being focused in the boundary section 12.

Second Modification

Figure 8:
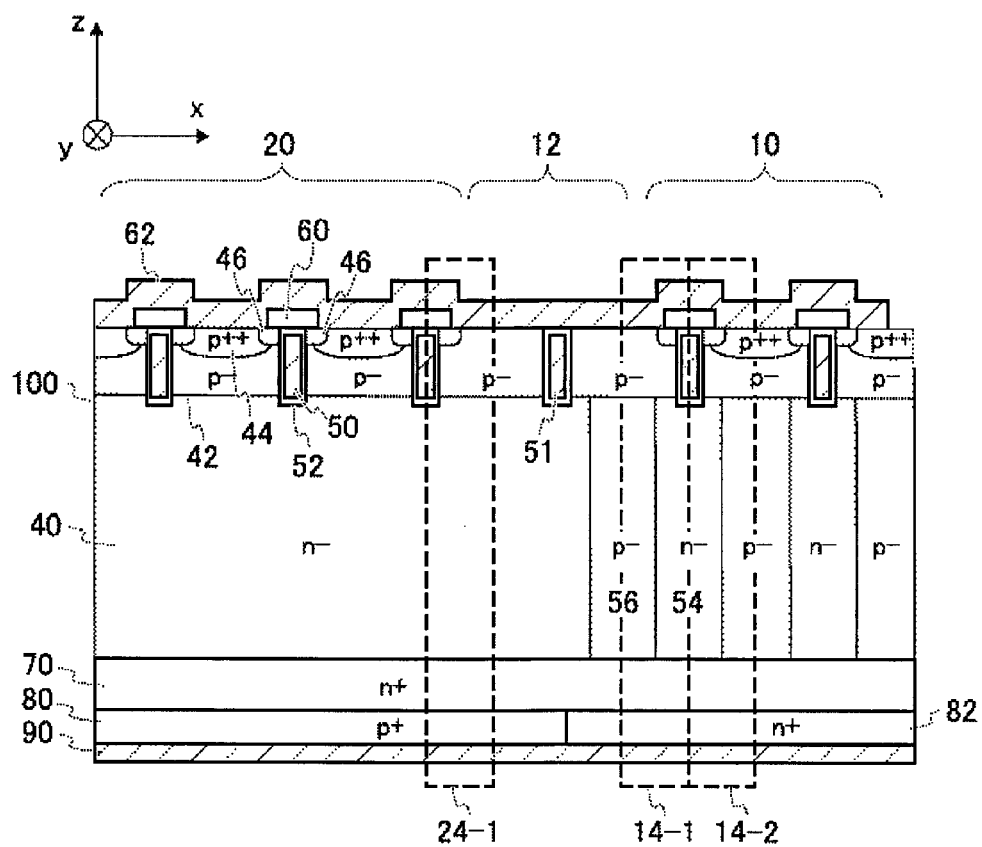
FIG. 8 shows a second modification of a boundary section 12 between an SJ-MOSFET section 10 and an IGBT section 20.

FIG. 8 shows a second modification of a boundary section 12 between an SJ-MOSFET section 10 and an IGBT section 20. The structure of the boundary section 12 in this example can be adopted in any one of the first to third embodiments. In this example, a dummy gate electrode 51 is provided to the n-type drift layer 40, which functions as the drift region in the boundary section 12 between the IGBT region 24 and the super-junction transistor region 14, on the front surface side of the semiconductor substrate 100. Furthermore, the boundary between the collector layer 80 and the drain layer 82 is provided on the back surface side of the dummy gate electrode 51 in the boundary section 12.

The dummy gate electrode 51 has the same structure as the gate electrodes 50 of the IGBT region 24 and the super-junction transistor region 14, but the dummy gate electrode 51 does not function as a transistor. In this example, the contact region 44, the source region 45, and the emitter region 46 are not provided near the dummy gate electrode 51 of the boundary section 12 in the x direction. As a result, electrons do not enter into the drain layer 82 from the region near the gate of the boundary section 12 when a forward voltage is applied.

In the IGBT region 24 closest to the boundary section 12, holes enter into the emitter region 46 from the collector layer 80 when a forward voltage is applied. In particular, when a forward voltage is applied, holes enter into the emitter region 46 of the IGBT region 24 closest to the boundary section 12 from the collector layer 80 near the boundary between the collector layer 80 and the drain layer 82. As a result, the carrier amounts can become sequentially lower in the order of the carrier amount of the n-type drift layer 40 of the IGBT region 24, the carrier amount of the n-type drift layer 40 of the boundary section 12, and the carrier amount of the n-type column 54 of the super-junction transistor region 14. Therefore, it is possible to realize a gradual change in the carrier amount between the n-type column 54 and the n-type drift layer 40. Accordingly, it is possible to prevent the electric field from being focused in the boundary section 12.

Third Modification

Figure 9:
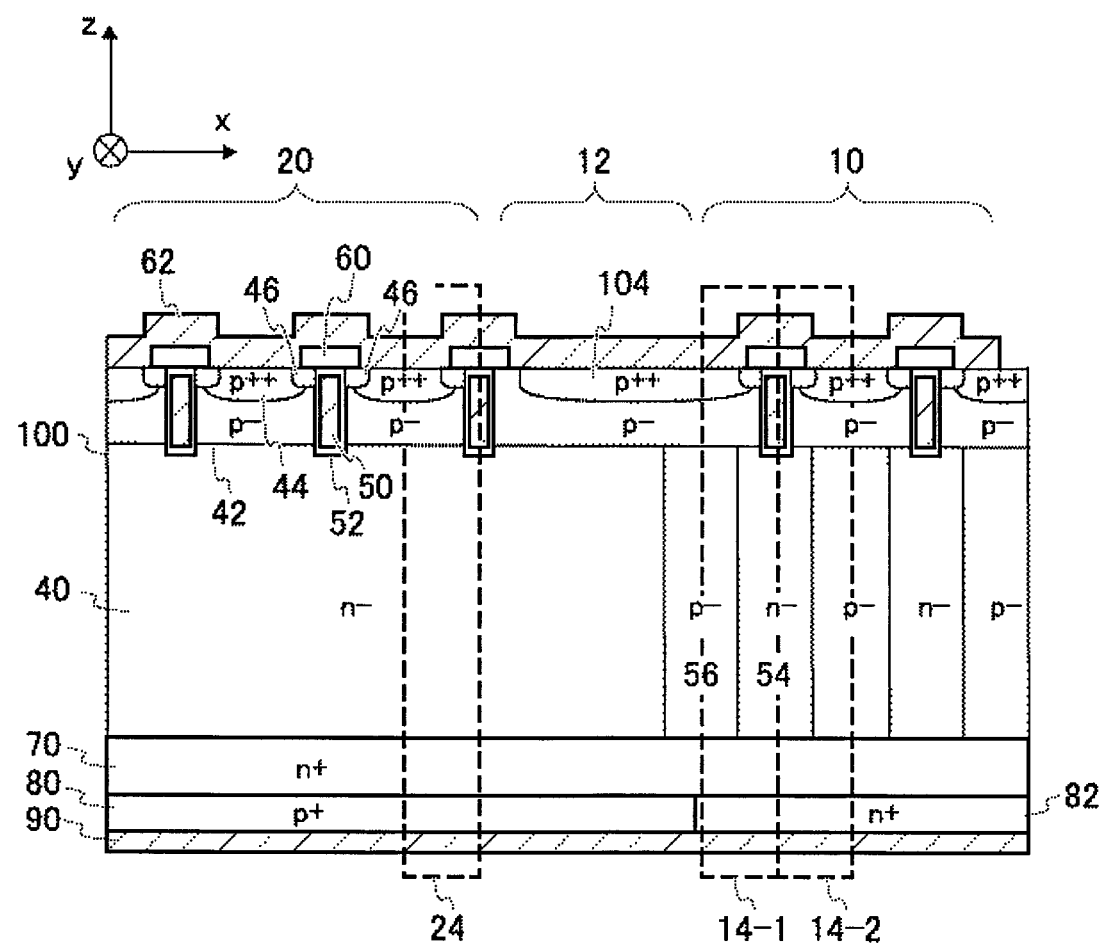
FIG. 9 shows a third modification of a boundary section 12 between an SJ-MOSFET section 10 and an IGBT section 20.

FIG. 9 shows a third modification of a boundary section 12 between an SJ-MOSFET section 10 and an IGBT section 20. The structure of the boundary section 12 in this example can be adopted in any one of the first to third embodiments. In this example, an expansion p-type well 104 serving as a second conduction type well expanding in a direction parallel to the front surface of the semiconductor substrate 100 is provided in the boundary section 12 between the IGBT region 24 and the super-junction transistor region 14.

In this example, the boundary between the collector layer 80 and the drain layer 82 is provided on the back surface side of the boundary between the boundary section 12 and the SJ-MOSFET section 10. Furthermore, the emitter region 46 is not provided on the boundary section 12 side of the boundary between the boundary section 12 and the IGBT section 20.

When a forward voltage is applied, holes enter into the n-type drift layer 40 from the collector layer 80 on the back surface side of the boundary section 12 toward the expansion p-type well 104. As a result of this structure as well, it is possible to realize a gradual change in the carrier amount between the n-type column 54 and the n-type drift layer 40, in the same manner as with the second modification. Accordingly, it is possible to prevent the electric field from focusing in the boundary section 12.

Fourth Modification

Figure 10:
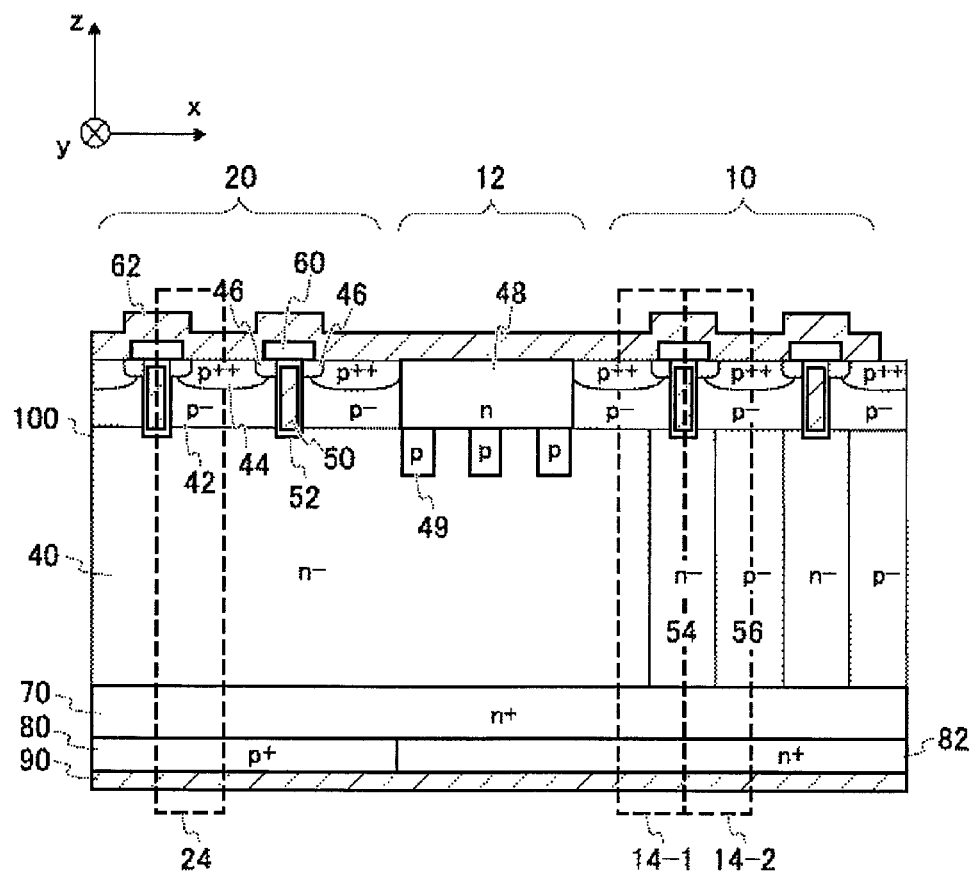
FIG. 10 shows a fourth modification of a boundary section 12 between an SJ-MOSFET section 10 and an IGBT section 20.

FIG. 10 shows a fourth modification of a boundary section 12 between an SJ-MOSFET section 10 and an IGBT section 20. The structure of the boundary section 12 in this example can be adopted in any one of the first to third embodiments. In this example, the boundary section 12 between the IGBT region 24 and the super-junction transistor region 14 includes a second conduction type column with an end having a depth that is less than the depth of the end of the second conduction type column of the super-junction transistor region 14. The boundary section 12 in this example includes the n-type region 48 and the p-type region 49 described in the examples of FIGS. 2 and 3. In this example, the boundary between the collector layer 80 and the drain layer 82 is provided on the back surface side of the boundary between the boundary section 12 and the IGBT section 20.

When a forward voltage is applied, electrons move from the n-type region 48 of the boundary section 12 toward the drain layer 82 and enter into the n-type drift layer 40. As a result of this structure as well, it is possible to realize a gradual change in the carrier amount between the n-type column 54 and the n-type drift layer 40, in the same manner as with the second modification. Accordingly, it is possible to prevent the electric field from focusing in the boundary section 12.

Fifth Modification

Figure 11:
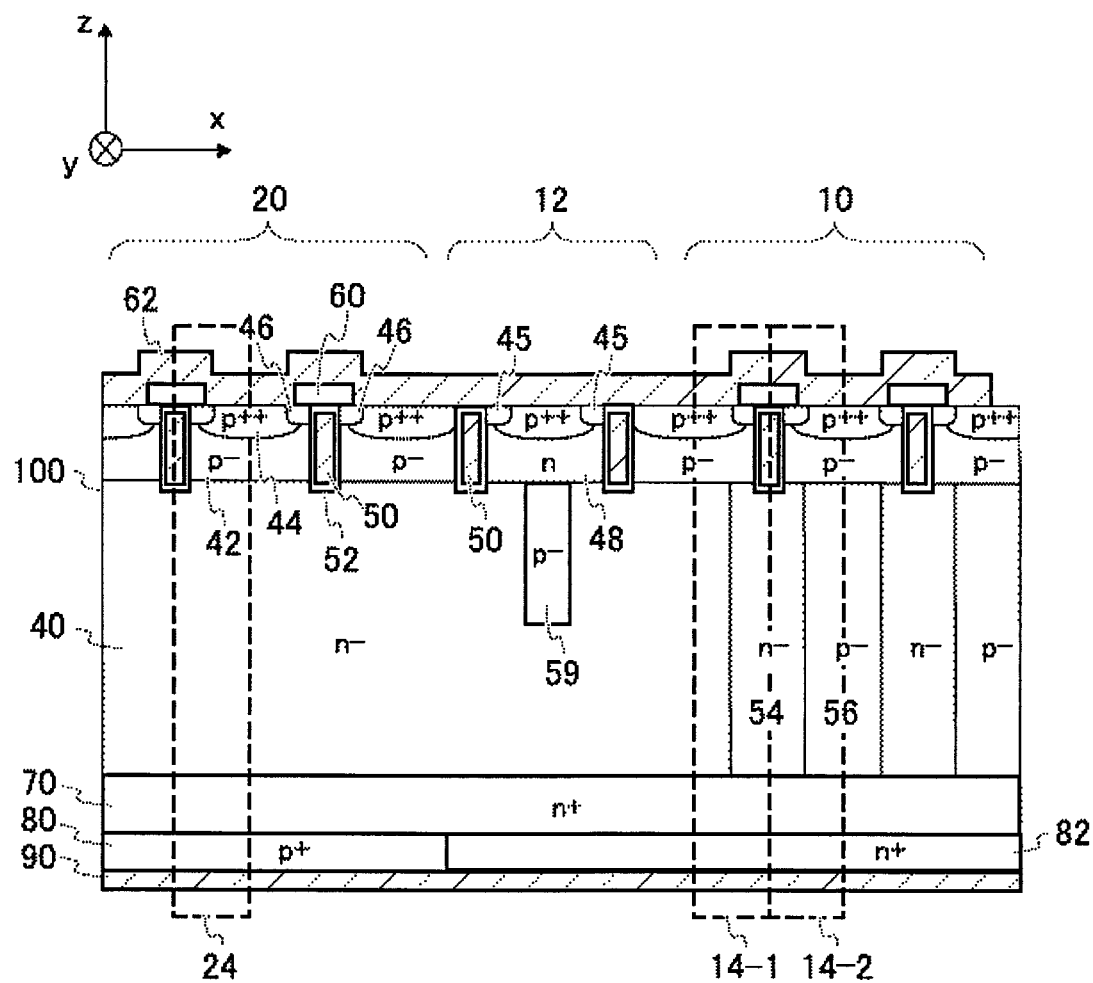
FIG. 11 shows a fifth modification of a boundary section 12 between an SJ-MOSFET section 10 and an IGBT section 20.

FIG. 11 shows a fifth modification of a boundary section 12 between an SJ-MOSFET section 10 and an IGBT section 20. The structure of the boundary section 12 in this example can be adopted in any one of the first to third embodiments. In this example, the boundary section 12 between the IGBT region 24 and the super-junction transistor region 14 is provided with a p-type region 59 serving as a second conduction type region having an end with a depth that is approximately half of the depth of the end of the p-type column 56 that is the second conduction type column of the super-junction transistor region 14. A contact region 44 is provided on the front surface side between the adjacent gate electrodes 50 in the boundary section 12, and an n-type region 48 serving as a first conduction type region is provided on the back surface side between these gate electrodes 50. A p-type region 59 may be provided on the back surface side of the n-type region 48 in contact with the n-type region 48. A source region 45 is provided on the front surface side between the contact region 44 and the two gate electrodes 50 adjacent thereto. It should be noted that no source regions 45 or emitter regions 46 are provided at the boundary between the boundary section 12 and the IGBT section 20 or at the boundary between the boundary section 12 and the SJ-MOSFET section 10. Furthermore, even though the boundary between the collector layer 80 and the drain layer 82 is provided at the boundary between the boundary section 12 and the IGBT section 20, this boundary may instead be provided at the boundary between the boundary section 12 and the SJ-MOSFET section 10.

When a forward voltage is applied, electrons move from the n-type region 48 in the boundary section 12 toward the drain layer 82 and enter into the n-type drift layer 40. As a result of this structure as well, it is possible to realize a gradual change in the carrier amount between the n-type column 54 and the n-type drift layer 40, in the same manner as with the second modification. Accordingly, it is possible to prevent the electric field from focusing in the boundary section 12.

Figure 12:
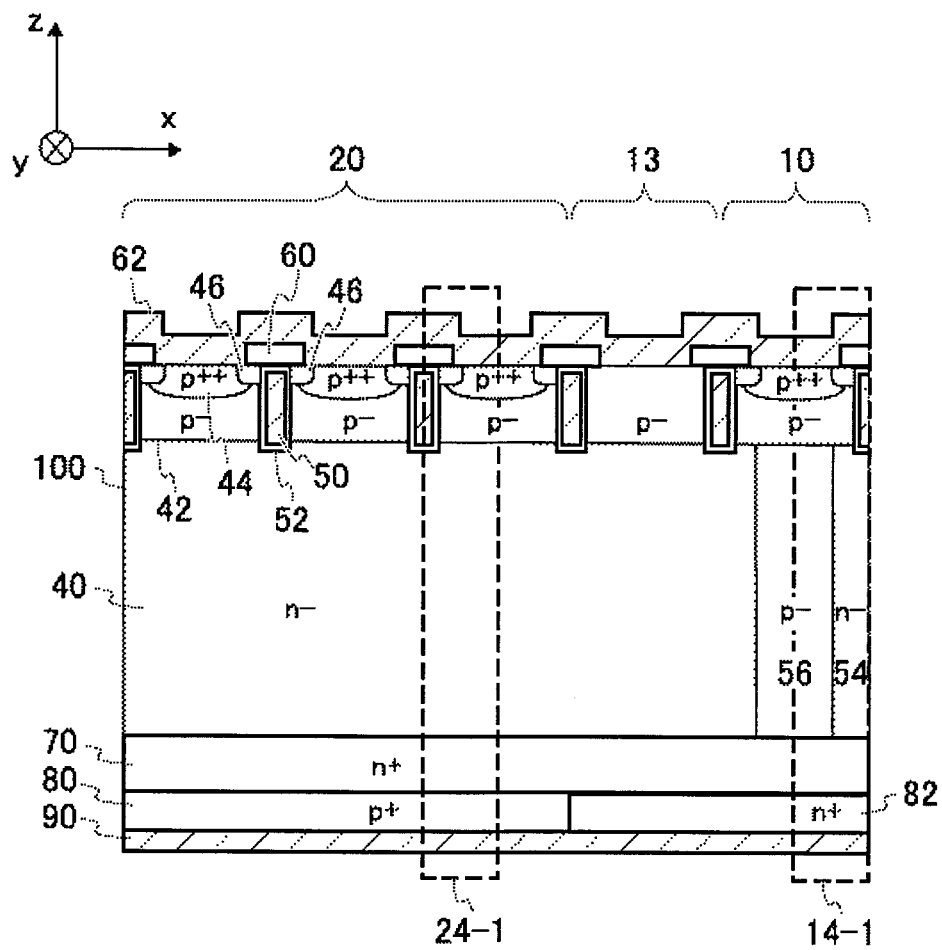
FIG. 12 shows a first example in which an FWD section 13 is provided between an SJ-MOSFET section 10 and an IGBT section 20.

FIG. 12 shows a first example in which an FWD section 13 is provided between an SJ-MOSFET section 10 and an IGBT section 20. The semiconductor device in this example includes an FWD section 13 at the boundary section between the IGBT section 20 and the SJ-MOSFET section 10. An n+ drain layer 82 is provided from the SJ-MOSFET section 10 to the region between the FWD section 13 and the IGBT section 20. The p-type base layer 42 forms pn junctions with the n-type drift layer 40, the FS layer 70, and the collector layer 80. The semiconductor device in this example can realize a low Von characteristic using the SJ-MOSFET section 10 when a low current is flowing. Furthermore, the semiconductor device can realize a large current characteristic using the IGBT section 20 when a high current is flowing. Yet further, it is possible to reduce the size of the semiconductor module by integrating the SJ-MOSFET section 10, the IGBT section 20, and the FWD section 13 on a single semiconductor chip.

Figure 13:
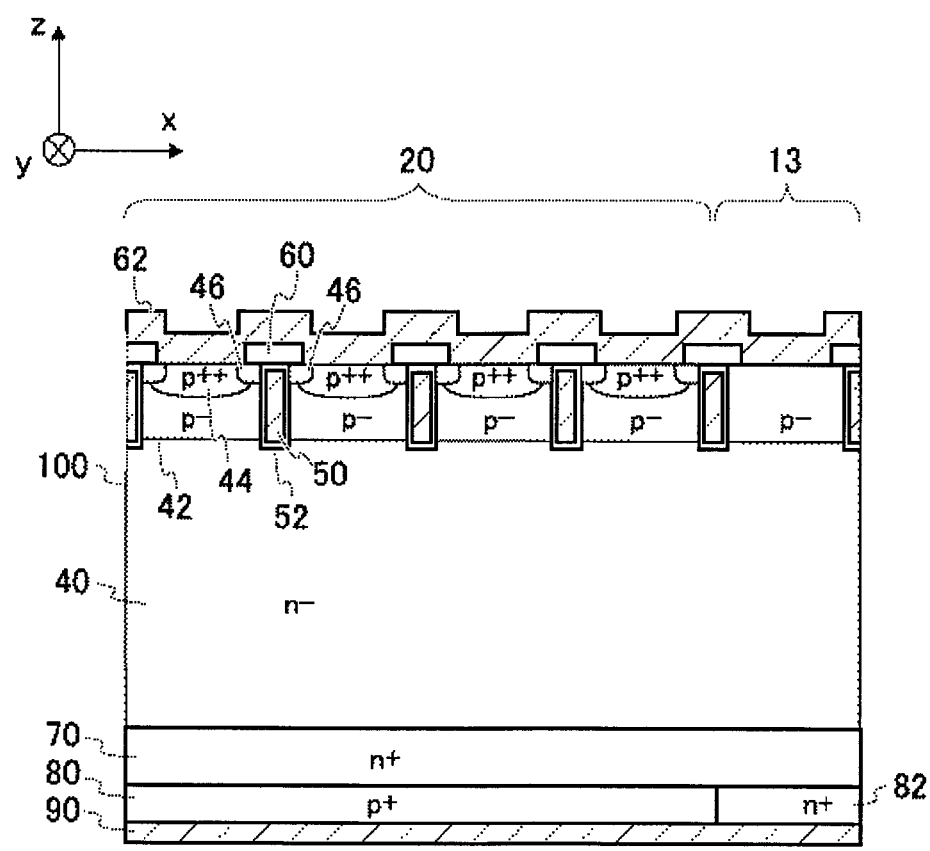
FIG. 13 is a first comparative example in which an FWD section 13 and an IGBT section 20 are provided.
Figure 14:
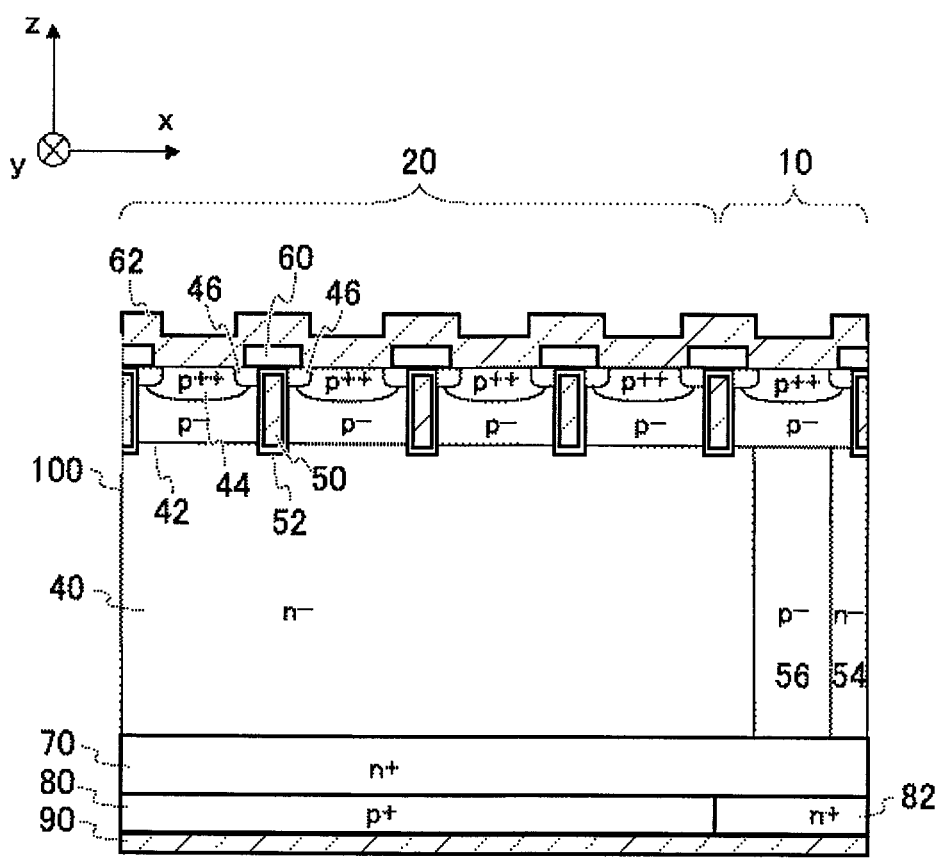
FIG. 14 is a second comparative example in which an SJ-MOSFET section 10 and an IGBT section 20 are provided.

FIG. 13 is a first comparative example in which an FWD section 13 and an IGBT section 20 are provided. The semiconductor device of the first comparative example does not include an SJ-MOSFET section 10. FIG. 14 is a second comparative example in which an SJ-MOSFET section 10 and an IGBT section 20 are provided. The semiconductor device of the second comparative example does not include an IGBT section 20.

Figure 15:
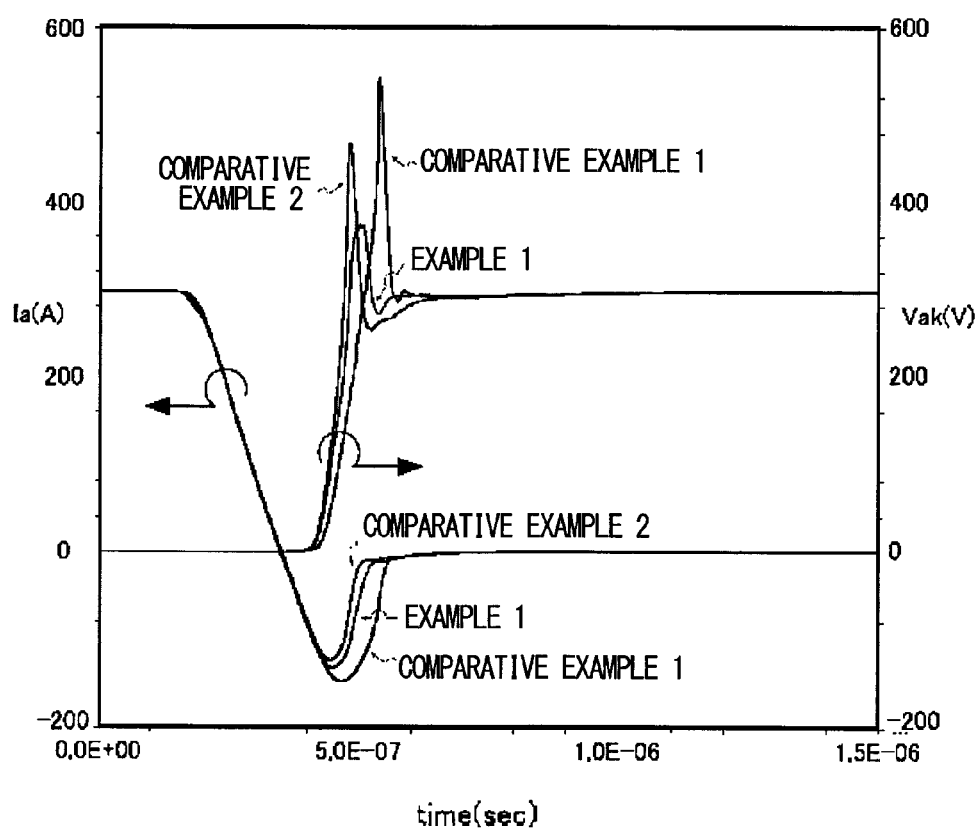
FIG. 15 is a graph showing the voltage-current characteristics when the gate is OFF in FIGS. 12 to 14.

FIG. 15 is a graph showing the voltage-current characteristics when the gate is OFF in FIGS. 12 to 14. The horizontal axis indicates time (sec). The vertical axis on the left side indicates the current (A) flowing between the front surface electrode 62 and the back surface electrode 90. The vertical axis on the right side indicates the voltage (V) between the front surface electrode 62 and the back surface electrode 90.

In FIG. 15, Example 1 indicates the example shown in FIG. 12, Comparative Example 1 indicates the example shown in FIG. 13, and Comparative Example 2 indicates the example shown in FIG. 14. As made clear from FIG. 15, the gate is turned OFF at around 2.0E-07 (sec), and the current flowing through each semiconductor device begins to decrease. Here, E indicates multiplication by 10 raised to a certain power. Therefore, E-07 means 10 to the $-7^{th}$ power. As made clear from the current (A) values in FIG. 15, Example 1 has a lower reverse recovery current (Irp) than Comparative Example 1. In other words, Example 1 can obtain a more favorable soft recovery characteristic than Comparative Example 1. Furthermore, as made clear from the voltage (V) values in FIG. 15, Example 1 can decrease the surge voltage more than Comparative Example 1 and Comparative Example 2. In this way, with Example 1 shown in FIG. 12, it is possible to realize a soft recovery characteristic and a low surge voltage characteristic.

Figure 16:
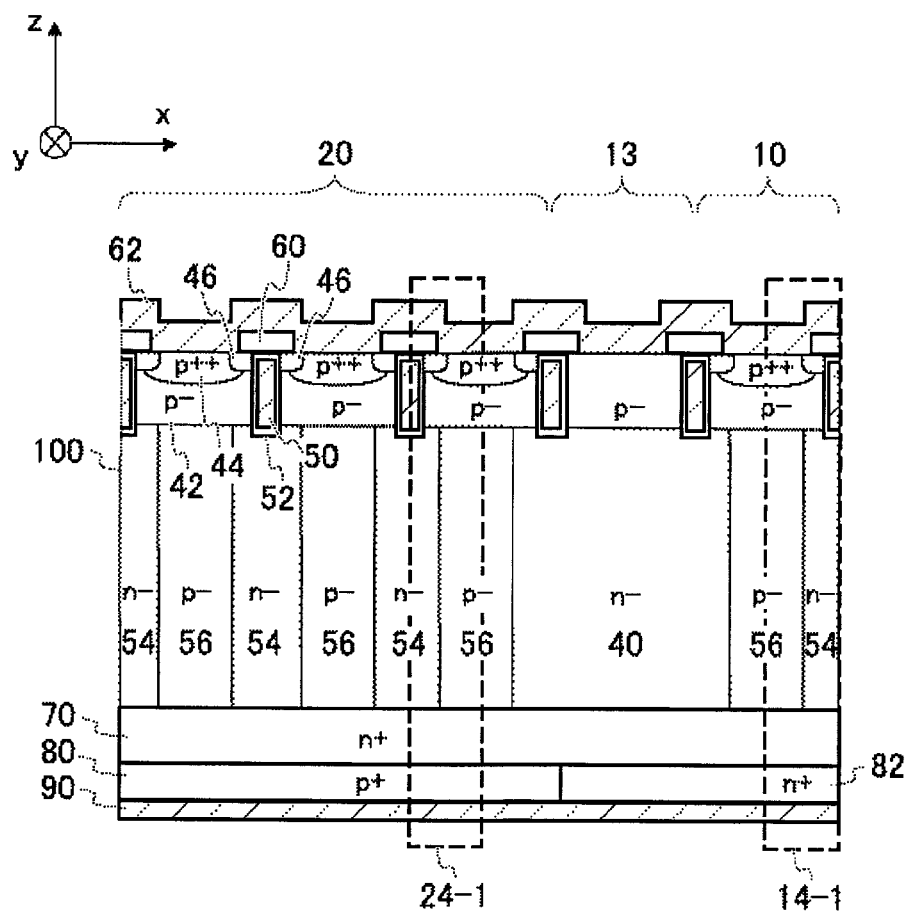
FIG. 16 shows a second example in which an FWD section 13 is provided between an SJ-MOSFET section 10 and an IGBT section 20.

FIG. 16 shows a second example in which an FWD section 13 is provided between an SJ-MOSFET section 10 and an IGBT section 20. In the semiconductor device in this example, the IGBT section 20 has an SJ structure. This feature is different from the example shown in FIG. 12. Other features are the same as those of the example shown in FIG. 12. The semiconductor device in this example realizes the same effects as the example shown in FIG. 12.

The examples shown in FIGS. 12 and 16 can be adopted in the semiconductor device 200 or the semiconductor device 300. In such a case, the pitch of the p+ collector layers 80 and the n+ drain layers 82 may be greater than or equal to 200 μm. Furthermore, the pitch of the p+ collector layers 80 and the n+ drain layers 82 may be from 5 times to 1,000 times the pitch of the n-type columns 54 and the p-type columns 56 in the SJ-MOSFET section 10.

FIGS. 17 to 35 each show an exemplary configuration of an SJ-MOSFET section 10 and an FWD section 13, from which the IGBT section 20 is omitted. FIGS. 36 to 39 show examples in which an IGBT section 20 is combined with the SJ-MOSFET section 10 and the FWD section 13.

In each example shown in FIGS. 17 to 35, a defect region 110 is formed by injecting a lifetime killer into at least one of the SJ-MOSFET section 10, the FWD section 13, and the boundary between the SJ-MOSFET section 10 and the FWD section 13.

Figure 17:
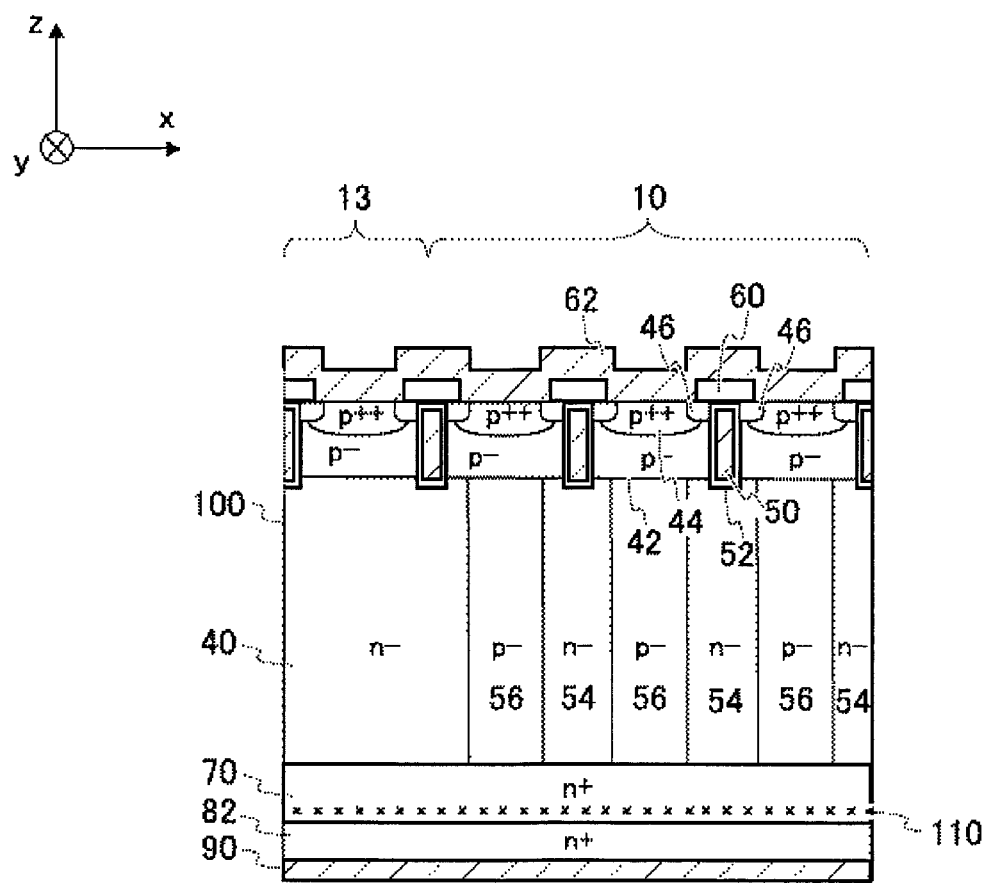
FIG. 17 shows a first example of an SJ-MOSFET section 10 and an FWD section 13.

FIG. 17 shows a first example of an SJ-MOSFET section 10 and an FWD section 13. In this example, the defect region 110 is formed by injecting the lifetime killer into the FS layer 70 of the SJ-MOSFET section 10. As a result, it is possible to improve the soft recovery characteristic of the SJ-MOSFET section 10 compared to a case in which the lifetime killer is not injected.

In this example, the defect region 110 is formed by injecting the lifetime killer into the FS layer 70 of the FWD section 13 as well. As a result, it is possible to improve the soft recovery characteristic of the FWD section 13 compared to a case in which the lifetime killer is not injected. In the same manner as the defect region 58, the positions where the defect region 110 is formed are indicated by x marks. In this example, the defect region is provided across the entire FS layer 70 at a position at a prescribed depth on the back surface side of the FS layer 70. In the other drawings as well, the formation of the defect region 110 is indicated by x marks in the same manner in a direction perpendicular to the plane of the drawing in the layers or regions.

Figure 18:
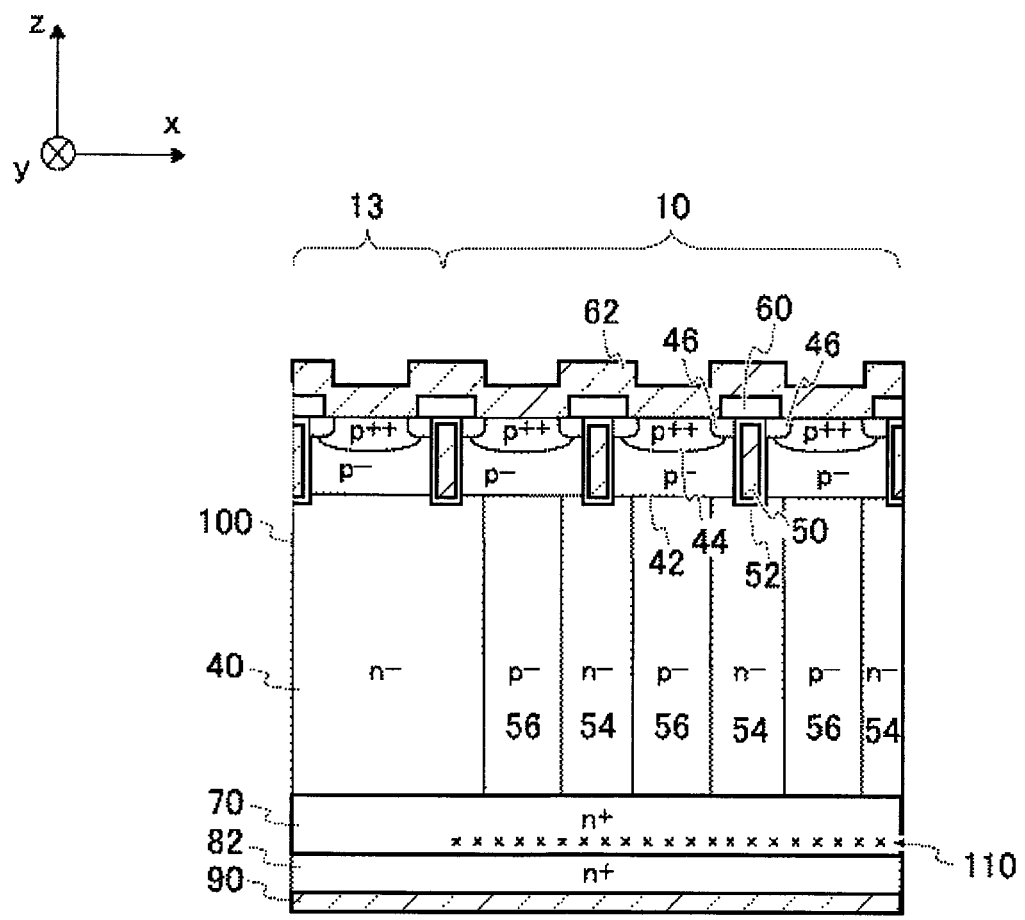
FIG. 18 shows a second example of an SJ-MOSFET section 10 and an FWD section 13.

FIG. 18 shows a second example of an SJ-MOSFET section 10 and an FWD section 13. In this example, the defect region 110 is not formed in the FS layer 70 of the FWD section 13. This example differs from the example shown in FIG. 17 with respect to this feature.

Figure 19:
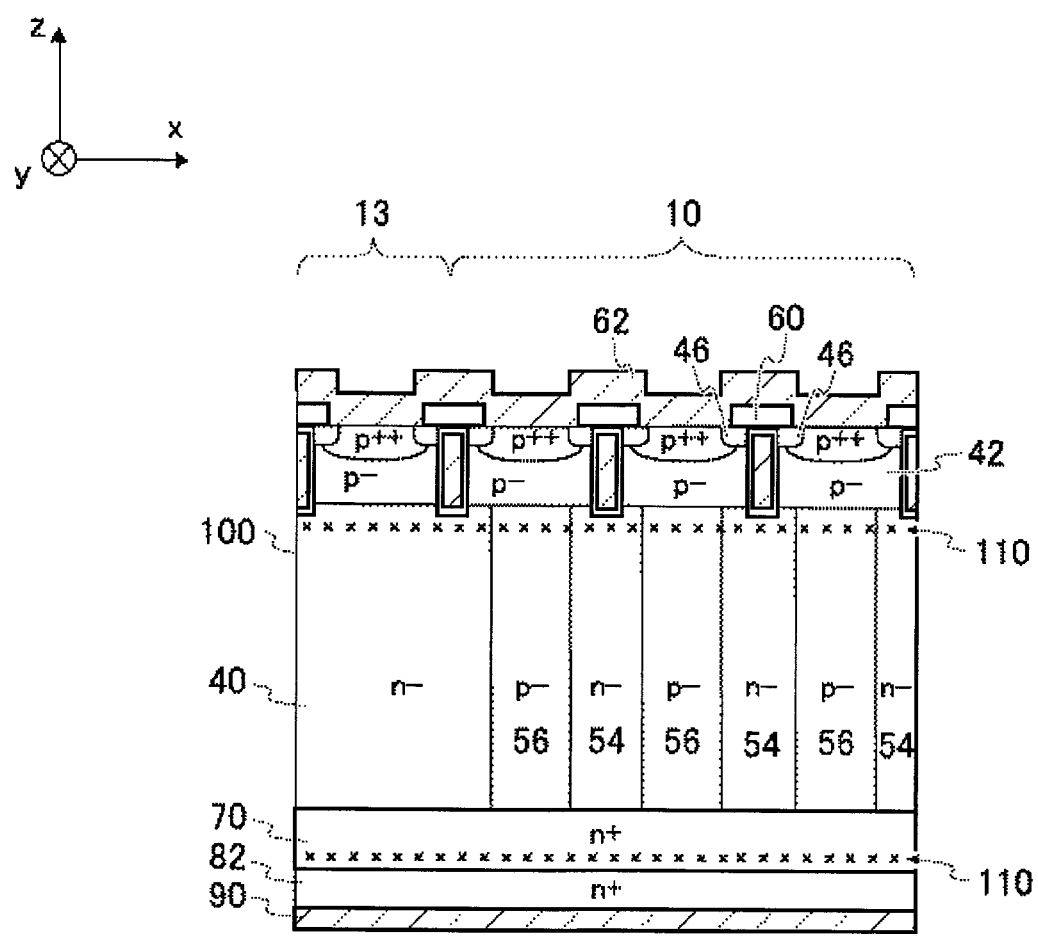
FIG. 19 shows a third example of an SJ-MOSFET section 10 and an FWD section 13.

FIG. 19 shows a third example of an SJ-MOSFET section 10 and an FWD section 13. In the SJ-MOSFET section 10 in this example, the defect region 110 is formed by injecting the lifetime killer into both the FS layer 70 and the front surface sides of the n-type column 54 and the p-type column 56. As a result, the soft recovery characteristics of the SJ-MOSFET section 10 can be further improved when compared to the example shown in FIG. 17.

Furthermore, in this example, the defect region 110 is formed by injecting the lifetime killer into both the FS layer 70 and the anode side of the drift region of the FWD section 13. The anode side of the drift region of the FWD section 13 refers to the region near the boundary between the n-type drift layer 40 and the p-type base layer 42 in the n-type drift layer 40 of the FWD section 13. In this example, the soft recovery characteristics of the FWD section 13 can be further improved when compared to the example shown in FIG. 17.

Figure 20:
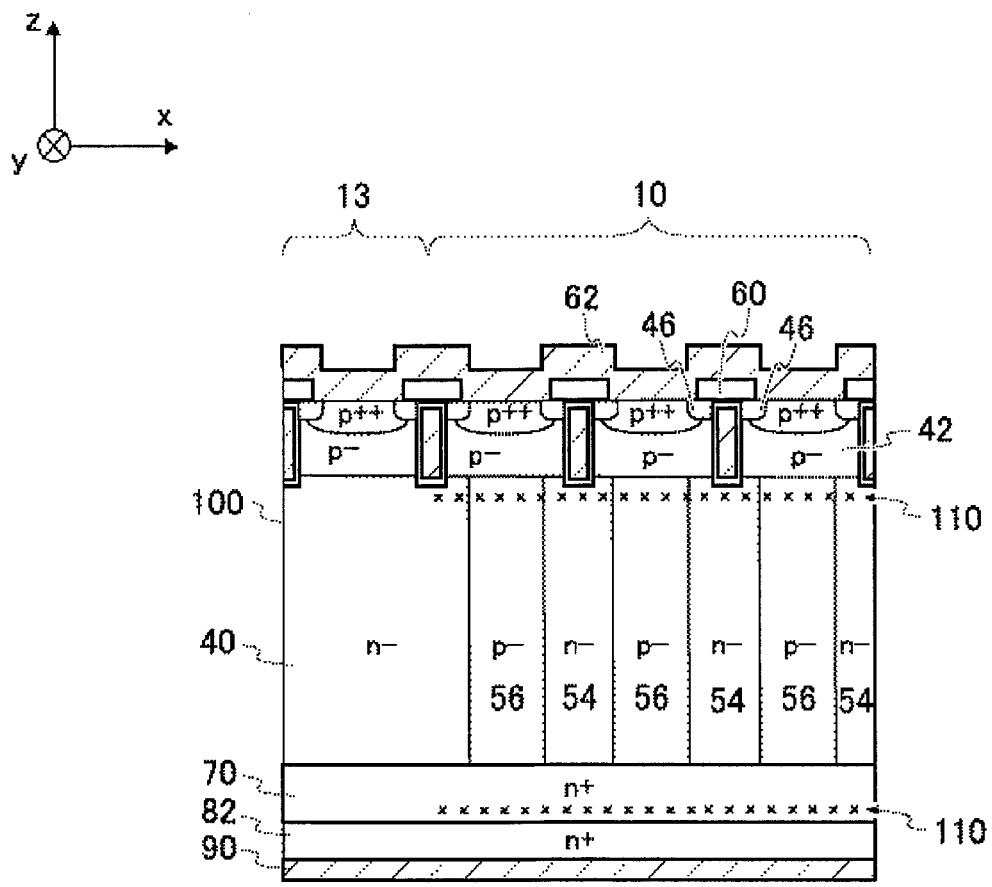
FIG. 20 shows a fourth example of an SJ-MOSFET section 10 and an FWD section 13.

FIG. 20 shows a fourth example of an SJ-MOSFET section 10 and an FWD section 13. In the SJ-MOSFET section 10 in this example, the defect region 110 is not formed in the FS layer 70 of the FWD section 13 and is not formed in the front surface sides of the n-type column 54 and the p-type column 56. This example differs from the example shown in FIG. 19 with respect to this feature.

Figure 21:
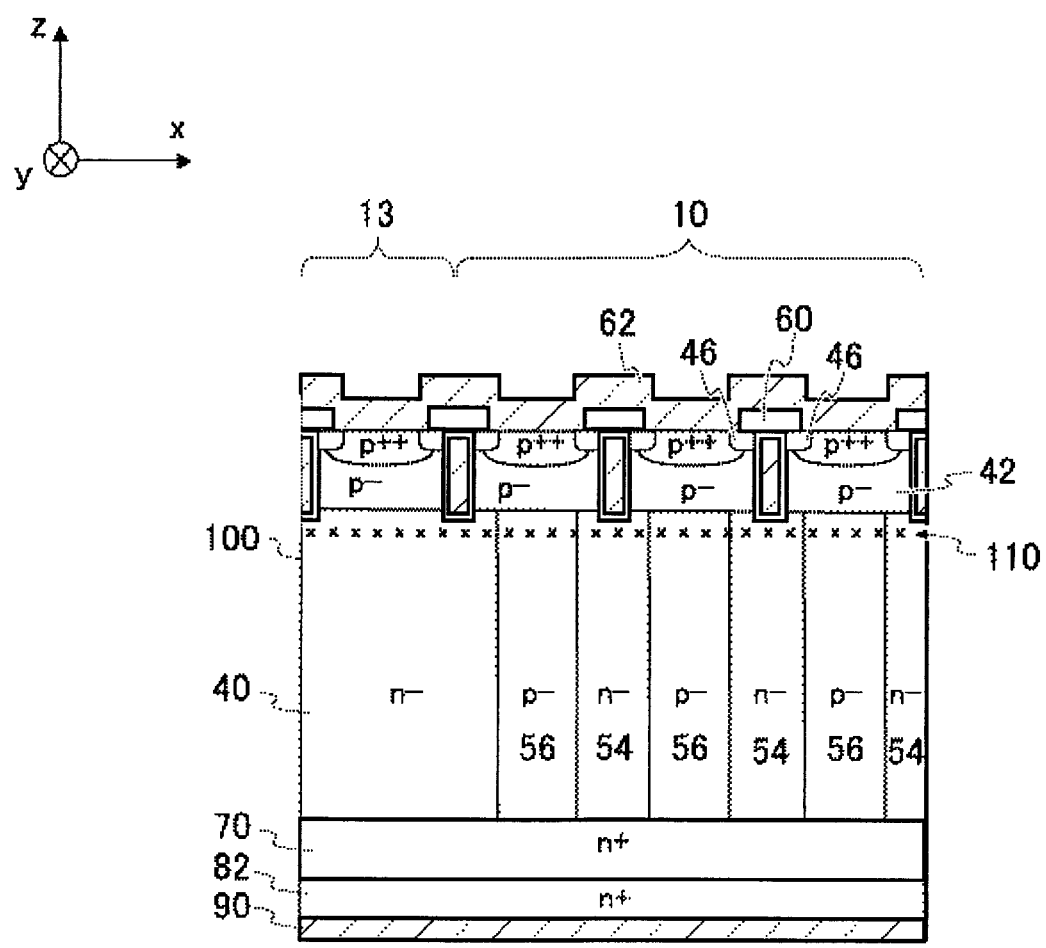
FIG. 21 shows a fifth example of an SJ-MOSFET section 10 and an FWD section 13.

FIG. 21 shows a fifth example of an SJ-MOSFET section 10 and an FWD section 13. In this example, the defect region 110 is not formed in the FS layer 70 of the FWD section 13 and is not formed in the SJ-MOSFET section 10. This example differs from the example shown in FIG. 17 with respect to this feature. However, it should be noted that it is possible to improve the soft recovery characteristics of the SJ-MOSFET section 10 and the FWD section 13 when compared to a case in which the lifetime killer is not injected.

Figure 22:
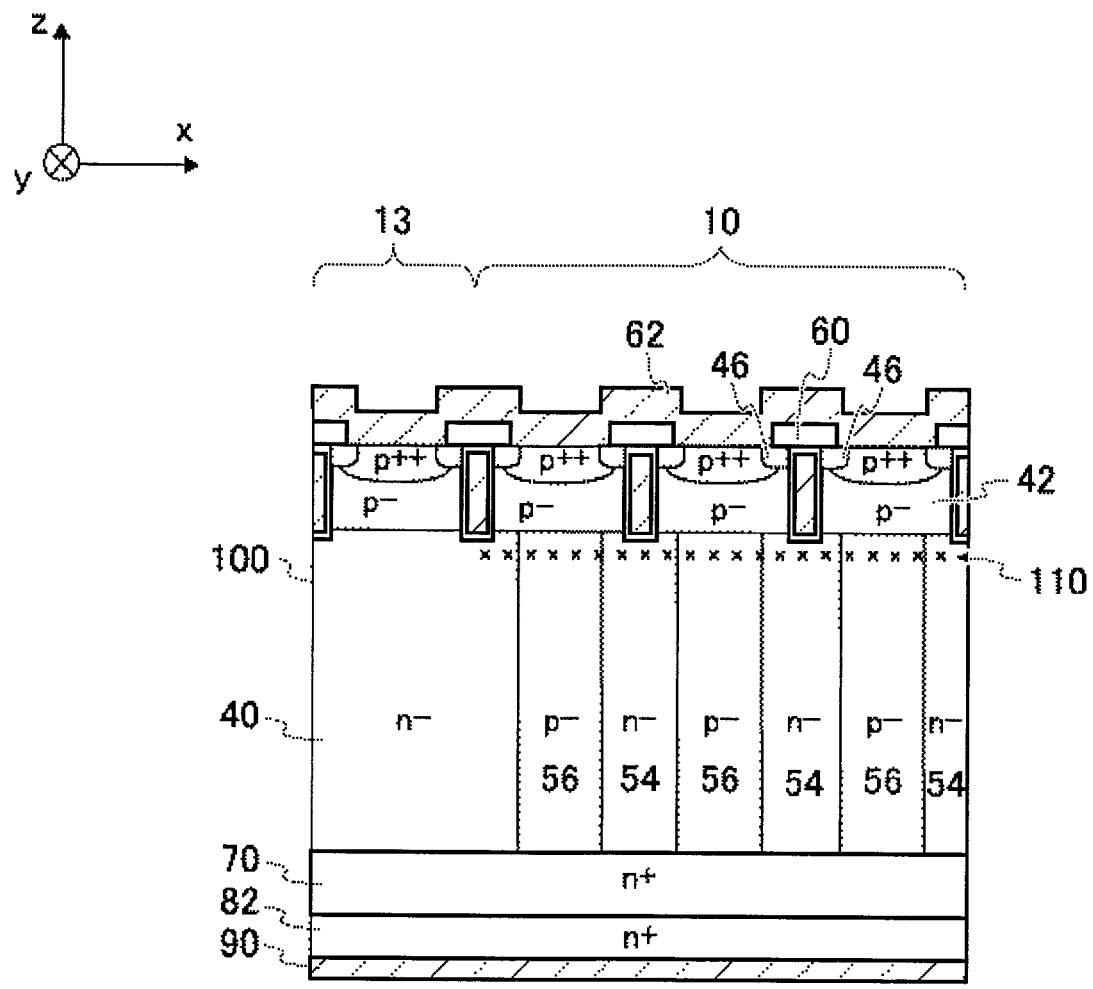
FIG. 22 shows a sixth example of an SJ-MOSFET section 10 and an FWD section 13.

FIG. 22 shows a sixth example of an SJ-MOSFET section 10 and an FWD section 13. In this example, the defect region 110 is formed by injecting the lifetime killer in the front surface sides of the n-type column 54 and the p-type column 56 in the SJ-MOSFET section 10. As a result, the soft recovery characteristic of the SJ-MOSFET section 10 can be further improved when compared to a case in which the lifetime killer is not injected.

Figure 23:
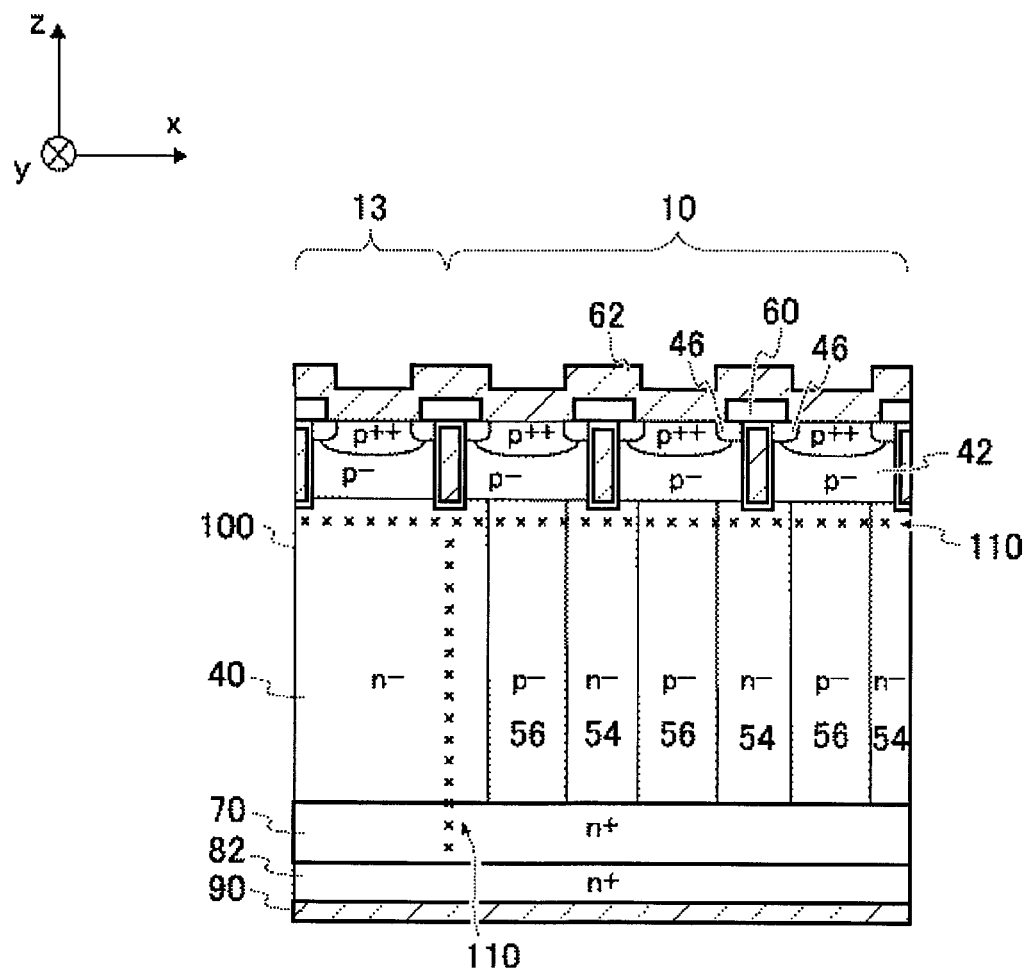
FIG. 23 shows a seventh example of an SJ-MOSFET section 10 and an FWD section 13.

FIG. 23 shows a seventh example of an SJ-MOSFET section 10 and an FWD section 13. In this example, the defect region 110 is formed by injecting the lifetime killer in the boundary between the SJ-MOSFET section 10 and the FWD section 13. This example differs from the example shown in FIG. 21 with respect to this feature. Since the defect region 110 is included at the boundary between the SJ-MOSFET section 10 and the FWD section 13, it is possible to restrict the breakdown during reverse recovery.

Figure 24:
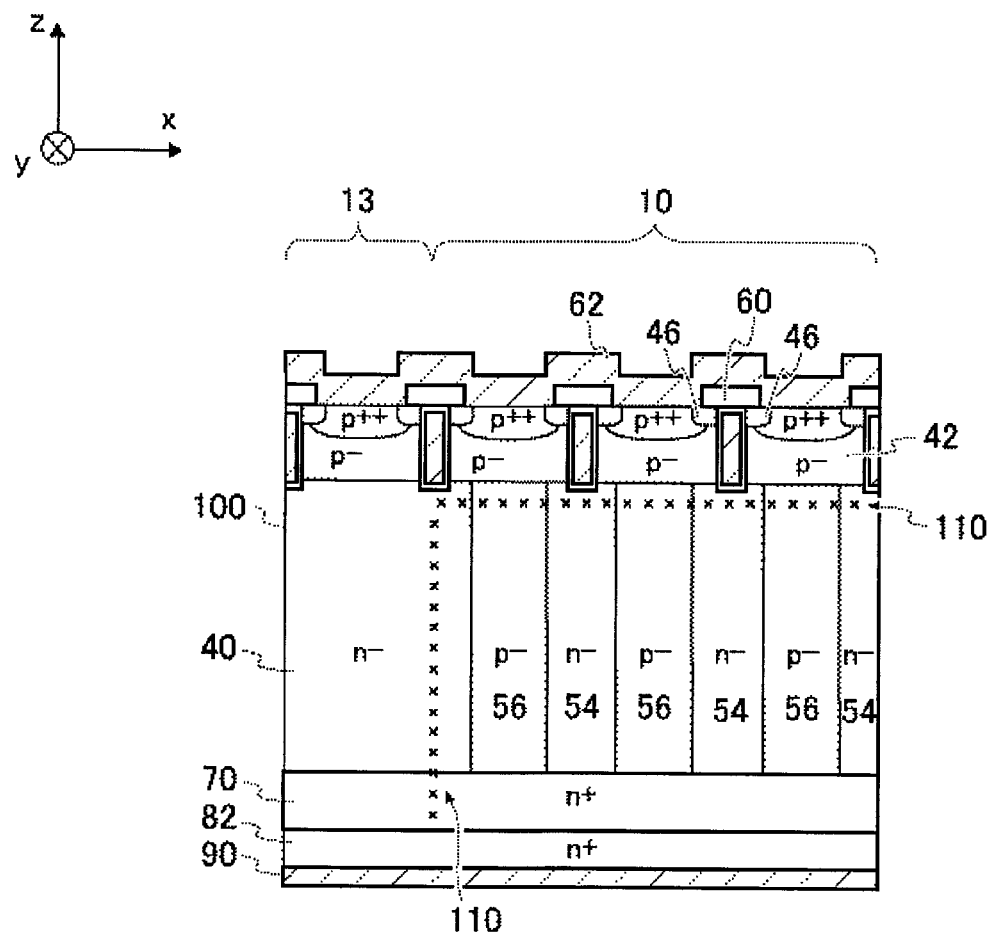
FIG. 24 shows an eighth example of an SJ-MOSFET section 10 and an FWD section 13.

FIG. 24 shows an eighth example of an SJ-MOSFET section 10 and an FWD section 13. In this example, the defect region 110 is formed by injecting the lifetime killer in the boundary between the SJ-MOSFET section 10 and the FWD section 13. This example differs from the example shown in FIG. 22 with respect to this feature.

Figure 25:
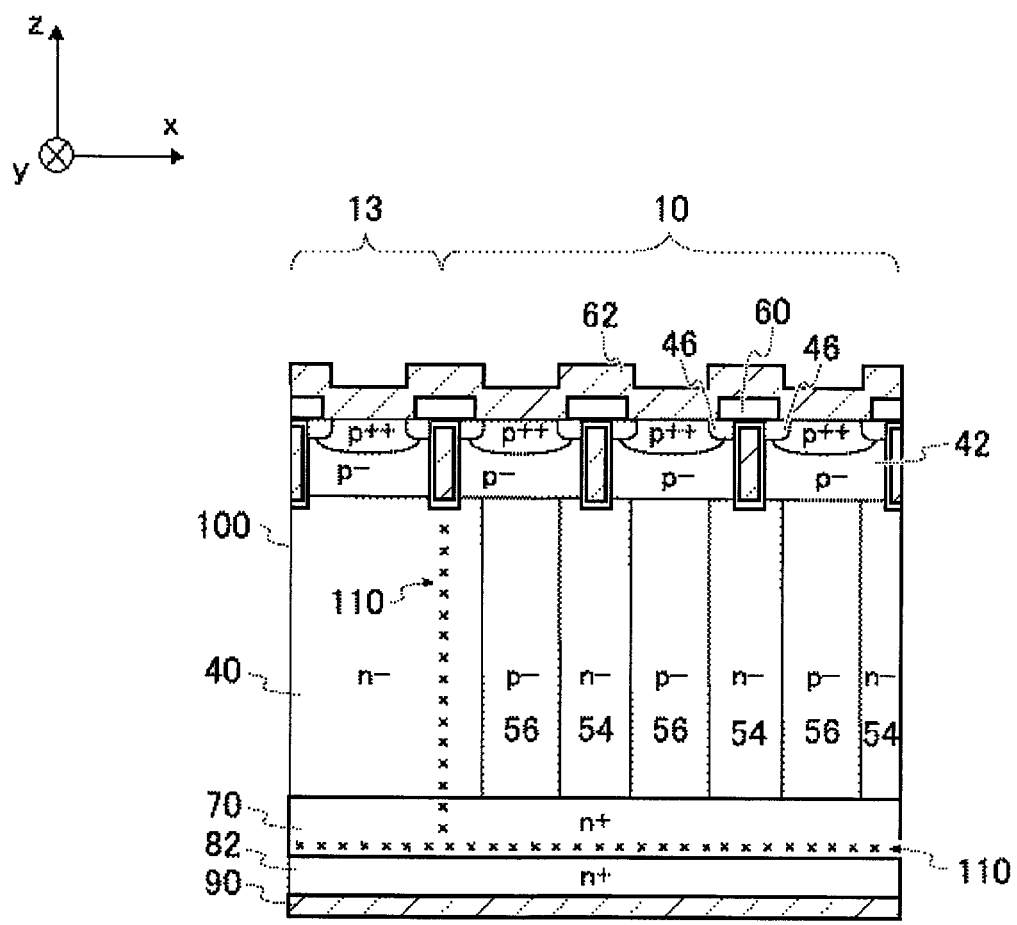
FIG. 25 shows a ninth example of an SJ-MOSFET section 10 and an FWD section 13.

FIG. 25 shows a ninth example of an SJ-MOSFET section 10 and an FWD section 13. In this example, the defect region 110 is formed by injecting the lifetime killer in the boundary between the SJ-MOSFET section 10 and the FWD section 13. This example differs from the example shown in FIG. 17 with respect to this feature.

Figure 26:
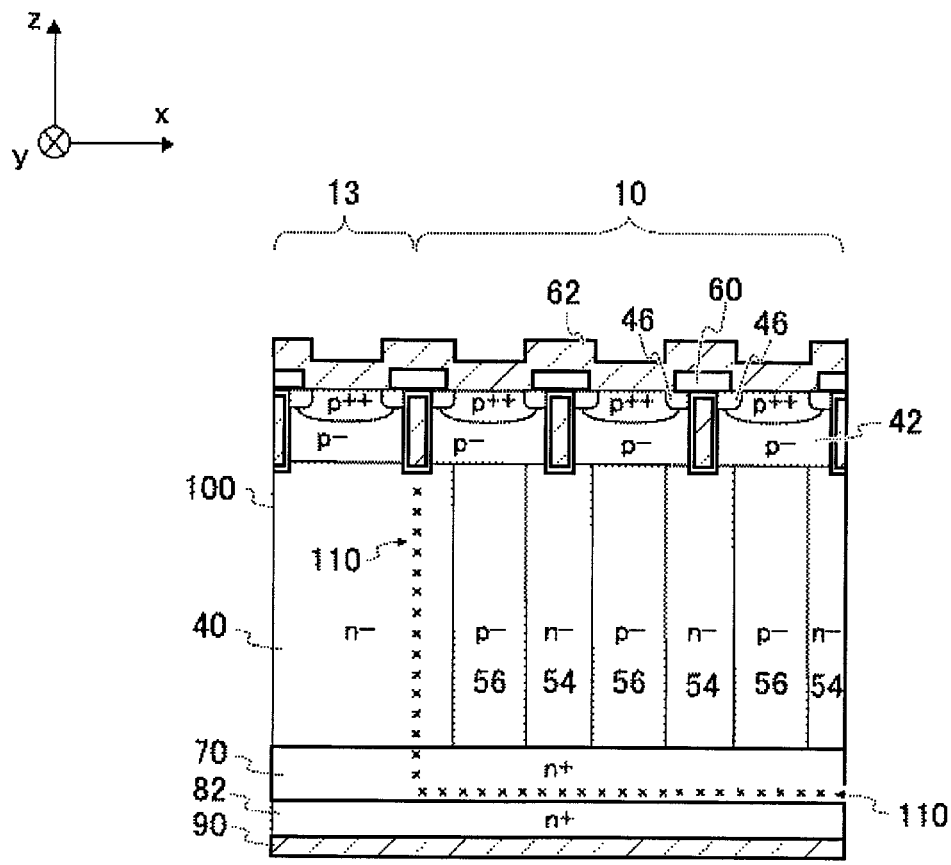
FIG. 26 shows a tenth example of an SJ-MOSFET section 10 and an FWD section 13.

FIG. 26 shows a tenth example of an SJ-MOSFET section 10 and an FWD section 13. In this example, the defect region 110 is formed by injecting the lifetime killer in the boundary between the SJ-MOSFET section 10 and the FWD section 13. This example differs from the example shown in FIG. 18 with respect to this feature.

Figure 27:
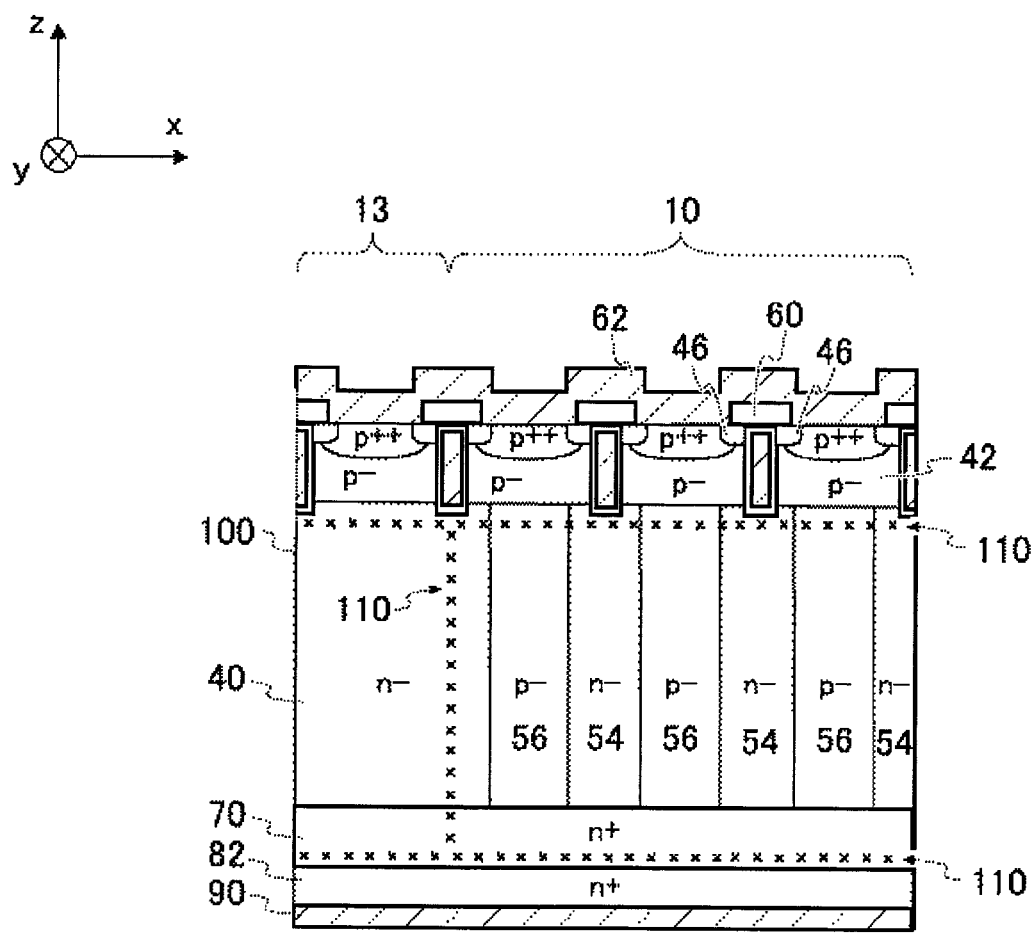
FIG. 27 shows an eleventh example of an SJ-MOSFET section 10 and an FWD section 13.

FIG. 27 shows an eleventh example of an SJ-MOSFET section 10 and an FWD section 13. In this example, the defect region 110 is formed by injecting the lifetime killer in the boundary between the SJ-MOSFET section 10 and the FWD section 13. This example differs from the example shown in FIG. 18 with respect to this feature.

Figure 28:
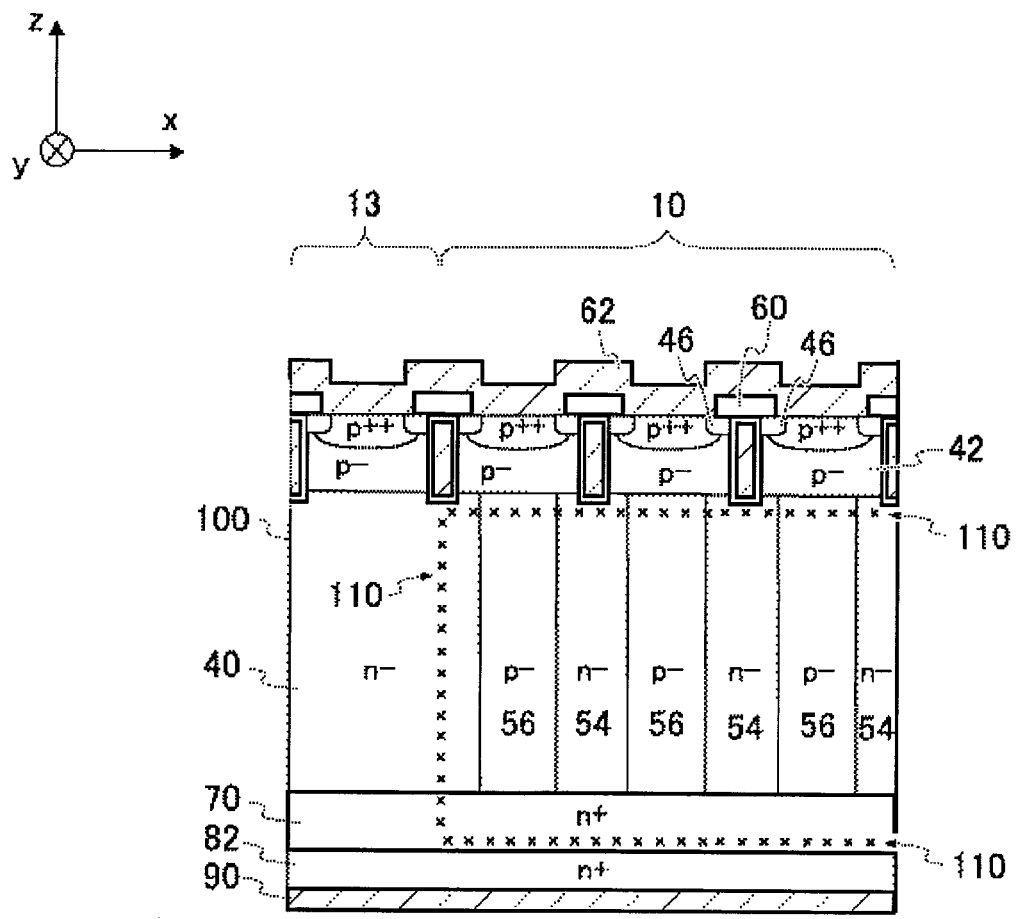
FIG. 28 shows a twelfth example of an SJ-MOSFET section 10 and an FWD section 13.

FIG. 28 shows a twelfth example of an SJ-MOSFET section 10 and an FWD section 13. In this example, the defect region 110 is formed by injecting the lifetime killer in the boundary between the SJ-MOSFET section 10 and the FWD section 13. This example differs from the example shown in FIG. 19 with respect to this feature.

Figure 29:
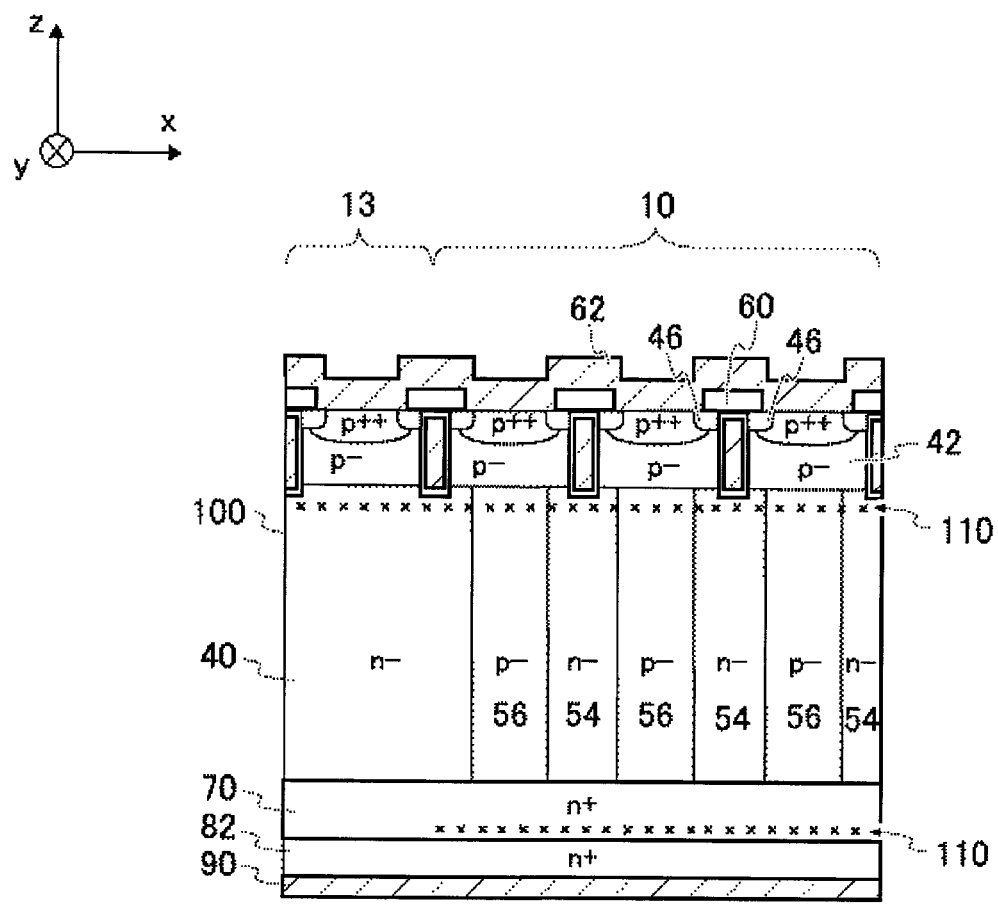
FIG. 29 shows a thirteenth example of an SJ-MOSFET section 10 and an FWD section 13.

FIG. 29 shows a thirteenth example of an SJ-MOSFET section 10 and an FWD section 13. In this example, the defect region 110 is not formed in the FS layer 70 of the FWD section 13. This example differs from the example shown in FIG. 19 with respect to this feature.

Figure 30:
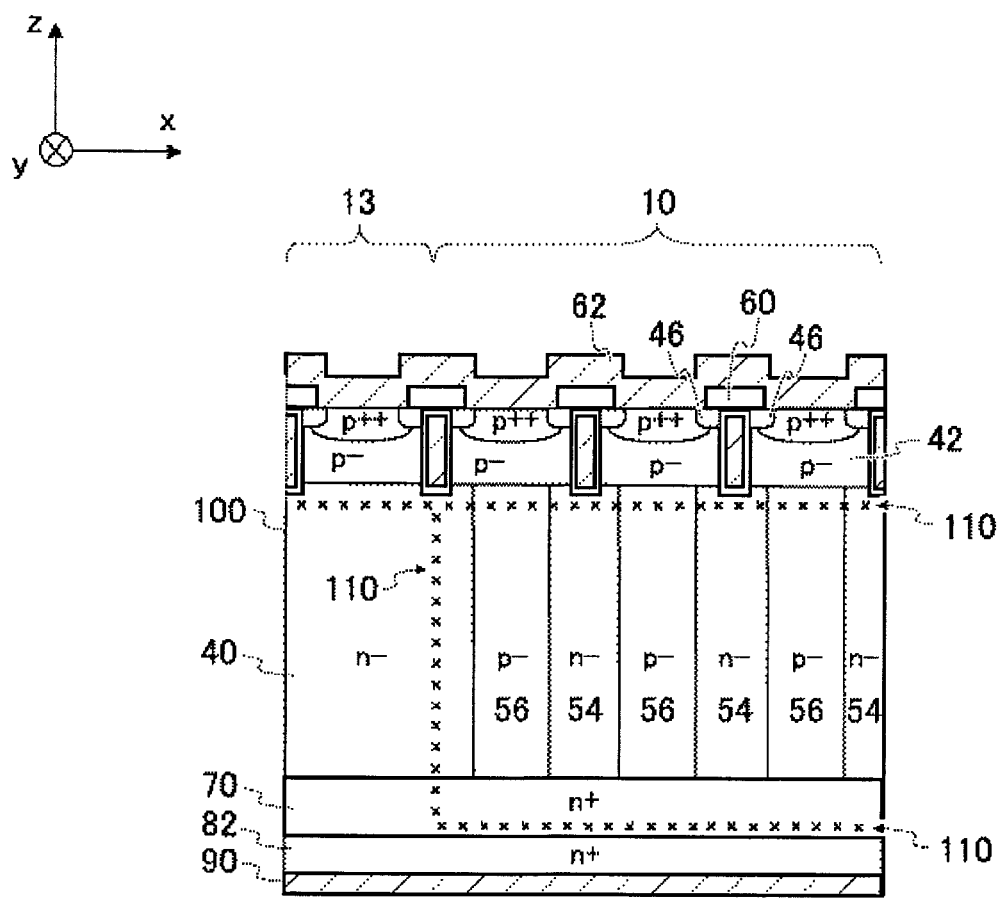
FIG. 30 shows a fourteenth example of an SJ-MOSFET section 10 and an FWD section 13.

FIG. 30 shows a fourteenth example of an SJ-MOSFET section 10 and an FWD section 13. In this example, the defect region 110 is formed by injecting the lifetime killer in the boundary between the SJ-MOSFET section 10 and the FWD section 13. This example differs from the example shown in FIG. 29 with respect to this feature.

Figure 31:
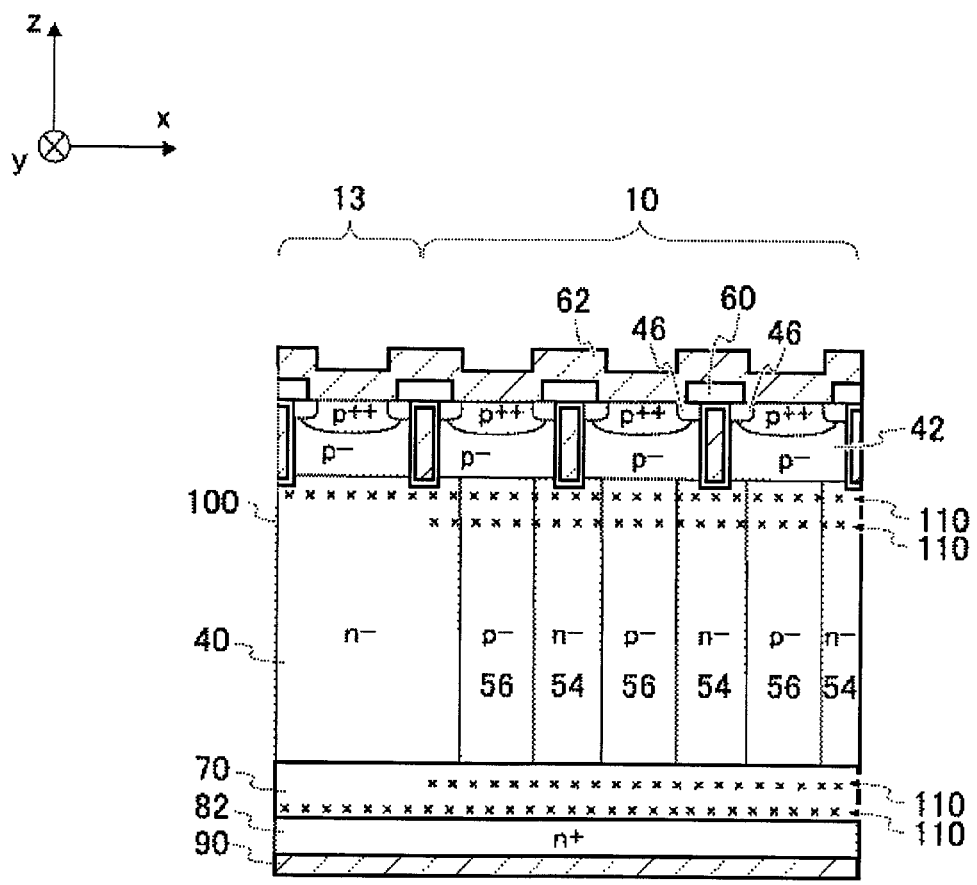
FIG. 31 shows a fifteenth example of an SJ-MOSFET section 10 and an FWD section 13.

FIG. 31 shows a fifteenth example of an SJ-MOSFET section 10 and an FWD section 13. In this example, the defect region 110 provided on the front surface sides of the n-type column 54 and the p-type column 56 extends to the back surface side, in contrast to the example shown in FIG. 19. Furthermore, in this example, the defect region 110 provided in the FS layer 70 of the SJ-MOSFET section 10 extends to the front surface side, in contrast to the example shown in FIG. 19. As a result, the soft recovery characteristic of the SJ-MOSFET section 10 can be further improved when compared to the example shown in FIG. 19.

Figure 32:
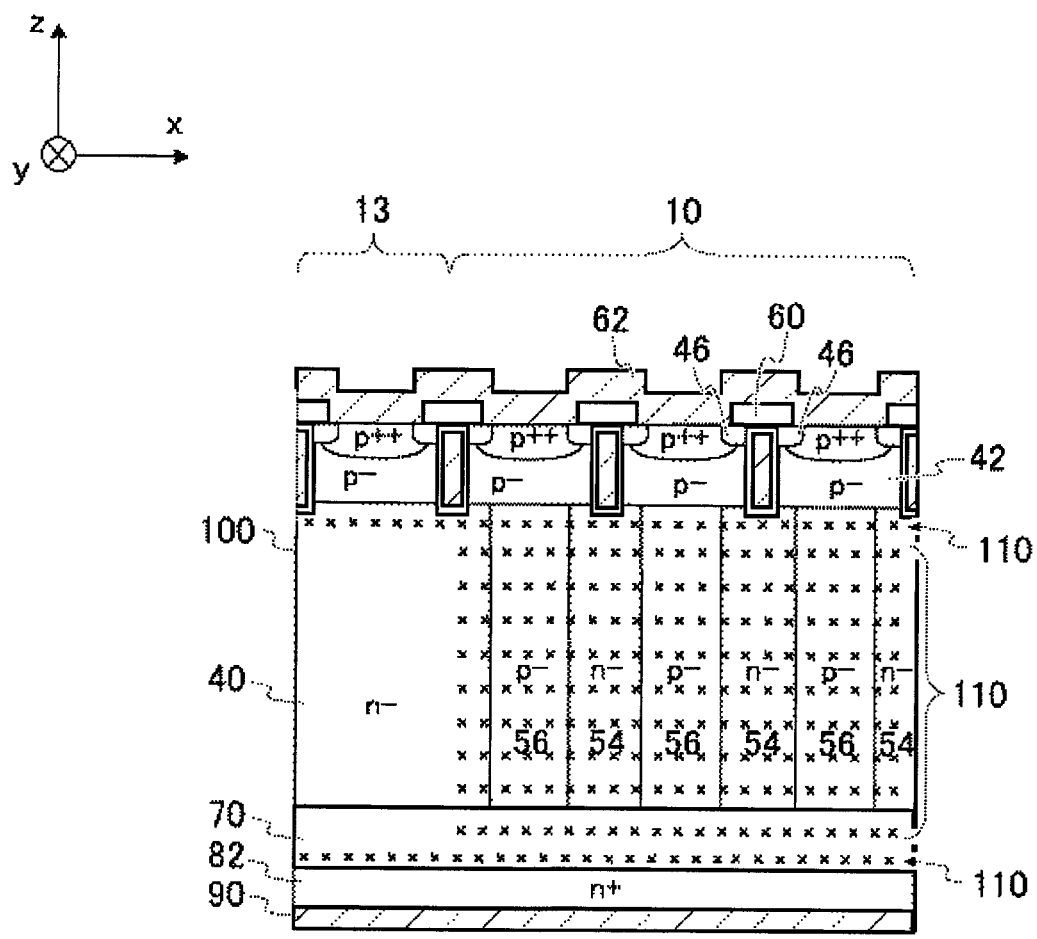
FIG. 32 shows a sixteenth example of an SJ-MOSFET section 10 and an FWD section 13.

FIG. 32 shows a sixteenth example of an SJ-MOSFET section 10 and an FWD section 13. In this example, the defect region 110 is formed by injecting the lifetime killer from the front surface sides of the n-type column 54 and the p-type column 56 in the SJ-MOSFET section 10 all the way to the FS layer 70 of the SJ-MOSFET section 10. This example differs from the example shown in FIG. 31 with respect to this feature. As a result, the soft recovery characteristic of the SJ-MOSFET section 10 can be further improved when compared to the example shown in FIG. 31.

Figure 33:
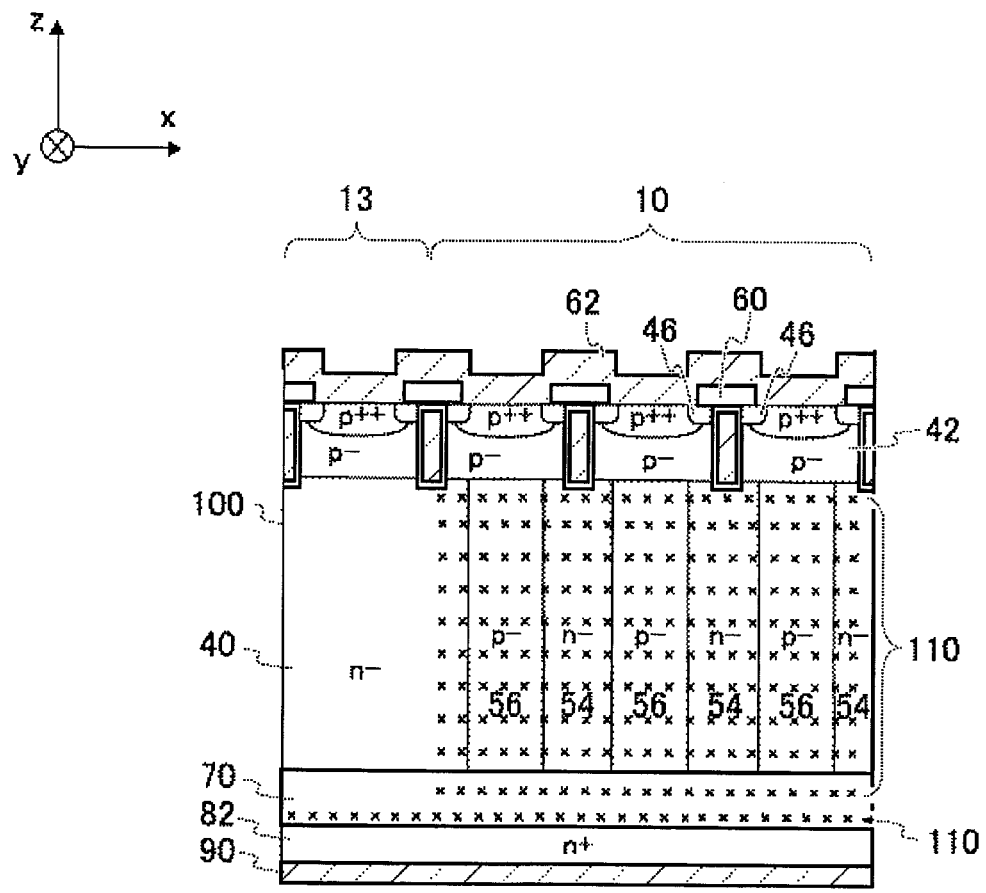
FIG. 33 shows a seventeenth example of an SJ-MOSFET section 10 and an FWD section 13.

FIG. 33 shows a seventeenth example of an SJ-MOSFET section 10 and an FWD section 13. In this example, the defect region 110 is not formed on the anode side of the drift region of the FWD section 13. This example differs from the example shown in FIG. 32 with respect to this feature.

Figure 34:
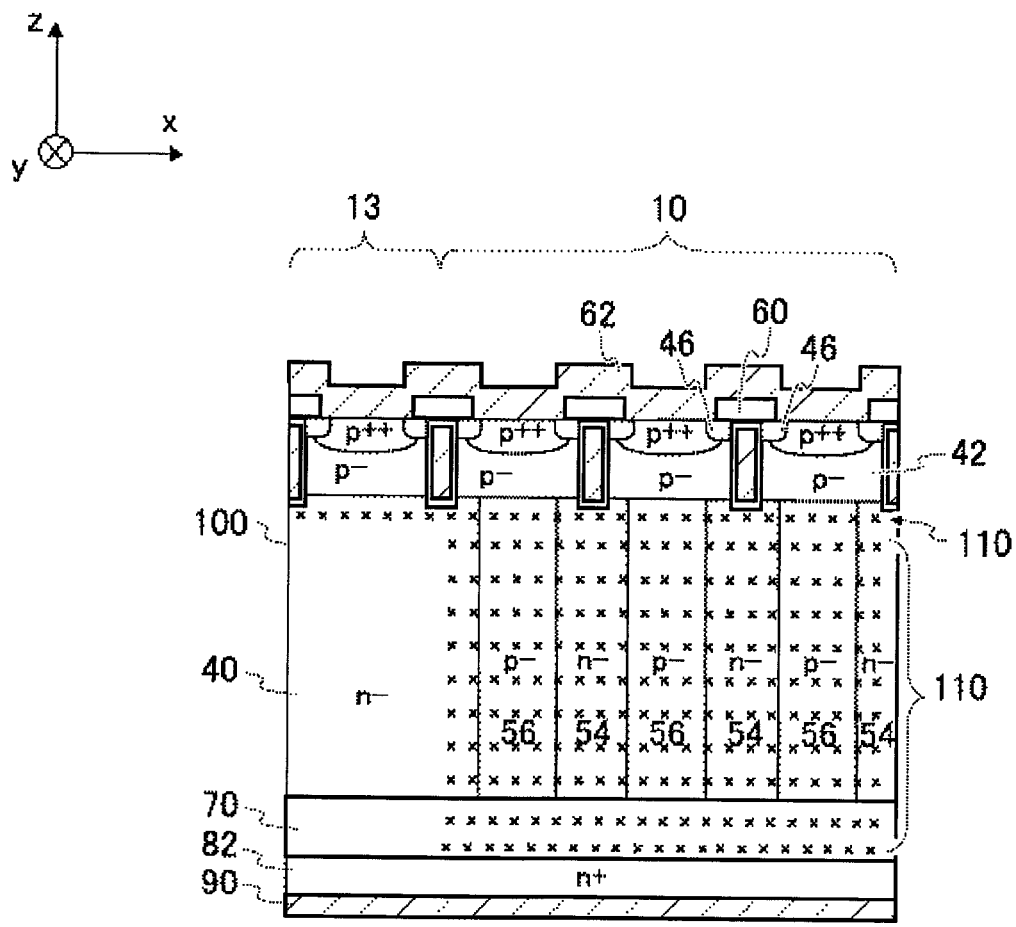
FIG. 34 shows an eighteenth example of an SJ-MOSFET section 10 and an FWD section 13.

FIG. 34 shows an eighteenth example of an SJ-MOSFET section 10 and an FWD section 13. In this example, the defect region 110 is not formed in the FS layer 70 of the FWD section 13. This example differs from the example shown in FIG. 32 with respect to this feature.

Figure 35:
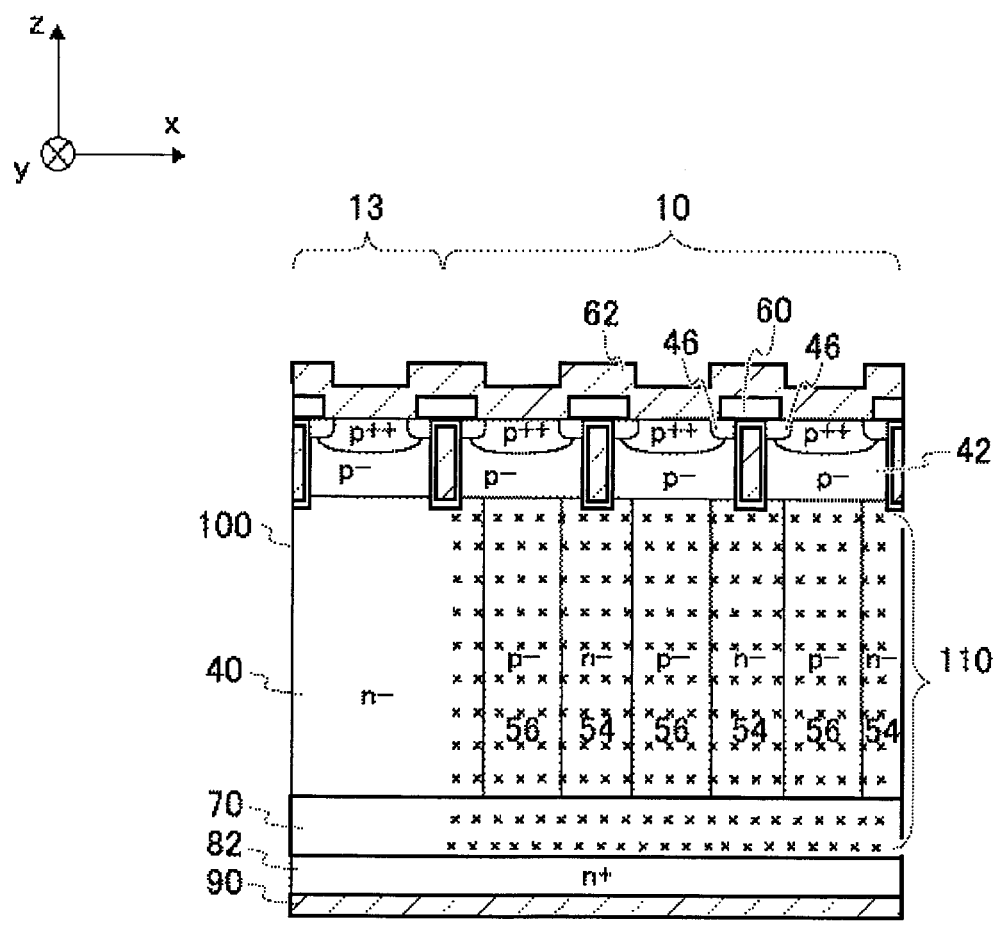
FIG. 35 shows a nineteenth example of an SJ-MOSFET section 10 and an FWD section 13.

FIG. 35 shows a nineteenth example of an SJ-MOSFET section 10 and an FWD section 13. In this example, the defect region 110 is not formed on the anode side of the drift region of the FWD section 13 and is not formed in the FS layer 70 of the FWD section 13. This example differs from the example shown in FIG. 32 with respect to this feature.

Figure 36:
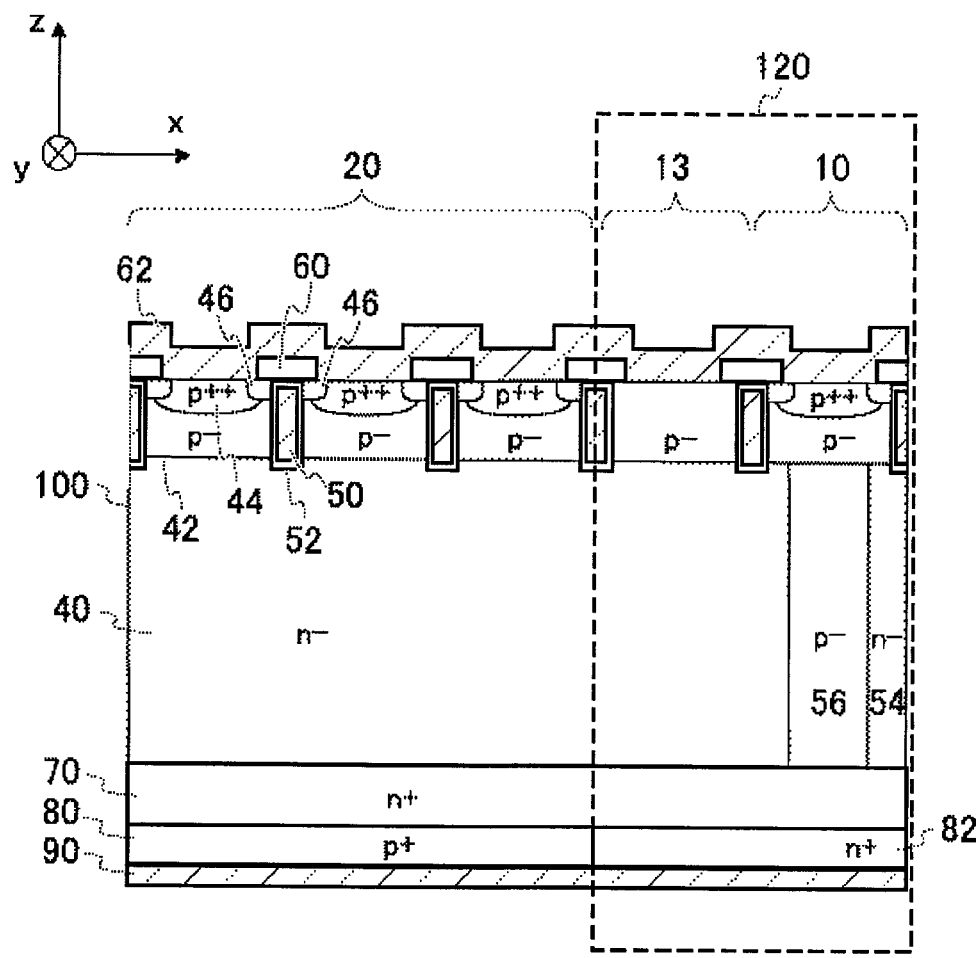
FIG. 36 shows a first example including a repeating structure section 120 having an SJ-MOSFET section 10 and an FWD section 13.

FIG. 36 shows a first example including a repeating structure section 120 in which an SJ-MOSFET section 10 and an FWD section 13 are arranged. The repeating structure section 120 is provided with the FWD sections 13 and the SJ-MOSFET sections 10 shown in FIGS. 17 to 35 arranged periodically. Repeating structure sections 120 may be provided to sandwich the IGBT sections 20. Furthermore, the repeating structure sections 120 may be provided to surround the IGBT sections 20. In this example as well, it is possible to realize a low Von characteristics using the SJ-MOSFET sections 10 and to realize a large current characteristic using the IGBT sections 20. Furthermore, it is possible to decrease the size of the semiconductor module by integrating the SJ-MOSFET sections 10, the IGBT sections 20, and the FWD sections 13 on a single semiconductor chip.

Figure 37:
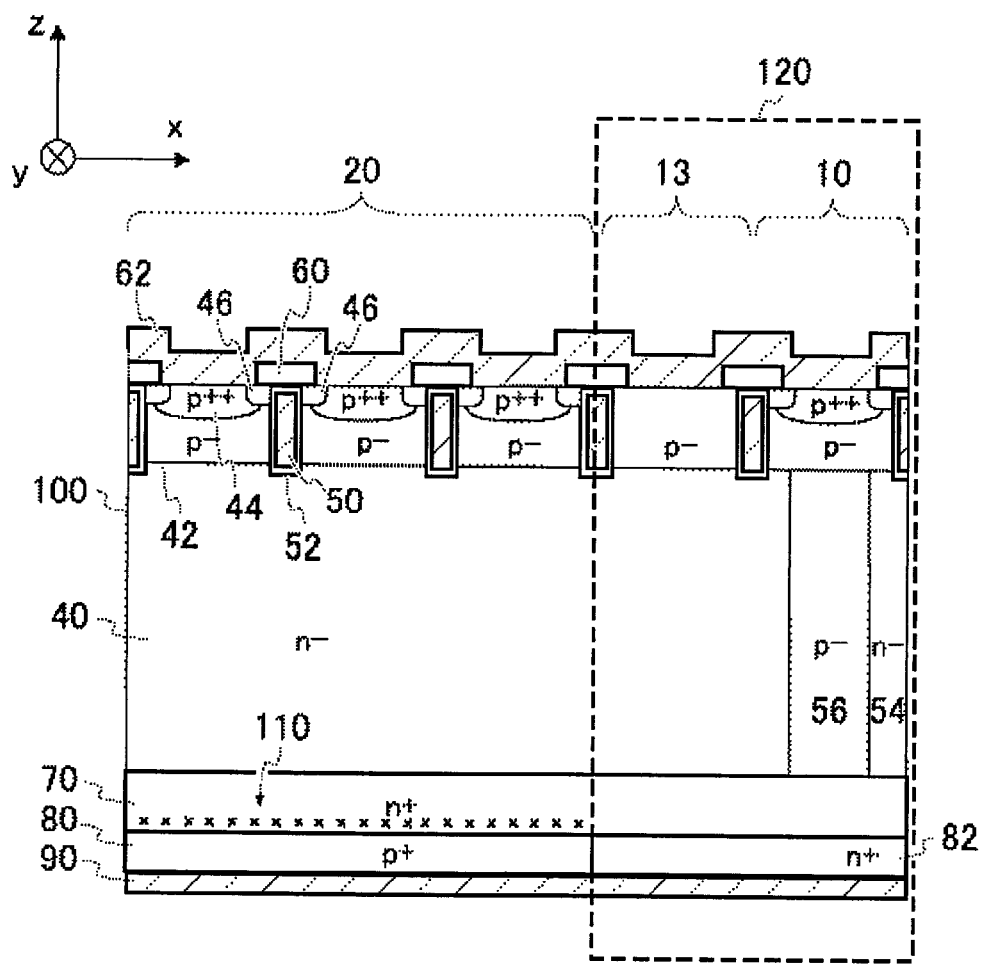
FIG. 37 shows a second example including a repeating structure section 120 having an SJ-MOSFET section 10 and an FWD section 13.

FIG. 37 shows a second example including a repeating structure section 120 in which an SJ-MOSFET section 10 and an FWD section 13 are arranged. In this example, the defect region 110 is formed by injecting the lifetime killer in the FS layer 70 of the IGBT section 20. This example differs from the example shown in FIG. 36 with respect to this feature. In this example, the defect region 110 is included in the FS layer 70 of the IGBT section 20, and therefore it is possible to restrict the injection of carriers from the back surface, thereby enabling an increase in the speed of the switching.

Figure 38:
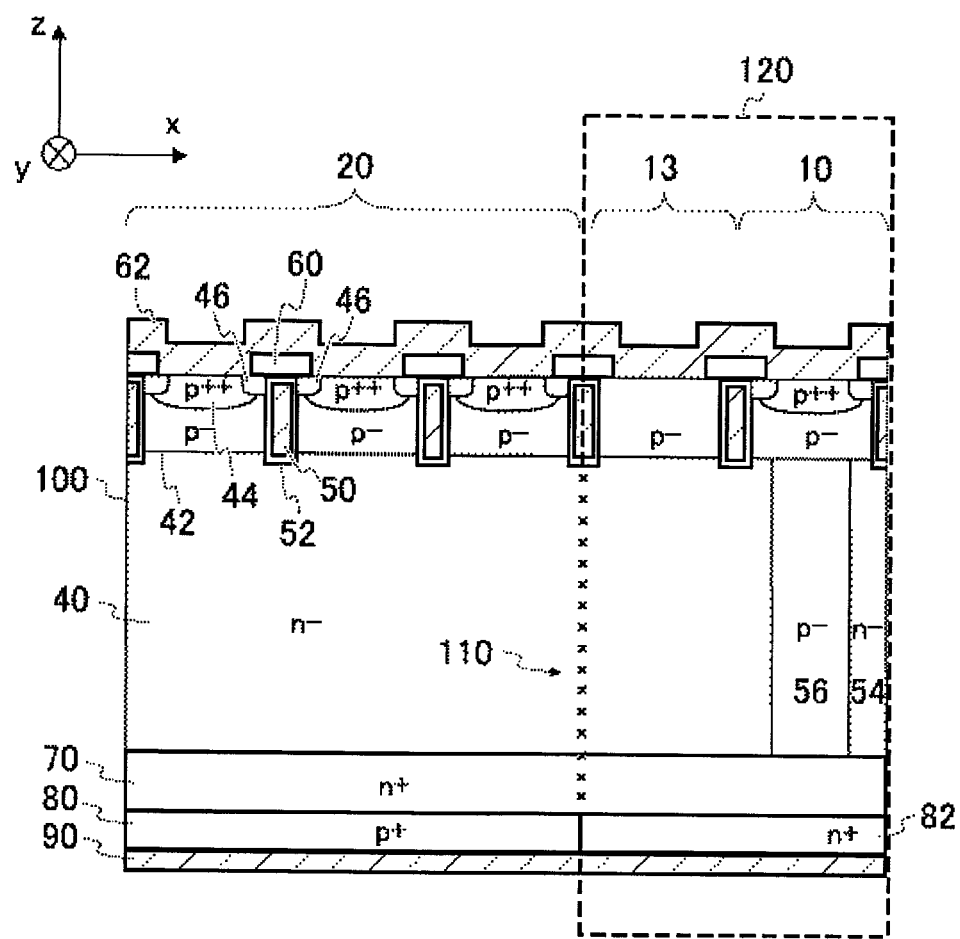
FIG. 38 shows a third example including a repeating structure section 120 having an SJ-MOSFET section 10 and an FWD section 13.

FIG. 38 shows a third example including a repeating structure section 120 in which an SJ-MOSFET section 10 and an FWD section 13 are arranged. In this example, the defect region 110 is formed by injecting the lifetime killer between the IGBT section 20 and the repeating structure section 120. This example differs from the example shown in FIG. 36 with respect to this feature. In this example, the defect region 110 is included between the IGBT section 20 and the repeating structure section 120, and therefore it is possible to restrict avalanche breakdown when the semiconductor device is turned OFF.

Figure 39:
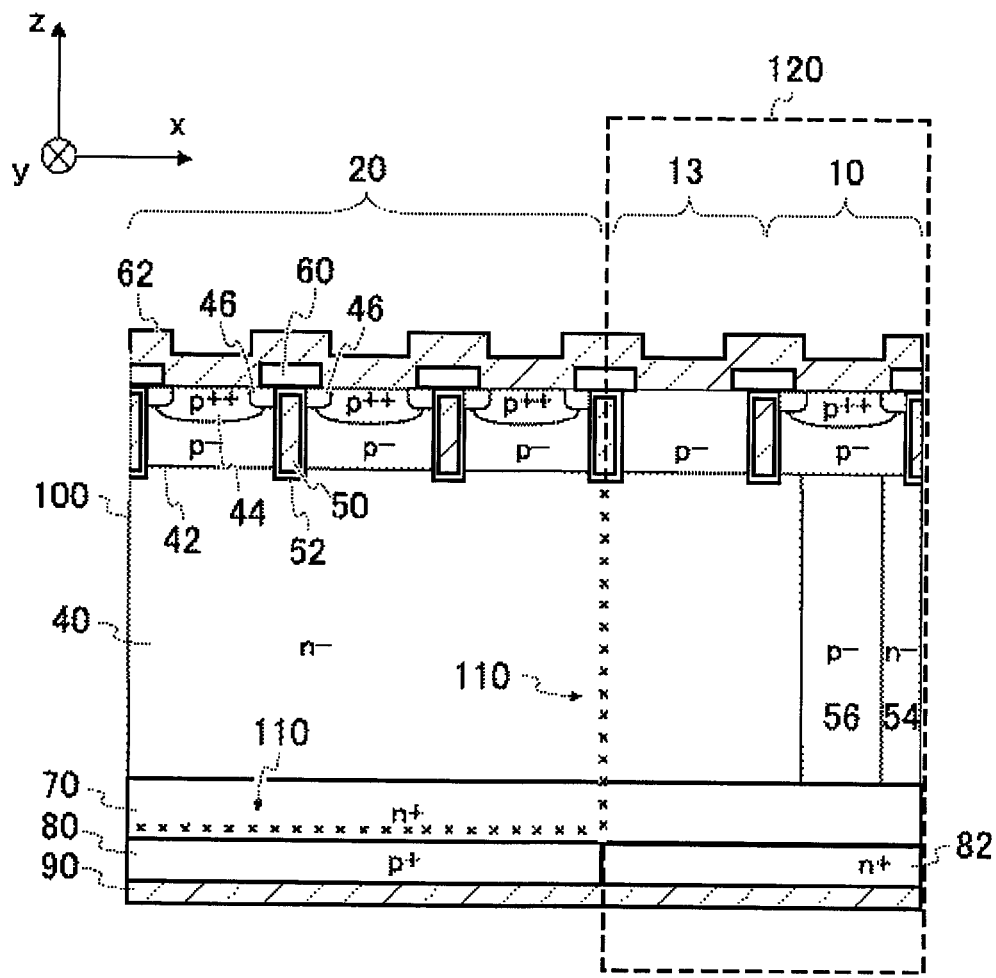
FIG. 39 shows a fourth example including a repeating structure section 120 having an SJ-MOSFET section 10 and an FWD section 13.

FIG. 39 shows a fourth example including a repeating structure section 120 in which an SJ-MOSFET section 10 and an FWD section 13 are arranged. In this example, the defect region 110 is formed by injecting the lifetime killer both between the IGBT section 20 and the repeating structure section 120 and in the FS layer 70 of the IGBT section 20. This example differs from the example shown in FIG. 36 with respect to this feature. In this example, the defect region 110 is included between the IGBT section 20 and the structure section 120, and therefore it is possible to restrict the avalanche breakdown and to increase the switching speed.

The examples shown in FIGS. 36 to 39 can be adopted in the semiconductor device 200 or the semiconductor device 300. In such a case, the pitch of the p+ collector layers 80 and the n+ drain layers 82 may be greater than or equal to 200 µm. Furthermore, the pitch of the p+ collector layers 80 and the n+ drain layers 82 may be 5 times to 1,000 times the pitch of the n-type columns 54 and the p-type columns 56 in the SJ-MOSFET section 10.

Figure 40:
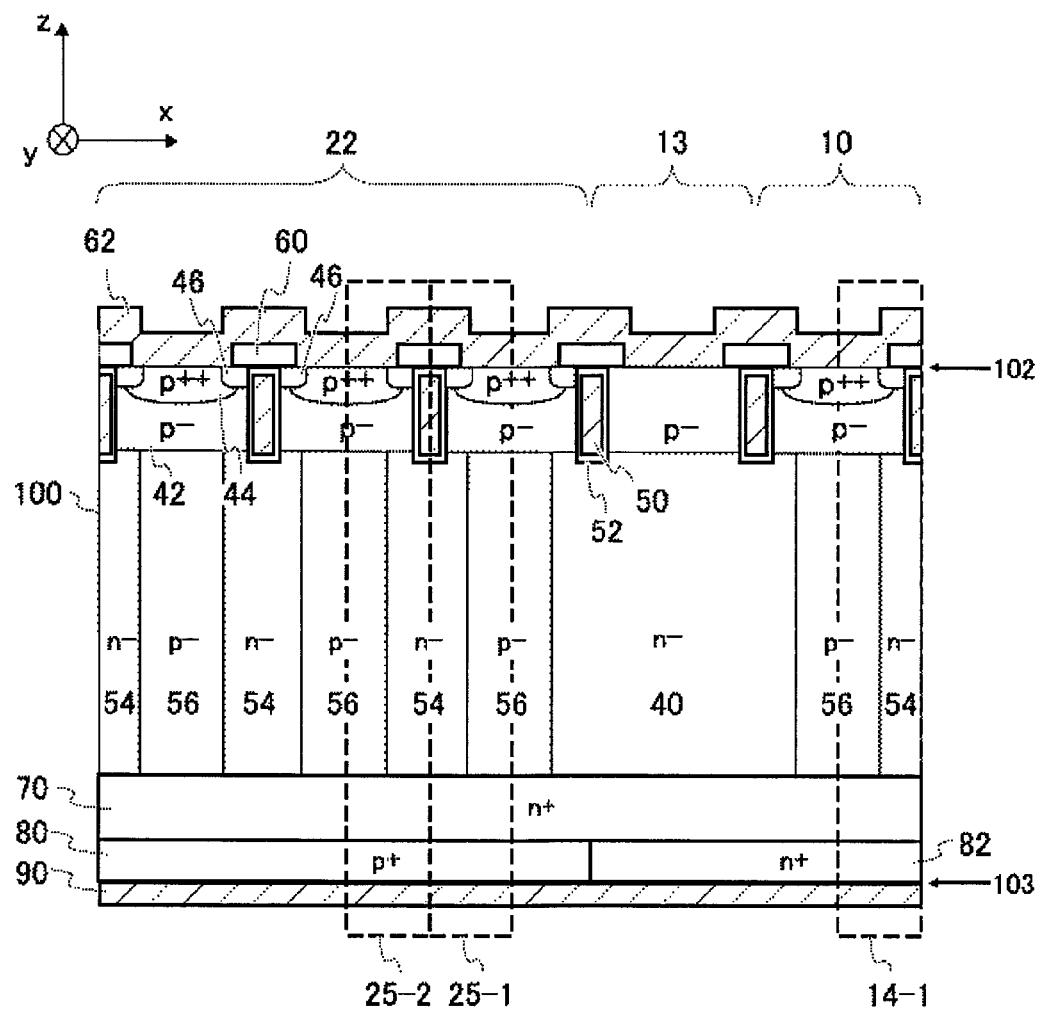
FIG. 40 shows an example in which an SJ-IGBT section 22 is provided instead of the IGBT section 20 shown in FIG. 12.

FIG. 40 shows an example in which an SJ-IGBT section 22 is provided instead of the IGBT section 20 shown in FIG. 12. The remaining configuration in this example may be the same as that of the example shown in FIG. 12. The configuration in which the lifetime killer is injected to at least one of the SJ-MOSFET section 10 and the FWD section 13 (examples shown in FIGS. 17 to 35) and the configuration of the repeating structure section 120 (examples shown in FIGS. 36 to 39) may be adopted in the present example.

The SJ-IGBT section 22 includes an IGBT region formed by super-junction transistor regions 25 that are super-junction transistors. The SJ-IGBT section 22 includes n-type columns 54 serving as first conduction type columns and p-type columns 56 serving as second conduction type columns.

The n-type columns 54 in this example have n− impurities, and the p-type columns 56 have p− impurities. In this example, in order to simplify the drawing, only two super-junction transistor regions 25-1 and 25-2 are shown in the SJ-IGBT section 22. In the SJ-IGBT section 22, the two adjacent super-junction transistor regions 25 share one n-type column 54 or one p-type column 56. In this example, the super-junction transistor regions 25-1 and 25-2 share one n-type column 54. Furthermore, the two adjacent super-junction transistor regions 25-1 and 25-2 share one gate electrode 50 and one gate insulating film 52.

In this example, the impurity concentration in the n-type columns 54 and the p-type columns 56 may be greater than or equal to 1E15 ($cm^{-3}$) and less than or equal to 1E16 ($cm^{-3}$). The n-type impurity concentration of the n-type columns 54 and the p-type impurity concentration of the p-type columns 56 may be equal to each other. However, it should be noted that the n-type and p-type impurity concentrations of each column may be changed as desired within a range of values greater than or equal to 1E14 ($cm^{-3}$) and less than or equal to 1E16 ($cm^{-3}$), in order to obtain desired values for the withstanding voltage (BV), the ON voltage (Von), and the OFF loss (Eoff), which are described further below. In this example, the n-type impurity concentration of the n-type columns 54 is set to 5E15 (cm$^{-3}$) and the p-type impurity concentration of the p-type columns 56 is set to 5E15 (cm$^{-3}$). Here, E indicates multiplication by 10 raised to a certain power. For example, 1E14 means $1\times10^{14}$.

In the manner described above, the semiconductor substrate 100 includes a front surface 102 that is the surface on the +z side and a back surface 103 that is the surface on the opposite side of the front surface 102. The collector layer 80 serving as a semiconductor layer with the second conduction type is provided on the back surface 103 side of the SJ-IGBT section 22. The collector layer 80 in this example has p+ impurities. The drain layer 82 serving as a semiconductor layer with the first conduction type is provided in a shared manner on the back surface 103 sides of the FWD section 13 and the SJ-MOSFET section 10. The drain layer 82 has n+ impurities. In the FWD section 13, the drain layer 82 functions as an n-type layer forming a pn junction.

The pitch of the p+ collector layers 80 and the n+ drain layers may be 5 times to 1,000 times the pitch of the n-type columns 54 and the p-type columns 56 in the SJ-IGBT section 22. In this example, the pitch of the p+ collector layers 80 and the n+ drain layers is greater than or equal to 200 μm, and the pitch of the n-type columns 54 and the p-type columns 56 is 3 μm.

Figure 41:
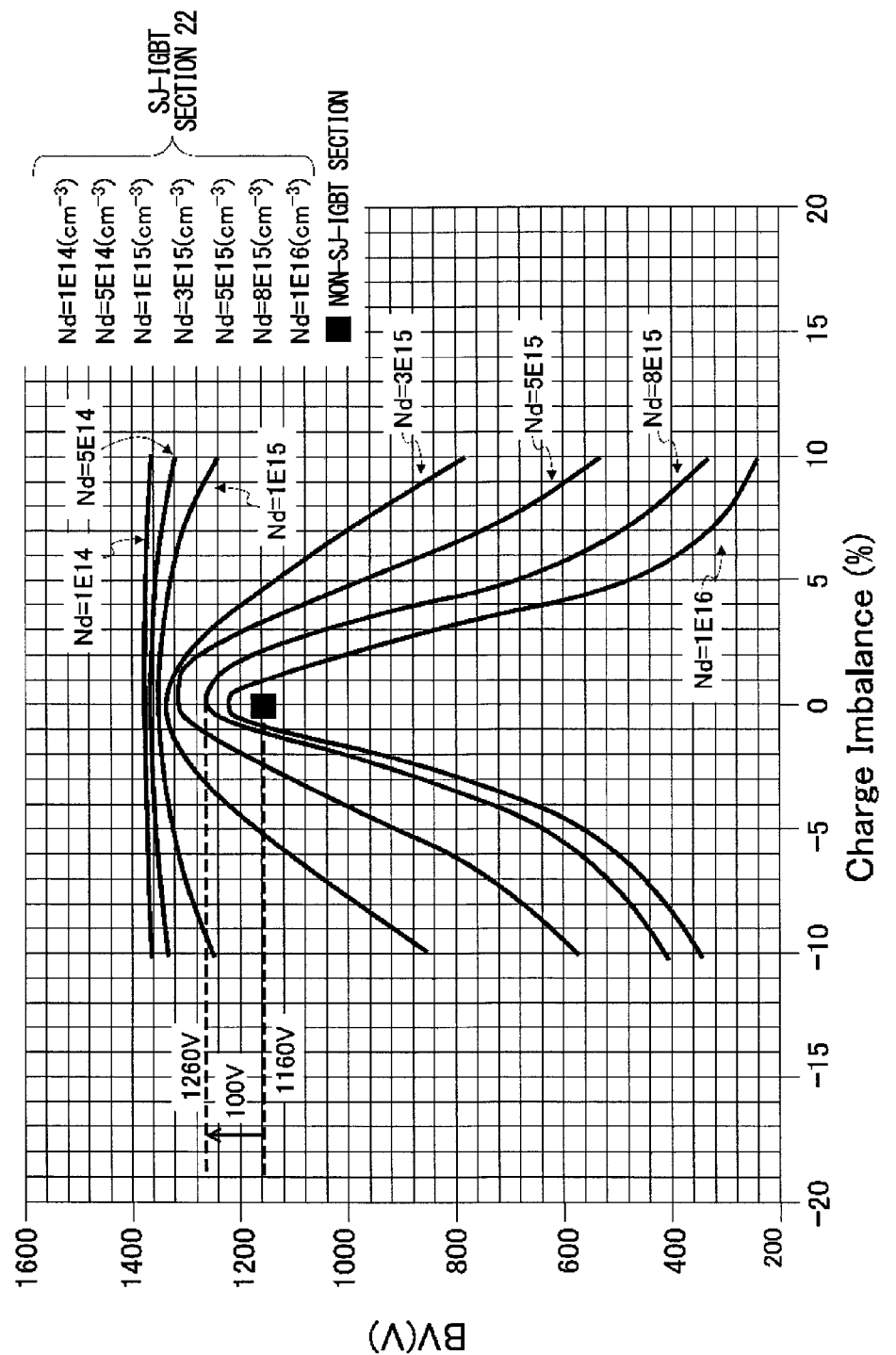
FIG. 41 shows the relationship between the charge imbalance ratio (%) and the withstanding voltage (V), in a simulation.

FIG. 41 shows the relationship between the charge imbalance ratio (%) and the withstanding voltage (V), in a simulation. The charge imbalance ratio (%) on the horizontal axis indicates the ratio of the charge imbalance between the n-type columns 54 and the p-type columns 56. When the charge imbalance is zero (%), the charge amount of the n-type columns 54 and the charge amount of the p-type columns 56 are the same. In this case, the n-type impurity concentration of the n-type columns 54 and the p-type impurity concentration of the p-type columns 56 are equal to each other. When the charge imbalance is negative (%), the charge amount of the n-type columns 54 is greater than the charge amount of the p-type columns 56. When the charge imbalance is positive (%), the charge amount of the n-type columns 54 is less than the charge amount of the p-type columns 56.

The withstanding voltage (V) on the vertical axis is the withstanding voltage of the semiconductor device 200, 300, or 400. In this example, the result of a non-SJ-IGBT section is only one point, and the withstand voltage is 1160 (V) when the charge imbalance ratio is zero (%). A non-SJ-IGBT section corresponds to the IGBT section 20 shown in FIG. 12, where the IGBT region 24 is not a super-junction transistor. Using the doping concentration (Nd) of n-type impurities in the n-type column 54 as a parameter, a plurality of curves indicating the withstanding voltage of the SJ-IGBT section 22 obtained by plotting the charge imbalance ratio at several positive and negative points are shown. In each of the following examples, the n-type impurity concentration of the n-type columns 54 and the p-type impurity concentration of the p-type columns 56 are equal to each other.

As made clear from FIG. 41, the curve of the withstanding voltage of the SJ-IGBT section 22 is at a maximum when the charge imbalance ratio is zero (%). This is because the depletion layer widens most easily between the n-type columns 54 and the p-type columns 56 when the charge imbalance ratio is zero (%). Furthermore, the withstanding voltage is greater when the doping concentration (Nd) is lower. This is because the depletion layer widens more easily when the doping concentration (Nd) is low. The non-SJ-IGBT section includes an n-type drift layer 40 doped with the n-type impurities but does not include a p-type column 56. Therefore, the non-SJ-IGBT section is plotted at the position where the charge imbalance ratio is zero (%).

In this example, the withstanding voltage of the non-SJ-IGBT section is 1160 (V). Furthermore, the withstanding voltage occurring when Nd=8E15 (cm$^{-3}$) and the charge imbalance ratio is zero (%) is 1260 (V). In this way, there is a difference of 100 (V) in the withstanding voltage between a case in which a non-SJ-IGBT section is included and a case in which an SJ-IGBT section 22 is included.

Figure 42:
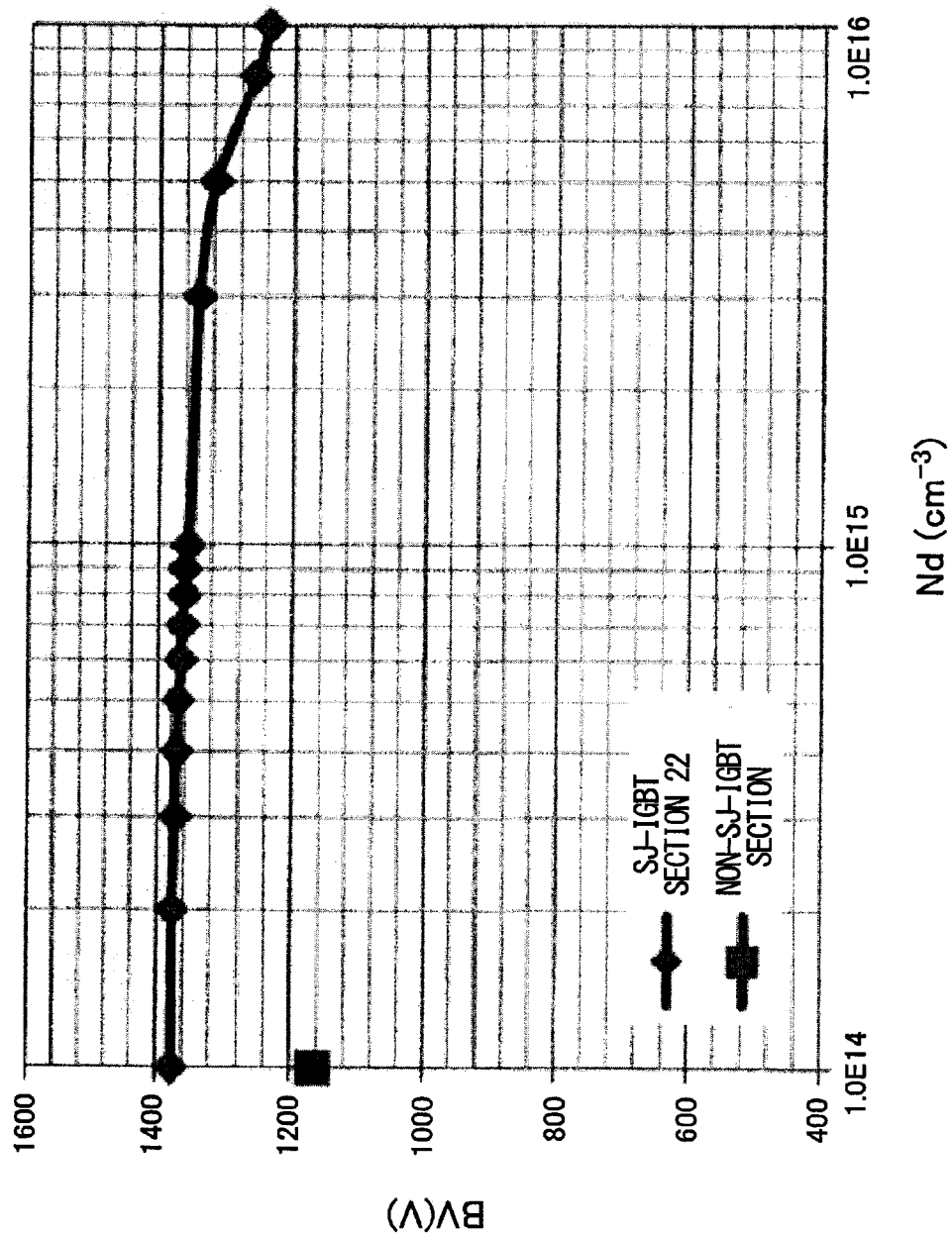
FIG. 42 shows the relationship between the doping concentration ($cm^{-3}$) and the withstanding voltage (V), in a simulation.

FIG. 42 shows the relationship between the doping concentration (cm$^{-3}$) and the withstanding voltage (V), in a simulation. The Nd (cm$^{-3}$) value on the horizontal axis indicates the doping concentration (cm$^{-3}$). The withstanding voltage (V) on the vertical axis indicates the withstanding voltage of the semiconductor device 200, 300, or 400.

The n-type drift layer 40 of the non-SJ-IGBT section in this example has an n-type impurity concentration of 1.0E14. The impurity concentrations of the n-type columns 54 and the p-type columns 56 of the SJ-IGBT section 22 are plotted at 14 points between 1.0E14 and 1.0E16. As made clear from FIGS. 41 and 42, by adopting the SJ-IGBT section 22, it is possible to improve the withstanding voltage of the semiconductor device compared to a case in which the IGBT section 20 is a non-SJ-IGBT section.

Figure 43:
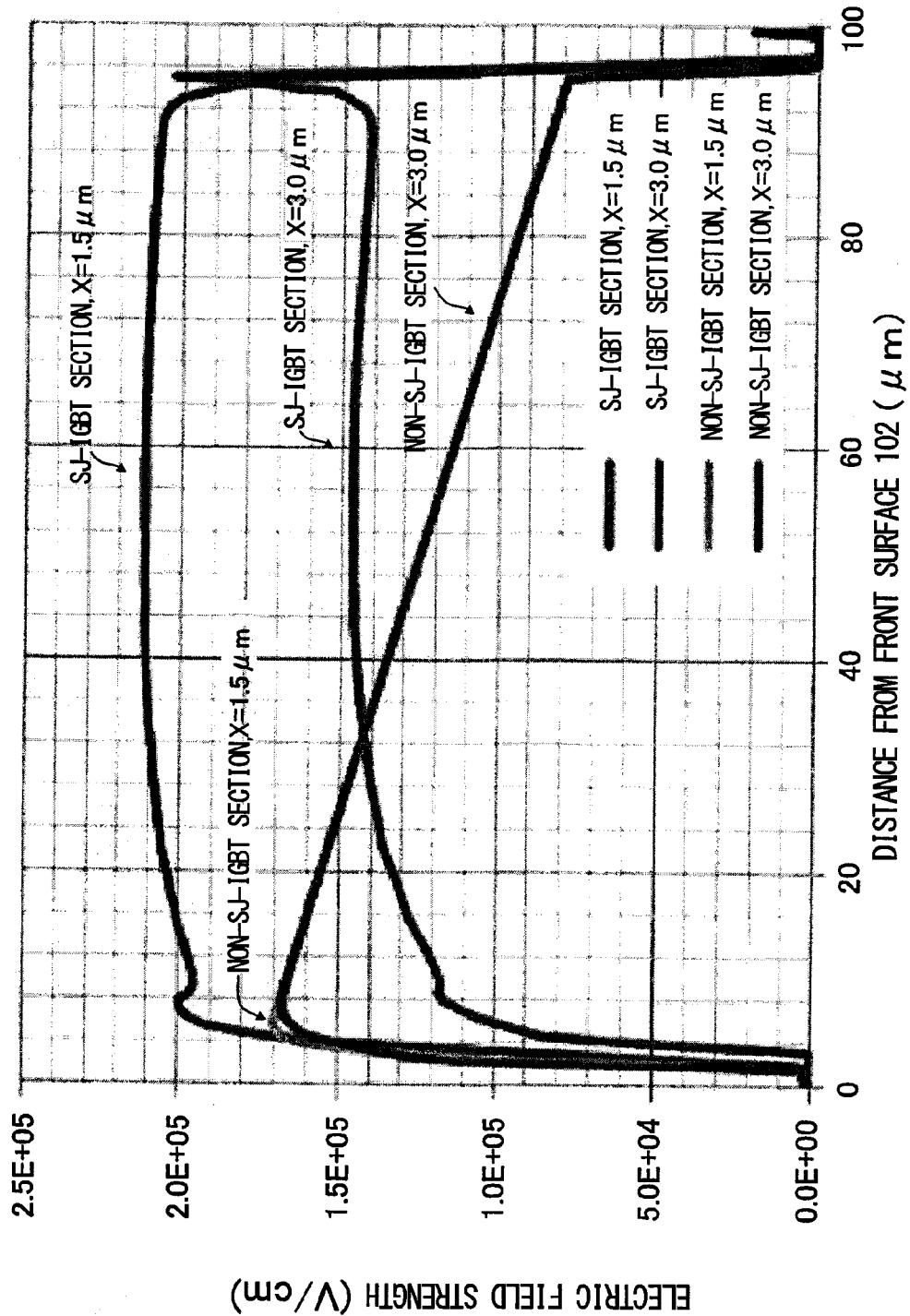

FIG. 43 shows the relationship between the distance (μm) from the front surface 102 and the electric field strength (V/cm) when the gate is ON. The distance (μm) from the front surface 102 on the horizontal axis has a value of zero (μm) at the front surface 102 of the semiconductor substrate 100 and a value of 100 (μm) at the back surface 103. In other words, the thickness of the semiconductor substrate 100 in this example is 100 (μm). The vertical axis indicates the electric field strength (V/cm).

In the super-junction transistor region 25 of the SJ-IGBT section 22, X indicates the pitch of the n-type columns 54 and the p-type columns 56. When X=1.5 (μm), the pitch of the super-junction transistor regions 25 is 1.5×2=3.0 (μm), and when X=3.0 (μm), the pitch of the super-junction transistor regions 25 is 3.0×2=6.0 (μm). There is no pitch for columns in the non-SJ-IGBT section. Therefore, the width of the n-type drift layer 40 in the x direction was set to X=3.0 (μm) or X=6.0 (μm). The trench depth of the gate electrode 50 was set to 3.5 (μm) for both the non-SJ-IGBT section and the SJ-IGBT section 22.

In the example of the non-SJ-IGBT section, the electric field is strongest at the bottom portion of the gate electrode 50, i.e. near a depth of 3.5 (μm), and the electric field strength decreases linearly in a direction toward the back surface 103 from the bottom surface of the gate electrode 50. In other words, in the non-SJ-IGBT section, there is a possibility that the bottom portion of the gate electrode 50 will break down due to the electric field being focused there. In contrast to this, in the example of the SJ-IGBT section 22, the electric field strength is approximately constant from the bottom portion of the gate electrode 50 to the back surface 103. Based on this result as well, by adopting the SJ-IGBT section 22 it is possible to increase the withstanding voltage of the semiconductor device when compared to a case in which the IGBT section 20 is a non-SJ-IGBT section. The pn junctions are formed more closely when the pitch of the n-type columns 54 and the p-type columns 56 is smaller, and therefore it is easy for the depletion layer to widen. Therefore, in the SJ-IGBT section 22, the electric field can be made stronger in a case where X=1.5 (μm) than in a case where X=3.0 (μm).

Figure 44:
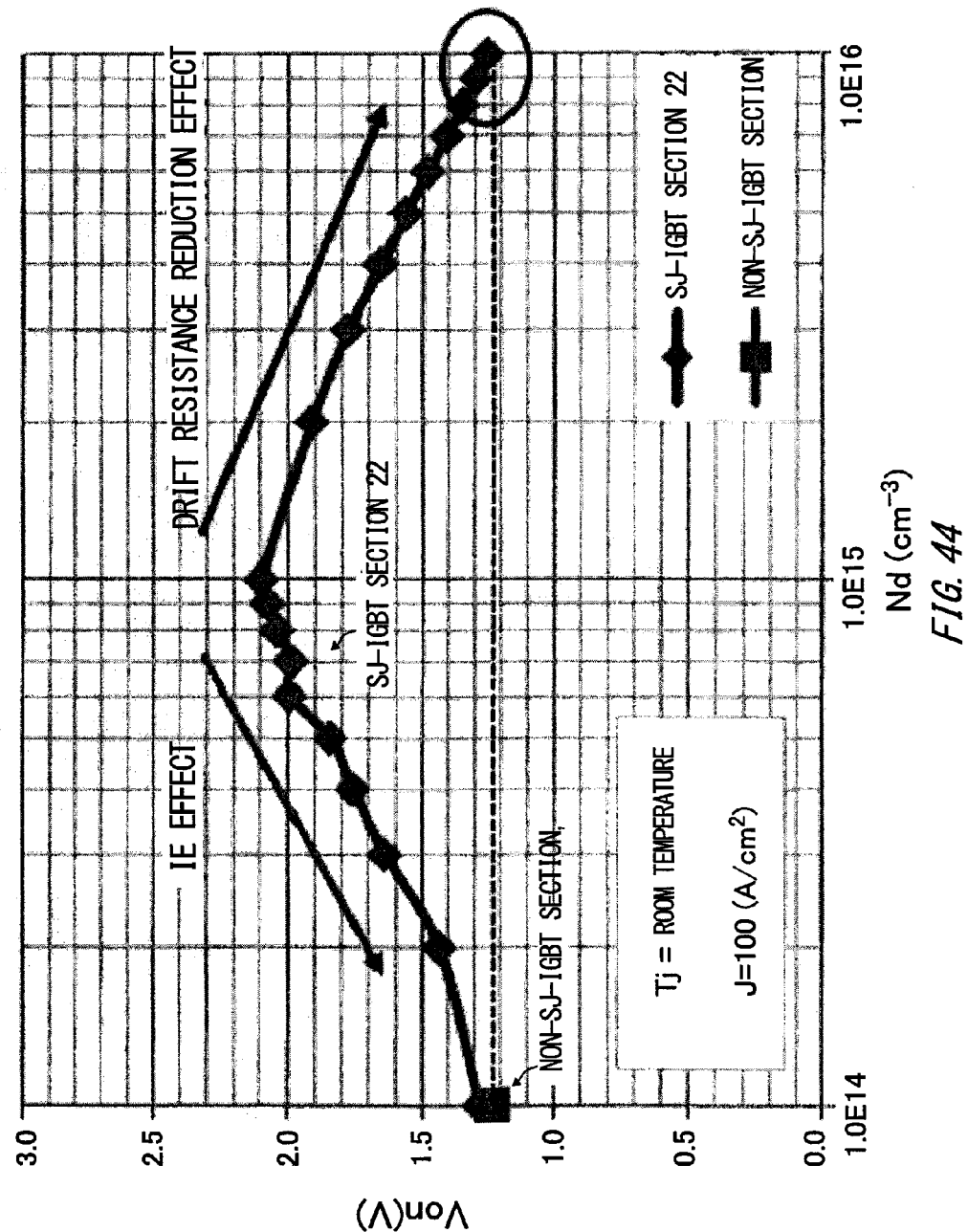
FIG. 44 shows the relationship between the doping concentration ($cm^{-3}$) and the ON voltage (Von), in a simulation.

FIG. 44 shows the relationship between the doping concentration ($cm^{-3}$) and the ON voltage (Von), in a simulation. The doping concentration (Nd) on the horizontal axis is the same as in the examples shown in FIGS. 41 and 42. The ON voltage (Von) on the vertical axis is the voltage (V) applied to the gate electrode 50 that is needed in a case where a current of 100 ($A/cm^{-2}$) is to flow from the back surface electrode 90 of the semiconductor device to the front surface electrode 62.

In this example, the non-SJ-IGBT section is only one point, Nd is 1.0E14 ($cm^{-3}$), and Von is approximately 1.2 (V). In the SJ-IGBT section 22, when Nd is in a range of values greater than or equal to 1.0E14 ($cm^{-3}$) and less than or equal to 1.0E15 ($cm^{-3}$), Von exhibits an increasing trend. When Nd is in a range of values greater than or equal to 1.0E15 ($cm^{-3}$) and less than or equal to 1.0E16 ($cm^{-3}$), Von exhibits a decreasing trend.

In the SJ-IGBT section 22, the decrease of Von over the Nd values from 1.0E15 ($cm^{-3}$) to 1.0E14 ($cm^{-3}$) is due to the injection enhancement (IE) effect that accompanies adjacent columns changing to lower density. Furthermore, the decrease of Von over the Nd values from 1.0E15 ($cm^{-3}$) to 1.0E16 ($cm^{-3}$) is also due to the effect of reduced drift resistance in the n-type columns 54. In general, Von is higher when the withstanding voltage is higher, but as made clear from FIG. 44, even when the SJ-IGBT section 22 is adopted, it is possible to maintain Von at approximately the same value as in a semiconductor device that has the non-SJ-IGBT section. In this example, the maximum Von (when Nd=1.0E15) of the SJ-IGBT section 22 is approximately 2.1 (V), and this is less than or equal to twice the Von of the SJ-IGBT section.

Figure 45:
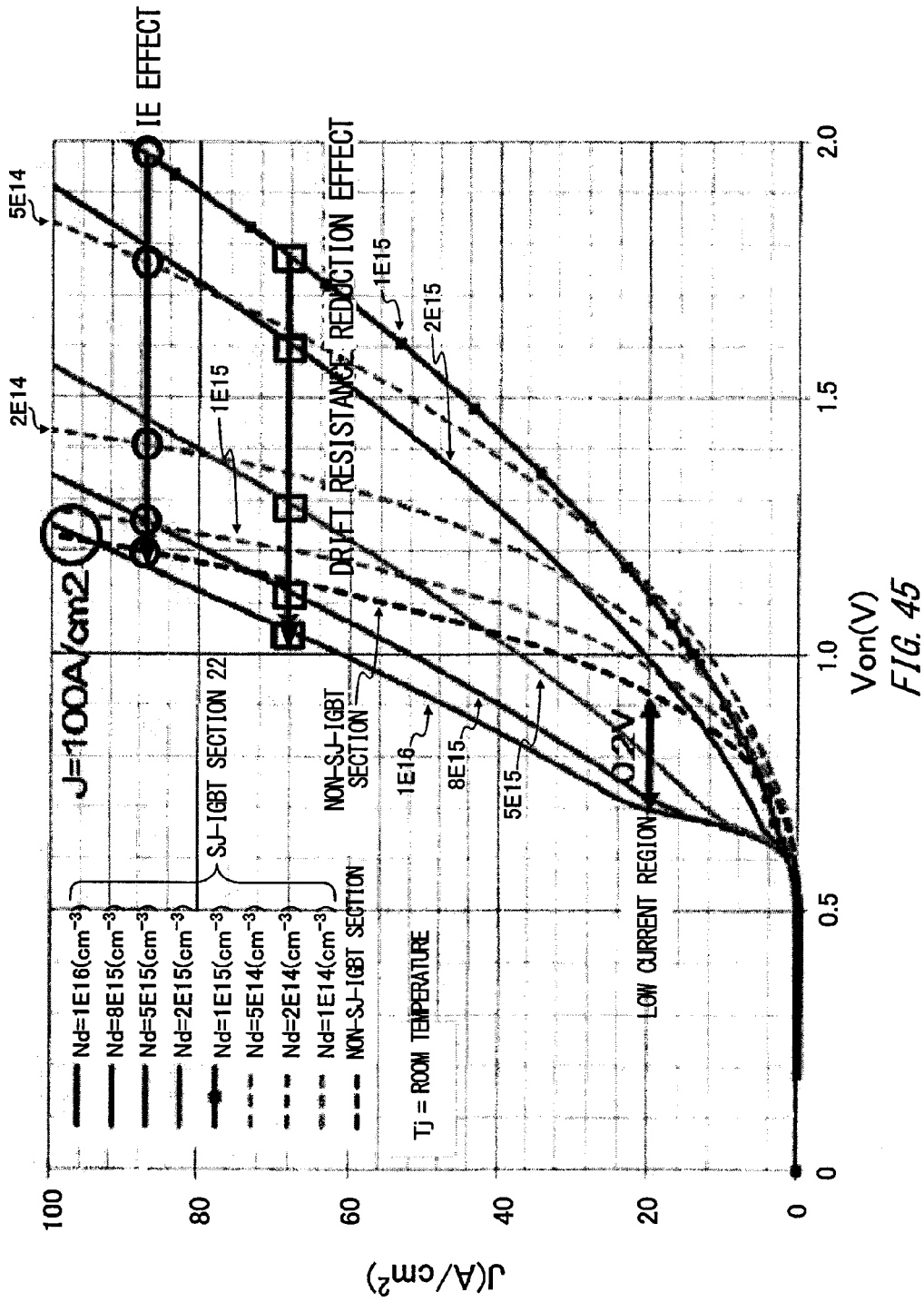
FIG. 45 shows the relationship between the ON voltage (V) and the current density ($A/cm^2$), in a simulation.

FIG. 45 shows the relationship between the ON voltage (V) and the current density ($A/cm^2$), in a simulation. The ON voltage (Von) on the horizontal axis is the same as in the example shown in FIG. 45. The current density ($A/cm^2$) on the vertical axis is the same as the example shown in FIG. 44. In this example, the concentration Nd of the n-type drift layer 40 of the non-SJ-IGBT section is set to 6.6E13 ($cm^{-3}$).

As made clear from FIG. 45, in the SJ-IGBT section 22 and the non-SJ-IGBT section, current begins to flow at approximately 0.6 (V). In other words, the SJ-IGBT section 22 and the non-SJ-IGBT section can obtain approximately the same Von. When comparing the non-SJ-IGBT section to the Nd=1E16 value obtained when J=20 ($A/cm^2$), an improvement of 0.2 V is realized for Von. Furthermore, the IE effect and drift resistance reduction effect realized in the example of FIG. 44 are also confirmed for this example.

Figure 46:
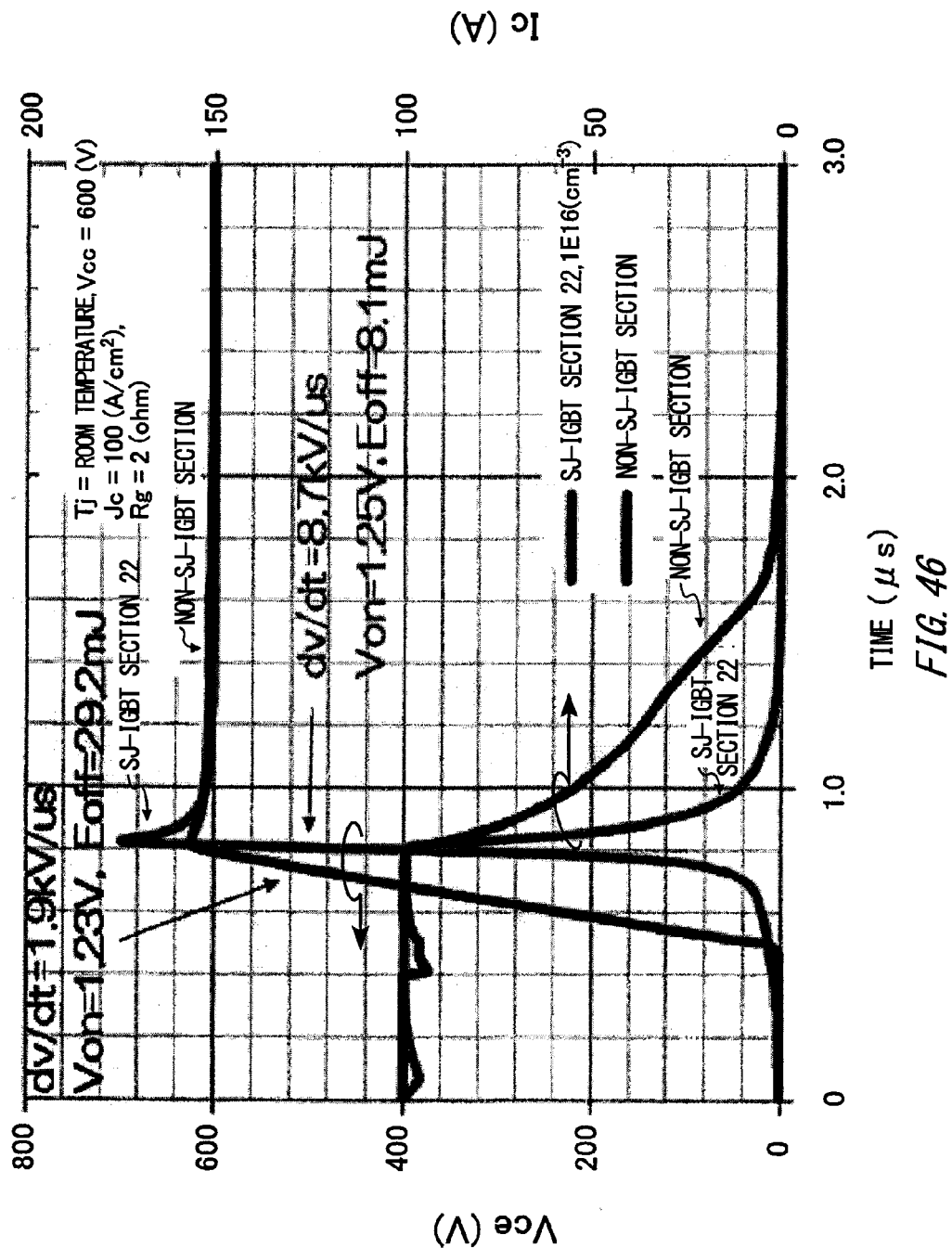
FIG. 46 shows the relationship between the time (μs) and the collector-emitter voltage (V) and collector current (A), in a simulation.

FIG. 46 shows the relationship between the time (μs) and the collector-emitter voltage (V) and collector current (A), in a simulation. The horizontal axis indicates the time (p), the vertical axis on the left side indicates the collector-emitter voltage Vice (V), and the vertical axis on the right side indicates the collector current Ic (A). In this example, results are shown of a comparison between cases where a semiconductor device having an SJ-IGBT section 22 for which Nd=1E16 ($cm^{-3}$) and a semiconductor device having a non-SJ-IGBT section for which Nd=6.6E13 ($cm^{-3}$) are turned OFF at the same time of 0 (μs).

As made clear from FIG. 46, despite being turned OFF at the same time, The Ic of the SJ-IGBT section 22 decreases more quickly than the Ic of the non-SJ-IGBT section. As a result, the SJ-IGBT section 22 has less OFF loss (Eoff) than the non-SJ-IGBT section. In this example, the OFF loss of the SJ-IGBT section 22 was 8.1 (mJ) and the OFF loss of the non-SJ-IGBT section was 29.2 (mJ). In other words, the OFF loss of the SJ-IGBT section 22 was approximately one quarter of the OFF loss of the non-SJ-IGBT section. In this way, the SJ-IGBT section 22 can decrease the OFF loss more than the non-SJ-IGBT section. For dV/dt, the SJ-IGBT section 22 had a value of 8.7 (kV/μs) and the non-SJ-IGBT section had a value of 1.9 (kV/μs). In other words, the dV/dt value of the SJ-IGBT section 22 was approximately four times that of the non-SJ-IGBT section. By increasing Dv/dt, it is possible to increase the speed of the carrier sweep out. As a result, an effect is realized that enables a decrease in the turn OFF loss.

Figure 47:
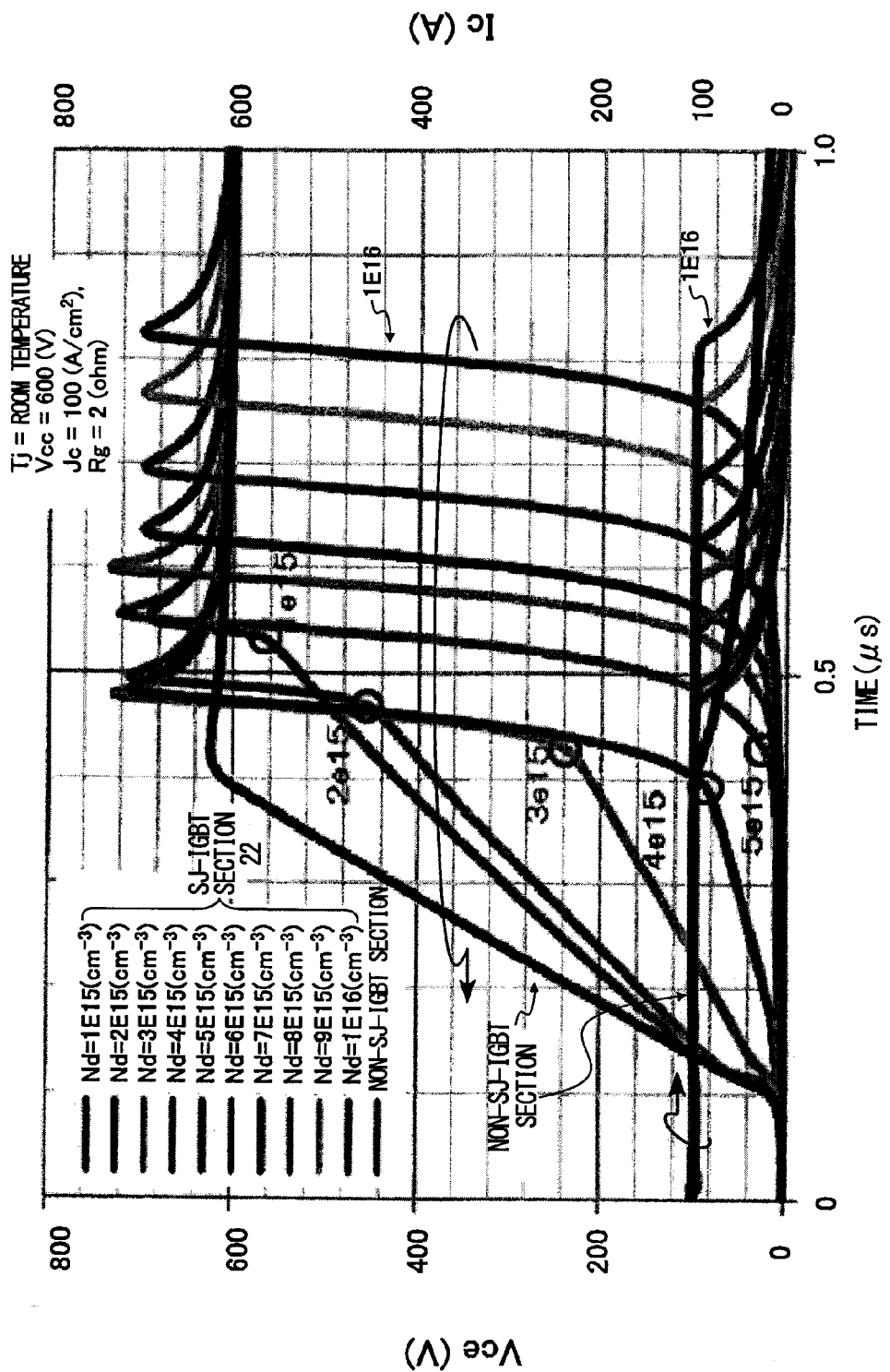
FIG. 47 is an enlarged view of the portion where the time is greater than or equal to 0 (μs) and less than or equal to 1.0 (μs) shown in FIG. 46.

FIG. 47 is an enlarged view of the portion where the time is greater than or equal to 0 (μs) and less than or equal to 1.0 (μs) shown in FIG. 46. In FIG. 47, for the nine examples with concentrations that are greater than or equal to 1E15 ($cm^{-3}$) and less than or equal to 9E15 ($cm^{-3}$), the Vce curves and the Ic curves are shown together. The horizontal axis and vertical axes are the same as in FIG. 46.

In order from a late timing to an early timing at which Ic begins to decrease, the n-type impurities Nd ($cm^{-3}$) of the n-type columns 54 of the SJ-IGBT sections 22 are 1E16, 9E15, 8E15, . . . , and 5E15. However, the change from 4E15 to 1E15 is not in order of a later timing to an earlier timing. It should be noted that for each value from 1E16 to 1E15, the timing at which IC begins to decrease is later than that of the non-SJ-IGBT section. As a result, each example having a value from 1E16 to 1E15 can be said to experience less OFF loss than the non-SJ-IGBT section.

The order of the examples from an early timing to a late timing for the rising of Vce is the SJ-IGBT section followed by the SJ-IGBT sections 22 having concentrations of 1E15, 2E15, . . . , 9E15, and 1E16. In particular, values from 1E15 to 5E15 resulted in quick changes in dV/dt.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A semiconductor device comprising:
   a semiconductor substrate;
   two or more super-junction MOSFET regions provided on the semiconductor substrate; and
   one or more IGBT regions that are provided in regions sandwiched by the two or more super-junction MOSFET regions, in a cross section obtained by cleaving along a plane perpendicular to the semiconductor substrate.

2. The semiconductor device according to claim 1, wherein the IGBT region is provided in a region surrounded by the super-junction MOSFET regions.

3. The semiconductor device according to claim 1, further comprising:
a withstanding voltage structure section provided outside the outermost super-junction MOSFET region among the super-junction MOSFET regions.

4. The semiconductor device according to claim 3, wherein
the super-junction MOSFET regions include a first conduction type column and a second conduction type column,
the withstanding voltage structure section includes a first withstanding voltage section that is provided on an inner circumferential portion thereof and a second withstanding voltage section that is provided on an outer circumferential portion thereof,
the second withstanding voltage section of the withstanding voltage structure section includes a first conduction type region and a second conduction type column, and
a depth of an end of the second conduction type column of the second withstanding voltage section of the withstanding voltage structure section is less than a depth of an end of the second conduction type column of the super-junction MOSFET regions.

5. The semiconductor device according to claim 1, wherein
withstanding voltage of the IGBT region is greater than withstanding voltage of the super-junction MOSFET regions.

6. The semiconductor device according to claim 1, wherein
an IGBT section including two or more of the IGBT regions is provided in a region sandwiched by the super-junction MOSFET regions.

7. The semiconductor device according to claim 6, wherein
an SJ-MOSFET section including two or more of the super-junction MOSFET regions is provided on each side of the IGBT section.

8. The semiconductor device according to claim 1, wherein
a lifetime killer is injected into a drift region in a boundary section between the IGBT region and the super-junction MOSFET regions.

9. The semiconductor device according to claim 1, wherein
the IGBT region includes a drift region having a first conduction type, and
a second conduction type column is provided in a boundary section between the IGBT region and the super-junction MOSFET regions, from a front surface side of the drift region to a back surface side of the drift region.

10. The semiconductor device according to claim 1, comprising:
a dummy gate electrode closer to a front surface side of the semiconductor substrate than a drift region in a boundary section between the IGBT region and the super-junction MOSFET regions.

11. The semiconductor device according to claim 1, wherein
a second conduction type well that expands in a direction parallel to the front surface of the semiconductor substrate is provided in a boundary section between the IGBT region and the super-junction MOSFET regions.

12. The semiconductor device according to claim 1, wherein
the super-junction MOSFET regions include a first conduction type column and a second conduction type column, and
the semiconductor device includes a second conduction type column having an end with a depth that is less than a depth of an end of the second conduction type column of the super-junction MOSFET regions, in a boundary section between the IGBT region and the super-junction MOSFET regions.

13. The semiconductor device according to claim 1, wherein a boundary section between the IGBT region and the super-junction MOSFET regions includes:
two gate electrodes;
a first conduction type region provided between the two gate electrodes; and
a second conduction type region with a depth that is half of a depth of a second conduction type column of the super-junction MOSFET regions on a back surface side of the first conduction type region and in contact with the first conduction type region.

14. The semiconductor device according to claim 1, wherein
a boundary section between an IGBT section including two or more of the IGBT regions and an SJ-MOSFET section including two or more of the super-junction MOSFET regions includes a free wheel diode section.

15. The semiconductor device according to claim 14, wherein
a lifetime killer is injected into the SJ-MOSFET section.

16. The semiconductor device according to claim 15, wherein
the SJ-MOSFET section includes a first conduction type column and a second conduction type column, and
the lifetime killer is injected into at least one of front surface sides of the first conduction type column and the second conduction type column in the SJ-MOSFET section and a field stop layer in the SJ-MOSFET section.

17. The semiconductor device according to claim 16, wherein
the lifetime killer is injected across the entire SJ-MOSFET section from the front surface sides of the first conduction type column and the second conduction type column of the SJ-MOSFET section to the field stop layer of the SJ-MOSFET section.

18. The semiconductor device according to claim 14, wherein
a lifetime killer is injected into a boundary between the free wheel diode section and the SJ-MOSFET section.

19. The semiconductor device according to claim 14, wherein
a lifetime killer is injected into the free wheel diode section.

20. The semiconductor device according to claim 19, wherein
the lifetime killer is injected into at least one of a field stop layer and an anode side of a drift region of the free wheel diode section.

21. The semiconductor device according to claim 14, further comprising:
a repeating structure section in which the free wheel diode section and the SJ-MOSFET section are arranged periodically, wherein
the repeating structure section is provided in a manner to sandwich the IGBT section.

22. The semiconductor device according to claim 21, wherein a lifetime killer is injected into at least one of a region between the IGBT section and the repeating structure section and a field stop layer of the IGBT section.

23. The semiconductor device according to claim 14, wherein the IGBT section is an SJ-IGBT section in which the IGBT region is configured as a super-junction transistor.

24. The semiconductor device according to claim 23, wherein the SJ-IGBT section includes a first conduction type column and a second conduction type column that each have an impurity concentration that is greater than or equal to $1E15$ cm$^{-3}$ and less than or equal to $1E16$ cm$^{-3}$.

25. The semiconductor device according to claim 24, wherein a pitch of a semiconductor layer having a second conduction type and provided on a back surface side of the SJ-IGBT section and a semiconductor layer having a first conduction type and provided on back surface sides of the free wheel diode section and the SJ-MOSFET section is 5 times to 1,000 times a pitch of the first conduction type column and the second conduction type column in the SJ-IGBT section.

* * * * *